(12) United States Patent
Jeong et al.

(10) Patent No.: US 12,035,552 B2
(45) Date of Patent: Jul. 9, 2024

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventors: Eunjae Jeong, Hwaseong-si (KR); Dongjun Kim, Suwon-si (KR); Minji Kim, Hwaseong-si (KR); Sohee Jo, Cheonan-si (KR); Sanghyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 748 days.

(21) Appl. No.: 17/210,322

(22) Filed: Mar. 23, 2021

(65) Prior Publication Data
US 2021/0399250 A1    Dec. 23, 2021

(30) Foreign Application Priority Data

Jun. 11, 2020 (KR) .................. 10-2020-0070839

(51) Int. Cl.
*H10K 50/15* (2023.01)
*C09K 11/07* (2006.01)
(Continued)

(52) U.S. Cl.
CPC ............. *H10K 50/15* (2023.02); *C09K 11/07* (2013.01); *H05B 33/14* (2013.01); *H10K 85/615* (2023.02);
(Continued)

(58) Field of Classification Search
None
See application file for complete search history.

(56) References Cited

U.S. PATENT DOCUMENTS 4,720,432 A    1/1988   VanSlyke et al.
5,061,569 A   10/1991   VanSlyke et al.
(Continued)

FOREIGN PATENT DOCUMENTS

JP     06102680 A  *  4/1994 ............... G03G 5/06
JP     6-314594 A    11/1994
(Continued)

*Primary Examiner* — Robert S Loewe
(74) *Attorney, Agent, or Firm* — Lewis Roca Rothgerber Christie LLP

(57) ABSTRACT

An organic electroluminescence device (OLED) of an embodiment includes a first electrode, a hole transport region on the first electrode, an emission layer on the hole transport region, and an electron transport region on the emission layer. The hole transport region may include an amine compound represented by Formula 1, and the OLED may thereby exhibit high luminous efficiency:

[Formula 1]

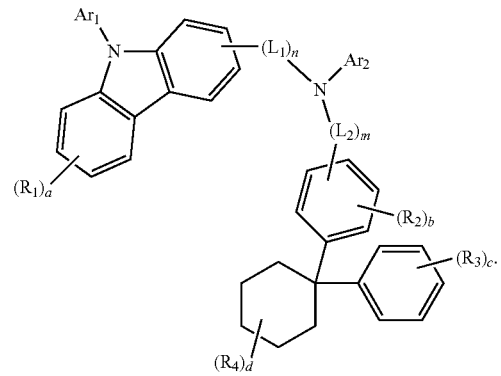

20 Claims, 2 Drawing Sheets

(51) Int. Cl.
  H05B 33/14 (2006.01)
  H10K 85/60 (2023.01)
  *H10K 50/16* (2023.01)
  *H10K 50/17* (2023.01)

(52) U.S. Cl.
  CPC ......... *H10K 85/633* (2023.02); *H10K 85/636* (2023.02); *H10K 85/6572* (2023.02); *H10K 85/6574* (2023.02); *H10K 85/6576* (2023.02); *H10K 50/16* (2023.02); *H10K 50/171* (2023.02)

(56) References Cited

U.S. PATENT DOCUMENTS

| | | | |
|---|---|---|---|
| 6,242,115 | B1 | 6/2001 | Thomson et al. |
| 6,280,859 | B1* | 8/2001 | Onikubo ............... H10K 85/626 252/301.16 |
| 10,230,051 | B2 | 3/2019 | Kim et al. |
| 2019/0074467 | A1* | 3/2019 | Chakraborty .......... H10K 50/11 |
| 2021/0147358 | A1* | 5/2021 | Kim ..................... C07D 407/12 |
| 2022/0199918 | A1* | 6/2022 | Ahn ....................... C09K 11/06 |
| 2023/0200219 | A1* | 6/2023 | Huang ................ H10K 85/633 257/40 |

FOREIGN PATENT DOCUMENTS

| | | |
|---|---|---|
| JP | 8-291115 A | 11/1996 |
| JP | 11-144873 A | 5/1999 |
| JP | 3027481 B2 | 4/2000 |
| JP | 4542646 B2 | 9/2010 |
| JP | 4573923 B2 | 11/2010 |
| JP | 4589223 B2 | 12/2010 |
| KR | 10-2015-0132660 A | 11/2015 |
| KR | 10-1670056 B1 | 10/2016 |
| KR | 10-2018-0138333 A | 12/2018 |

* cited by examiner

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

This application claims priority to and the benefit of Korean Patent Application No. 10-2020-0070839, filed on Jun. 11, 2020, the entire content of which is hereby incorporated by reference.

BACKGROUND

1. Field

One or more aspects of embodiments of the present disclosure relate to an organic electroluminescence device and an amine compound for the organic electroluminescence device.

2. Description of the Related Art

Organic electroluminescence displays are being actively developed as image display devices. Unlike liquid crystal display devices and/or the like, an organic electroluminescence display is a so-called self-luminescent display device, in which holes and electrons injected from a first electrode and a second electrode recombine in an emission layer, and a luminescent material including an organic compound in the emission layer emits light to implement display.

In the application of an organic electroluminescence device to a display device, an organic electroluminescence device having a low driving voltage, a high luminous efficiency, and/or a long service life is desired, and new materials capable of stably attaining such characteristics in an organic electroluminescence device are desired.

SUMMARY

One or more aspects of embodiments of the present disclosure are directed toward an organic electroluminescence device having a long service life and high efficiency, and an amine compound used therein.

One or more example embodiments of the present disclosure provide an amine compound represented by Formula 1:

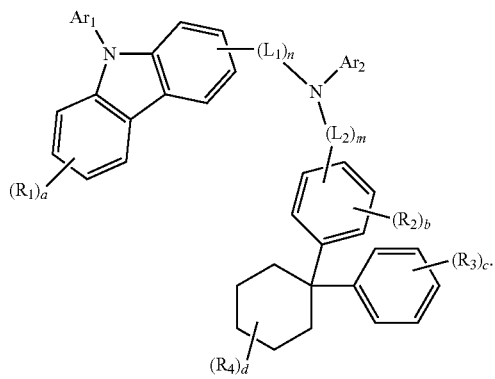

[Formula 1]

In Formula 1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms, m and n may each independently be an integer of 0 to 2, $Ar_1$ and $Ar_2$ may each independently be a substituted or unsubstituted aryl group having 6 to 30 ring-forming carbon atoms or a substituted or unsubstituted heteroaryl group, $R_1$ to $R_4$ may each independently be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a and b may each independently be an integer of 0 to 4, and c and d may each independently be an integer of 0 to 5.

In an embodiment, the amine compound represented by Formula 1 may be represented by Formula 2:

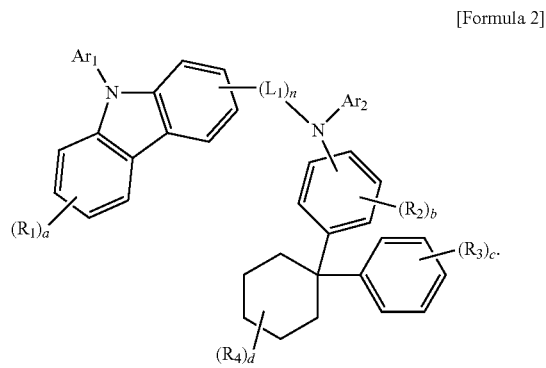

[Formula 2]

In Formula 2, $Ar_1$, $Ar_2$, $L_1$, $R_1$ to $R_4$, n, and a to d may each independently be the same as defined in Formula 1.

In an embodiment, the amine compound of Formula 2 may be represented by Formula 3:

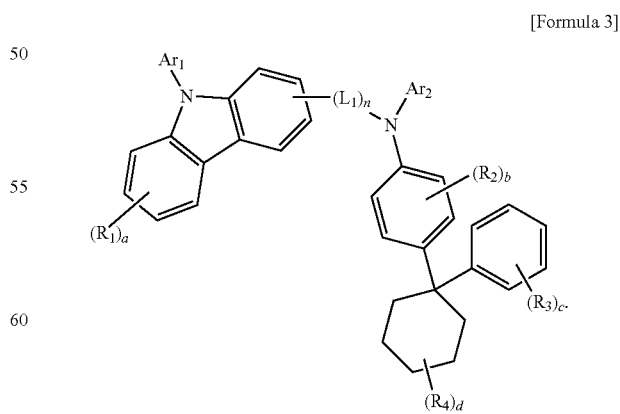

[Formula 3]

In Formula 3, $Ar_1$, $Ar_2$, $L_1$, $R_1$ to $R_4$, n, and a to d may each independently be the same as defined in Formula 2.

In an embodiment, the amine compound represented by Formula 3 may be represented by Formula 4-1 or Formula 4-2:

[Formula 4-1]

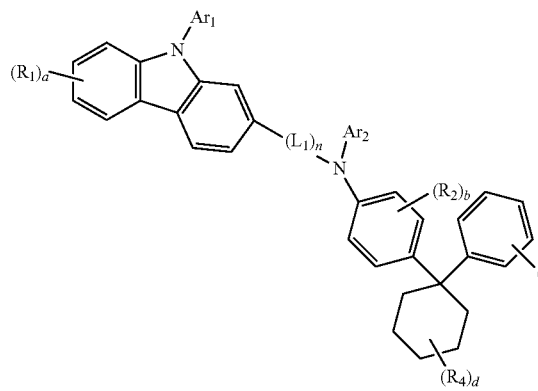

[Formula 4-2]

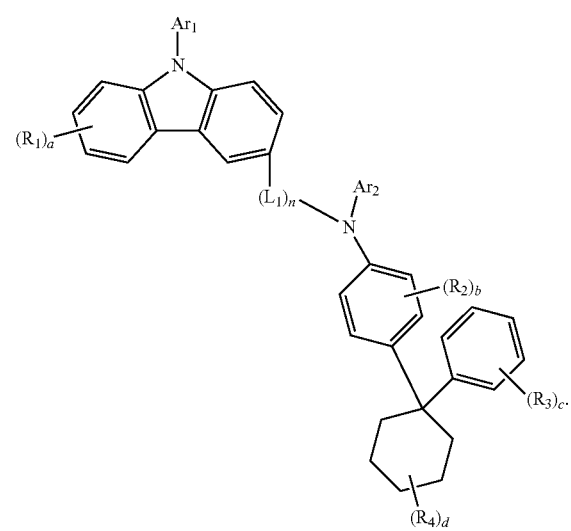

In Formula 4-1 and Formula 4-2, $Ar_1$, $Ar_2$, $L_1$, $R_1$ to $R_4$, n, and a to d may each independently be the same as defined in Formula 3.

In an embodiment, the amine compound represented by Formula 3 may be represented by Formula 4-3 or Formula 4-4:

[Formula 4-3]

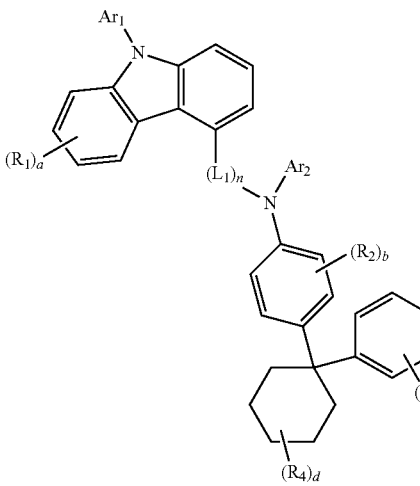

[Formula 4-4]

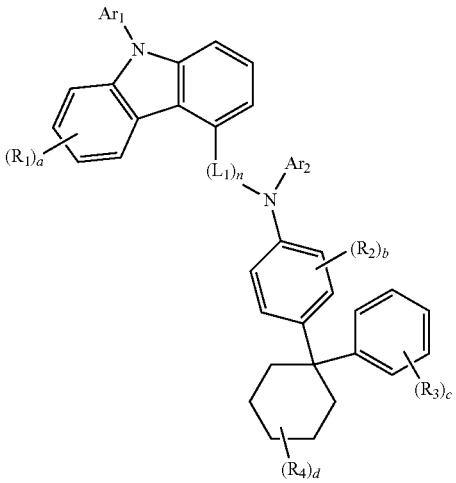

In Formula 4-3 and Formula 4-4, $Ar_1$, $Ar_2$, $L_1$, $R_1$ to $R_4$, n, and a to d may each independently be the same as defined in Formula 3.

In an embodiment, $L_1$ may be a direct linkage, a substituted or unsubstituted phenylene, or a substituted or unsubstituted naphthylene.

In an embodiment, $L_1$ may be represented by Formula 5:

[Formula 5]

In an embodiment, $Ar_2$ may be a substituted or unsubstituted aryl group having 6 to 16 ring-forming carbon atoms.

In an embodiment, $Ar_2$ may be a substituted or unsubstituted phenyl group, a substituted or unsubstituted naphthyl group, a substituted or unsubstituted biphenyl group, or a substituted or unsubstituted phenanthrenyl group.

In an embodiment, $Ar_2$ may be a substituted or unsubstituted dibenzofuranyl group or a substituted or unsubstituted dibenzothiophenyl group.

In an embodiment, $Ar_1$ may be represented by Formula 6:

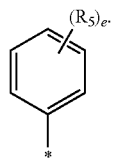

[Formula 6]

In Formula 6, $R_5$ may be O or S, $R_5$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and e may be an integer of 0 to 5.

In an embodiment, the amine compound represented by Formula 1 may be any one selected from the compounds represented by Compound Group 1 (as indicated in the present disclosure).

One or more example embodiments of the present disclosure provide an organic electroluminescence device including: a first electrode; a hole transport region disposed on the first electrode; an emission layer disposed on the hole transport region; and an electron transport region disposed on the emission layer, wherein the hole transport region includes the amine compound represented by Formula 1.

In an embodiment, the hole transport region may include a hole injection layer disposed on the first electrode and the hole transport layer disposed on the hole injection layer, wherein the hole injection layer or the hole transport layer may include the amine compound.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
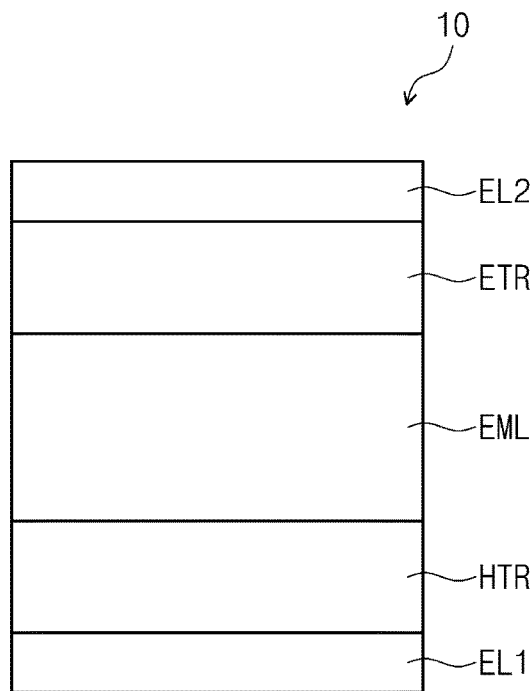
FIG. 1 is a cross-sectional view schematically illustrating an organic electroluminescence device according to an embodiment of the present disclosure.

The present disclosure may have various modifications and may be embodied in different forms, and example embodiments will be explained in detail with reference to the accompanying drawings. However, the present disclosure should not be construed as being limited to the embodiments set forth herein. Rather, all modifications, equivalents, and substituents that are included in the spirit and technical scope of the present disclosure should be included in the present disclosure.

In the present description, when an element (or a region, a layer, a portion, etc.) is referred to as being "on," "connected to," or "coupled to" another element, the element may be directly disposed on/connected to/coupled to the other element, or a third element may be disposed therebetween. When an element is referred to as being "directly on," "directly connected to," or "directly coupled to" another element, there are no intervening elements present.

Like reference numerals refer to like elements throughout, and duplicative descriptions thereof may not be provided. Also, in the drawings, thicknesses, ratios, and dimensions of elements are exaggerated for an effective description of technical contents.

The term "and/or" includes any and all combinations of one or more of the associated listed items.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. Terms used in their singular forms may include the corresponding plural forms, unless the context clearly indicates otherwise.

In addition, terms such as "below," "lower," "above," "upper," and/or the like are used to describe the relationship of the configurations shown in the drawings. The terms are used as relative concepts, and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, unless expressly defined herein, and should not be interpreted in an ideal or overly formal sense.

It should be understood that the terms "have," "includes," "including," "comprises," and/or "comprising," are intended to specify the presence of stated features, integers, steps, operations, elements, components, or combinations thereof in the disclosure, but do not preclude the presence or addition of one or more other features, integers, steps, operations, elements, components, or combinations thereof.

As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

Hereinafter, an organic electroluminescence device according to an embodiment of the present disclosure and a compound of an embodiment included therein will be described with reference to the accompanying drawings.

FIGS. 1 to 4 are cross-sectional views schematically illustrating organic electroluminescence devices according to embodiments of the present disclosure. Referring to FIGS. 1 to 4, in each of organic electroluminescence devices 10 according to embodiments, a first electrode EL1 and a second electrode EL2 are disposed to face each other, and an emission layer EML may be disposed between the first electrode EL1 and the second electrode EL2.

In some embodiments, each of the organic electroluminescence devices 10 of embodiments may further include a plurality of functional layers between the first electrode EL1 and the second electrode EL2 in addition to the emission layer EML. The plurality of functional layers may include a hole transport region HTR and an electron transport region ETR. For example, each of the organic electroluminescence devices 10 according to embodiments may include the first electrode EL1, the hole transport region HTR, the emission layer EML, the electron transport region ETR, and the second electrode EL2 that are sequentially stacked. In some embodiments, the organic electroluminescence device 10 of an embodiment may include a capping layer CPL disposed on the second electrode EL2.

The organic electroluminescence device 10 of an embodiment may include an amine compound of an embodiment, which will be described later, in the hole transfer region HTR disposed between the first electrode EL1 and the second electrode EL2. However, embodiments of the present disclosure are not limited thereto, and the organic electroluminescence device 10 of an embodiment may include a compound according to an embodiment, which will be described later, in the emission layer EML or electron transport region ETR, or in the capping layer CPL disposed on the second electrode EL2.

Figure 2:
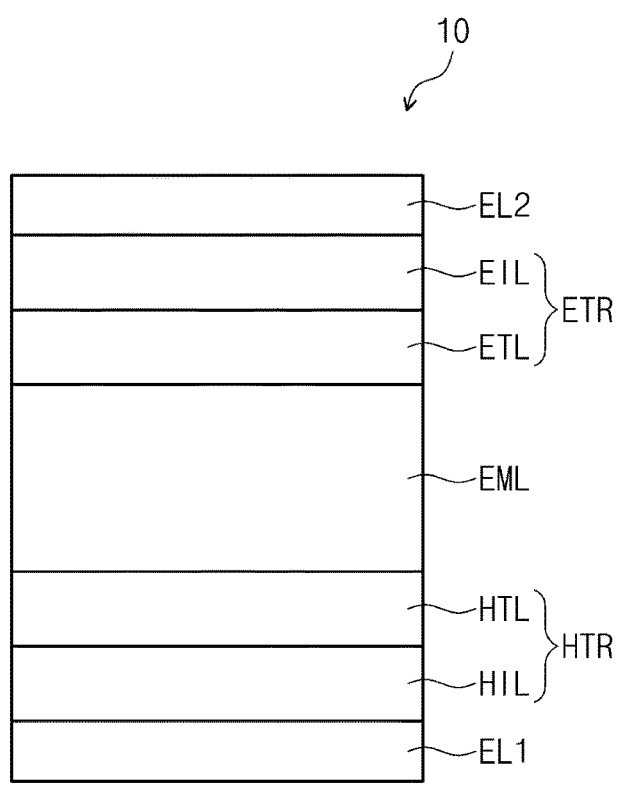
FIG. 2 is a cross-sectional view schematically illustrating an organic electroluminescence device according to an embodiment of the present disclosure.
Figure 3:
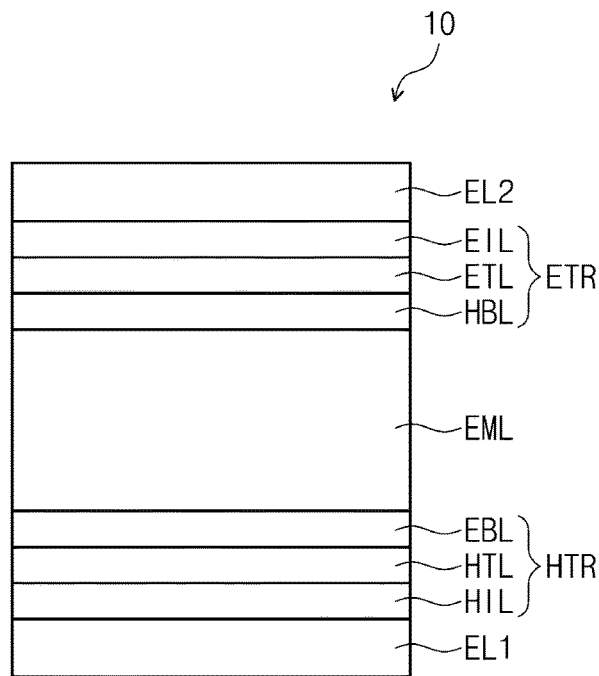
FIG. 3 is a cross-sectional view schematically illustrating an organic electroluminescence device according to an embodiment of the present disclosure.
Figure 4:
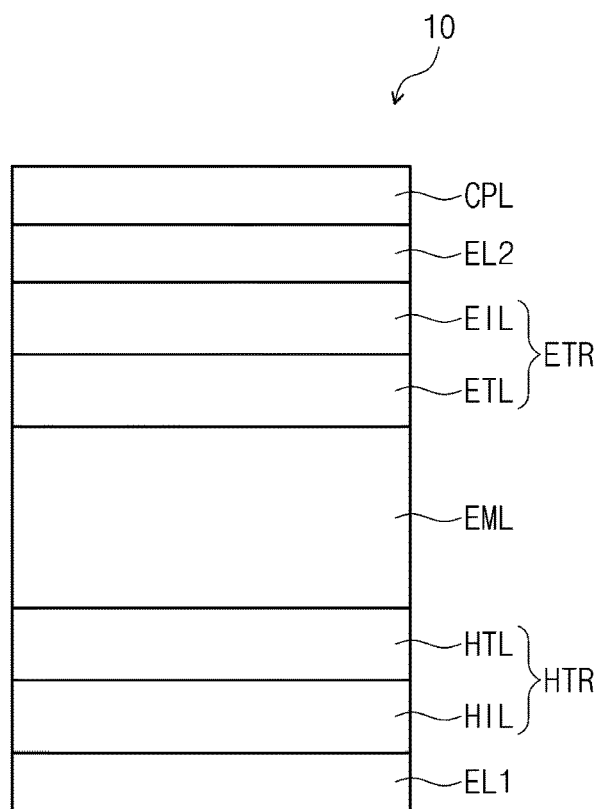
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

The first electrode EL1 may have conductivity. The first electrode EU may be formed of a metal alloy or a conductive compound. The first electrode EU may be a pixel electrode or positive electrode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni, neodymium (Nd), iridium (Ir), chromium (Cr), lithium ($L_1$), calcium (Ca), LiF/Ca, LiF/Al, molybdenum (Mo), titanium (Ti), a compound thereof, or a mixture thereof (e.g., a mixture of Ag and Mg). In some embodiments, the first electrode EL1 may have a multilayer structure including a reflective layer or a transflective layer formed of the above-described materials, and a transparent conductive layer formed of ITO, IZO, ZnO, ITZO, etc. For example, the first electrode EU may have a three-layer structure of ITO/Ag/ITO, but embodiments of the present disclosure are not limited thereto. The thickness of the first electrode EU may be about 1,000 Å to about 10,000 Å, for example, about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer.

The hole transport region HTR may have (e.g., be) a single layer formed of (e.g., consisting of) a single material, a single layer formed of a plurality of different materials, or a multilayer structure including a plurality of layers formed of a plurality of different materials.

For example, the hole transport region HTR may have (e.g., be) a single layer structure of a hole injection layer HIL or a hole transport layer HTL, or may have (e.g., be) a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed by utilizing any suitable method (such as a vacuum deposition method, a spin coating method, a cast method, a Langmuir-Blodgett (LB) method, an inkjet printing method, a laser printing method, and/or a laser induced thermal imaging (LITI) method).

In an embodiment, the hole transport region HTR may include the amine compound according to the present disclosure.

In the description, the term "substituted or unsubstituted" may indicate that one (e.g., a group or atom) is unsubstituted, or is substituted with at least one substituent selected from the group consisting of a deuterium atom, a halogen atom, a cyano group, a nitro group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. Each of the example substituents above may be further substituted or unsubstituted. For example, a biphenyl group may be interpreted as a named aryl group, or as a phenyl group substituted with a phenyl group.

Non-limiting examples of the halogen atom include a fluorine atom, a chlorine atom, a bromine atom, and an iodine atom.

In the description, the alkyl group may be a linear, branched or cyclic type alkyl group. The number of carbons in the alkyl group may be 1 to 50, 1 to 30, 1 to 20, 1 to 10, or 1 to 6. Examples of the alkyl group include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

In the description, the term "alkenyl group" refers to a hydrocarbon group including at least one carbon-carbon double bond in the middle or at the terminal end of an alkyl group having 2 or more carbon atoms. The alkenyl group may be linear or branched. The number of carbon atoms is not limited, and for example may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but embodiments of the present disclosure are not limited thereto.

In the description, the term "alkynyl group" refers to a hydrocarbon group including at least one carbon-carbon triple bond in the middle or at the terminal end of an alkyl group having 2 or more carbon atoms. The alkynyl group may be linear or branched. The number of carbon atoms is not limited, and for example, may be 2 to 30, 2 to 20, or 2 to 10. Examples of the alkynyl group include an ethynyl group, a propynyl group, etc., but are not limited thereto.

In the description, a hydrocarbon ring group may be any functional group or substituent derived from an aliphatic hydrocarbon ring, or any functional group or substituent derived from an aromatic hydrocarbon ring. The number of ring-forming carbon atoms in the hydrocarbon ring group may be 5 to 60, 5 to 30, or 5 to 20.

In the description, the term "aryl group" refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments of the present disclosure are not limited thereto.

In the description, the fluorenyl group may be substituted, and two substituents may be combined with each other to form a spiro structure. Examples of the substituted fluorenyl group are as follows However, an embodiment of the present disclosure is not limited thereto.

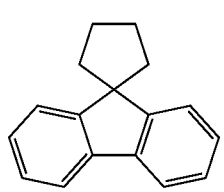 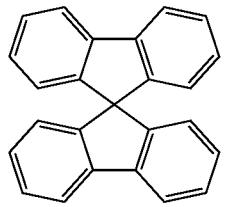

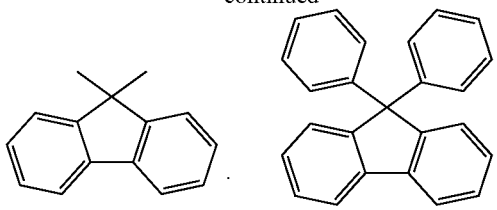

In the description, the term "heterocyclic group" refers to any functional group or substituent derived from a ring containing at least one of boron (B), oxygen (O), nitrogen (N), phosphorus (P), silicon (Si), or sulfur (S) as a hetero atom. When the heterocyclic group contains two or more hetero atoms, the two or more hetero atoms may be the same as or different from each other. The heterocyclic group may be an aliphatic heterocyclic group or an aromatic heterocyclic group. The aromatic heterocyclic group may be a heteroaryl group. The aliphatic heterocycle and aromatic heterocycle may be monocyclic or polycyclic.

In the description, the aliphatic heterocyclic group may include at least one of B, O, N, P, Si, or S as a hetero atom. The number of ring-forming carbon atoms in the aliphatic heterocyclic group may be 2 to 30, 2 to 20, or 2 to 10. Examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto.

In the description, the heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazolyl group, a thiadiazole group, a phenothiazine group, a dibenzosilole group, a dibenzofuran group, etc., but embodiments of the present disclosure are not limited thereto.

In the description, the term "thio group" may refer to an alkylthio group or an arylthio group. For example, the thio group includes a sulfur atom bonded to an alkyl group or an aryl group as defined above. Examples of a thiol group include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments of the present disclosure are not limited thereto.

The term "oxy group" refers to a group including an oxygen atom bonded to an alkyl group or an aryl group as defined above. The oxy group may be an alkoxy group or an aryl oxy group. The alkoxy group may include a linear, branched or cyclic alkyl chain. The number of carbon atoms in the alkoxy group is not particularly limited, but for example, may be 1 to 20 or 1 to 10. Examples of an oxy group include methoxy, ethoxy, n-propoxy, isopropoxy, butoxy, pentyloxy, hexyloxy, octyloxy, nonyloxy, decyloxy, benzyloxy, etc., but embodiments of the present disclosure are not limited thereto.

In the description, the alkyl group included in an alkylthio group, an alkylsulfoxy group, an alkylaryl group, an alkylamino group, an alkyl boron group, an alkyl silyl group, and an alkyl amine group is the same as the alkyl group described above.

In the description, the aryl group included in an aryloxy group, an arylthio group, an arylsulfoxy group, an arylamino group, an arylboron group, an arylsilyl group, an arylamine group is the same as the aryl group described above.

In the description, the term "direct linkage" may refer to a single bond.

In the description, "—·" refers to a connecting point to another group or moiety.

The amine compound according to an embodiment of the present disclosure is represented by Formula 1:

[Formula 1]

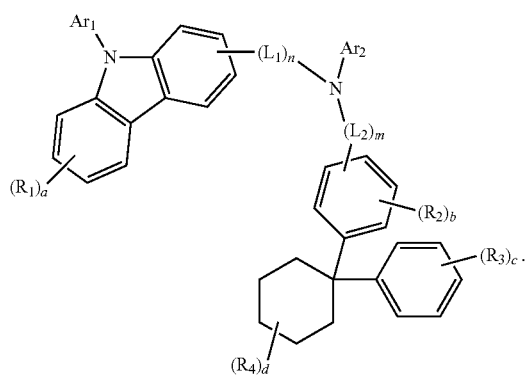

In Formula 1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms.

In Formula 1, m may be an integer of 0 to 2, and when m is 2, a plurality of $L_2$'s are the same as or different from each other.

In Formula 1, n may be an integer of 0 to 2, and when n is 2, a plurality of $L_1$'s are the same as or different from each other.

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms.

In Formula 1, $R_1$ to $R_4$ may each independently be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 1, a may be an integer of 0 to 4, and when a is 2 or more, a plurality of $R_1$'s are the same as or different from each other.

In Formula 1, b may be an integer of 0 to 4, and when b is 2 or more, a plurality of $R_2$'s are the same as or different from each other.

In Formula 1, c may be an integer of 0 to 5, and when c is 2 or more, a plurality of $R_3$'s are the same as or different from each other.

In Formula 1, d may be an integer of 0 to 5, and when d is 2 or more, a plurality of $R_4$'s are the same as or different from each other.

In an embodiment, $L_2$ in Formula 1 may be a direct linkage. In an embodiment, the amine compound represented by Formula 1 may be represented by Formula 2:

[Formula 2]

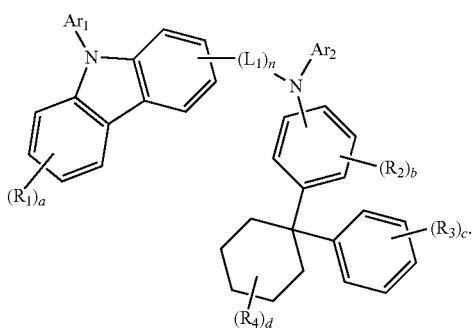

In Formula 2, $Ar_1$, $Ar_2$, $L_1$, $R_1$ to $R_4$, n, and a to d may each independently be the same as defined in Formula 1.

In an embodiment, the nitrogen of the amine group in Formula 1 may be bonded to a phenylene at a para-position with respect to the cyclohexyl group. In an embodiment, the amine compound represented by Formula 2 may be represented by Formula 3:

[Formula 3]

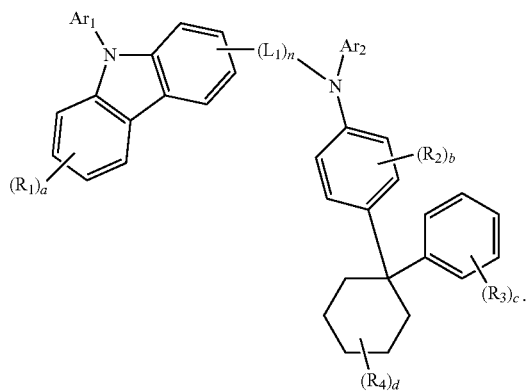

In Formula 3, $Ar_1$, $Ar_2$, $L_1$, $R_1$ to $R_4$, n, and a to d may each independently be the same as defined in Formula 2.

In an embodiment, the amine compound represented by Formula 3 may be represented by Formula 4-1 or Formula 4-2:

[Formula 4-1]

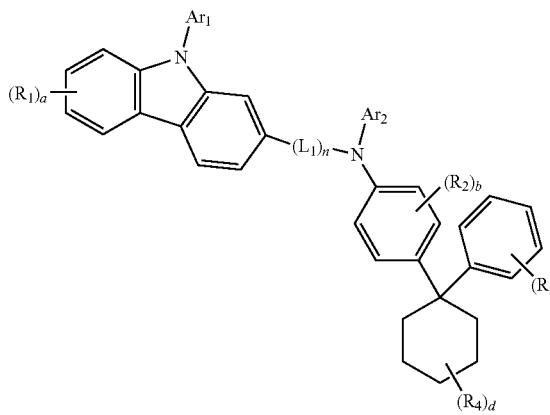

In an embodiment, the amine compound represented by Formula 3 may be represented by Formula 4-3 or Formula 4-4:

[Formula 4-3]

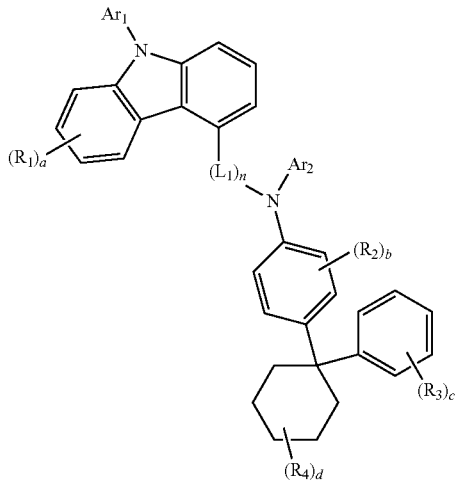

[Formula 4-4]

[Formula 4-2]

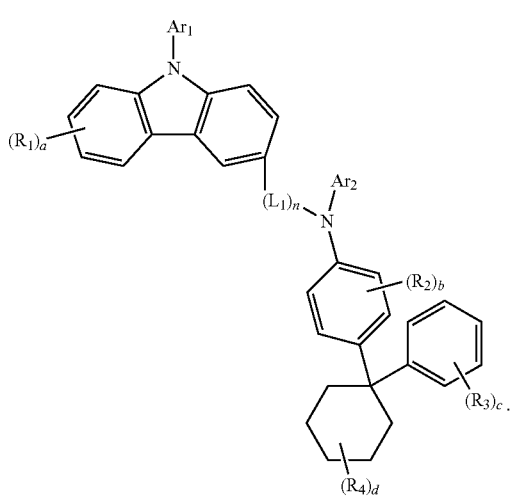

In Formula 4-1 and Formula 4-2, $Ar_1$, $Ar_2$, $L_1$, $R_1$ to $R_4$, n, and a to d may each independently be the same as defined in Formula 3.

In Formula 4-3 and Formula 4-4, $Ar_1$, $Ar_2$, $L_1$, $R_1$ to $R_4$, n, and a to d may each independently be the same as defined in Formula 3.

In an embodiment, $L_1$ of the amine compound may be a direct linkage, a substituted or unsubstituted phenylene, or a substituted or unsubstituted naphthylene.

In an embodiment, when $L_1$ of the amine compound is a phenylene, $L_1$ may be represented by Formula 5:

[Formula 5]

In Formula 5, "—·" refers to a position to be connected with the carbazole group or the nitrogen of the amine group.

In an embodiment, $Ar_2$ of the amine compound may be a substituted or unsubstituted aryl group having 6 to 16 ring-forming carbon atoms.

In an embodiment, $Ar_2$ of the amine compound may be a substituted or unsubstituted phenyl group, a substituted or unsubstituted naphthyl group, a substituted or unsubstituted biphenyl group, or a substituted or unsubstituted phenanthrenyl group.

In an embodiment, $Ar_2$ of the amine compound may be a substituted or unsubstituted carbazolyl group. In an embodiment, $Ar_2$ of the amine compound may be a substituted or unsubstituted dibenzofuranyl group or a substituted or unsubstituted dibenzothiophenyl group.

In an embodiment, the amine compound may not include a substituent containing N (e.g., may be substituted only with substituents excluding an N atom). For example, N other than the N atoms represented in Formula 1 may be not included (e.g., Formula 1 may not include any other N atoms besides the amine group N and the carbazolyl group N).

In an embodiment, An of the amine compound may be represented by Formula 6:

[Formula 6]

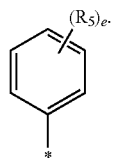

In Formula 6, $R_5$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 6, e may be an integer of 0 to 5, and when e is an integer of 2 or more, a plurality of $R_5$'s are the same as or different from each other.

In Formula 6, "—•" refers to a position to be connected with the nitrogen of a carbazole group.

In an embodiment, the amine compound represented by Formula 1 may be any one selected from the compounds represented by Compound Group 1. However, embodiments of the present disclosure are not limited thereto.

[Compound Group 1]

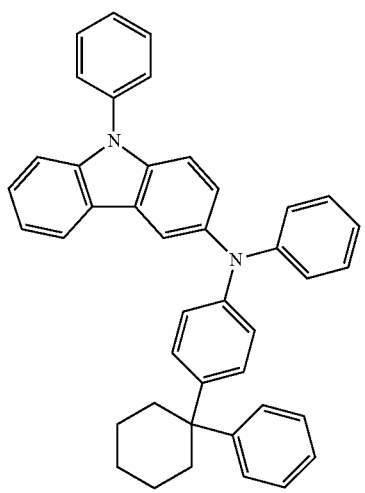

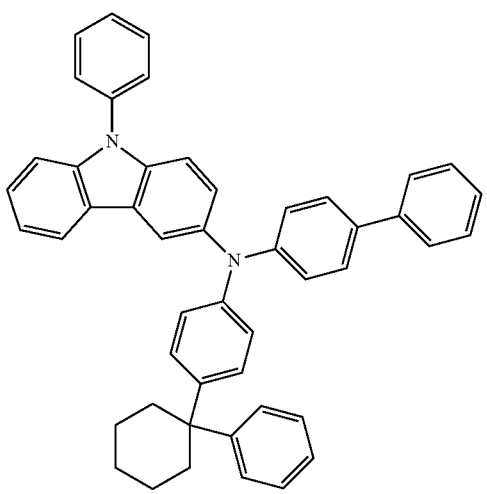

5
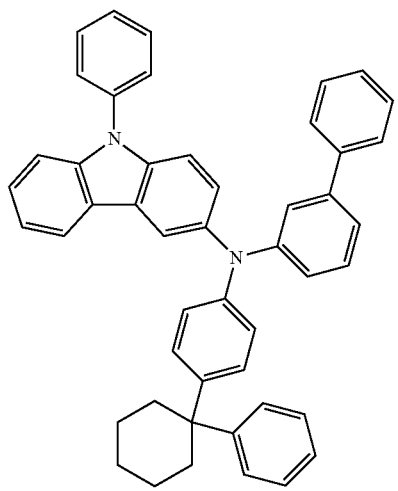
6
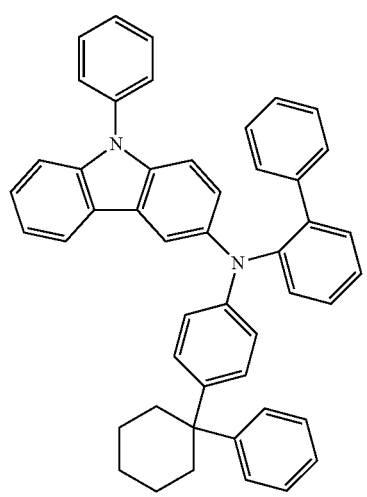
7
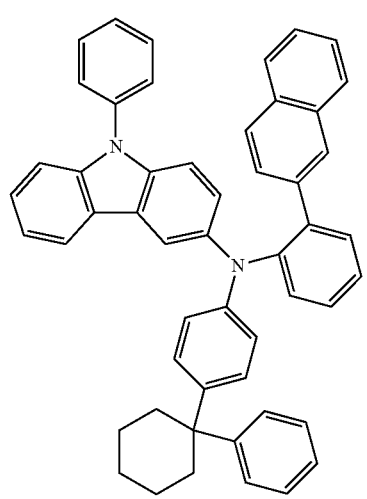
8
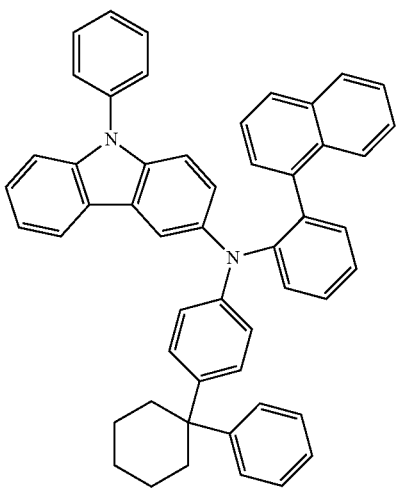
9
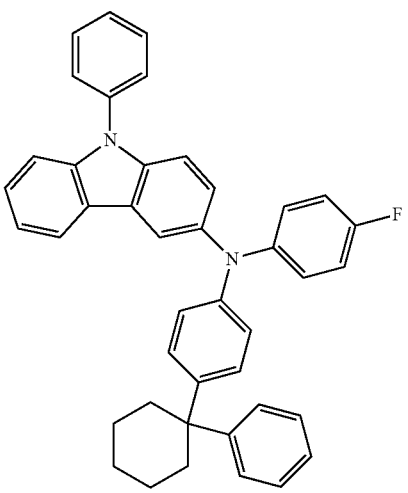
10
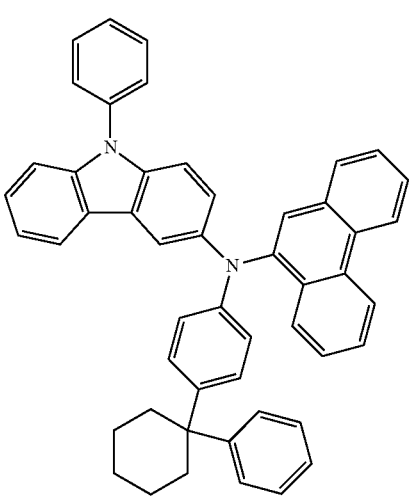

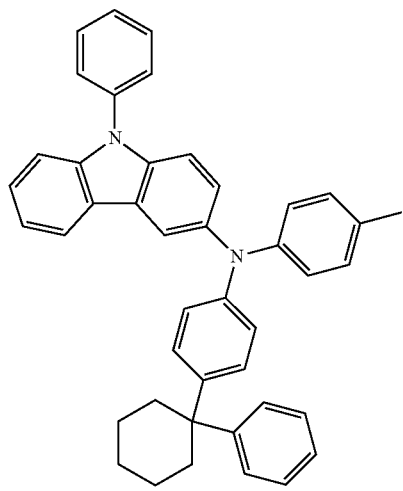
11
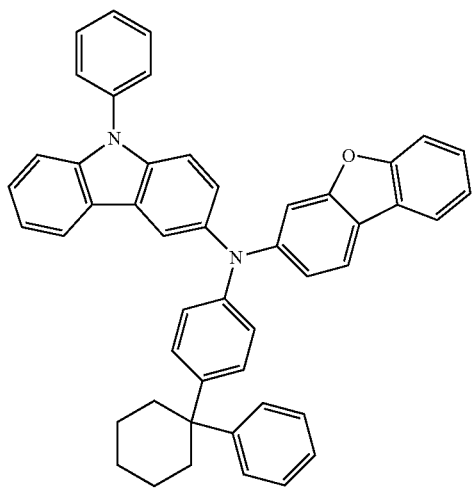
14
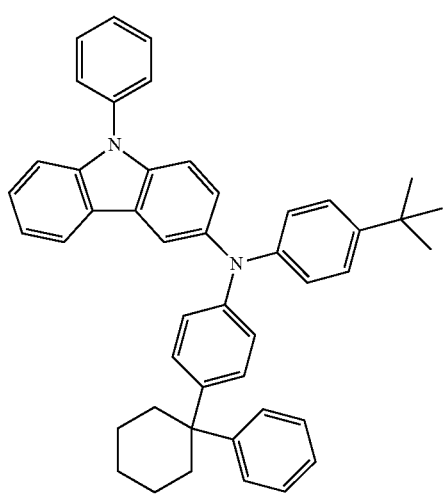
12
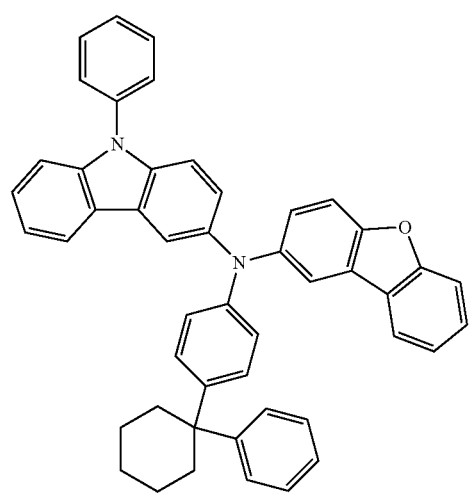
15
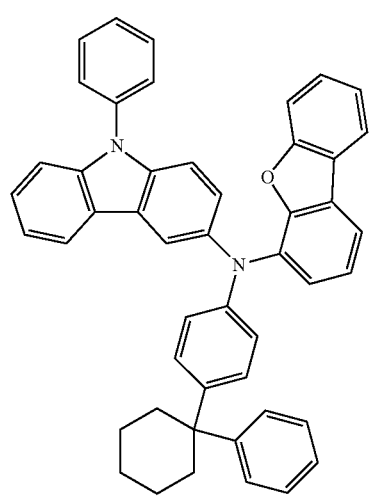
13
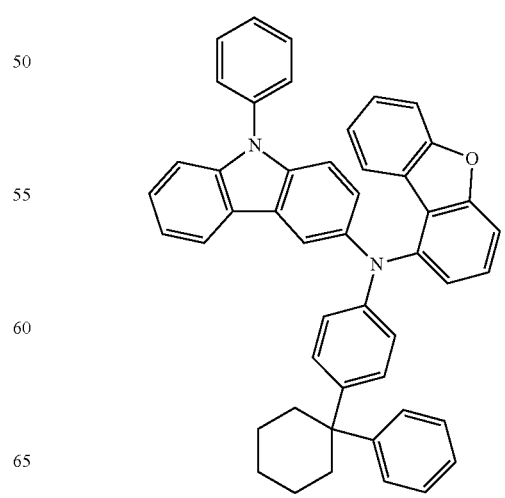
16

17
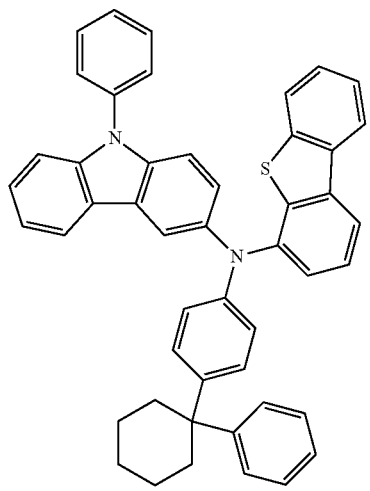
18
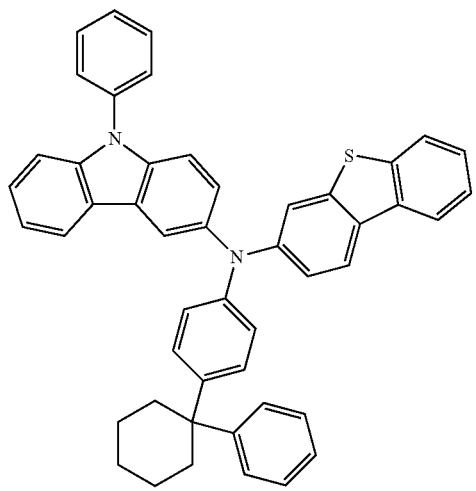
19
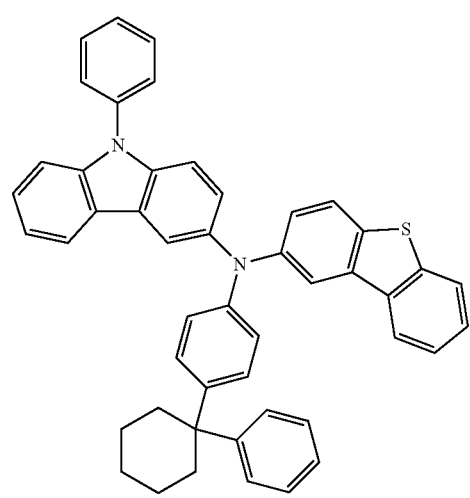
20
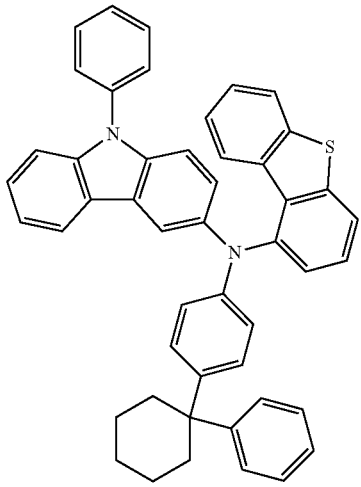
21
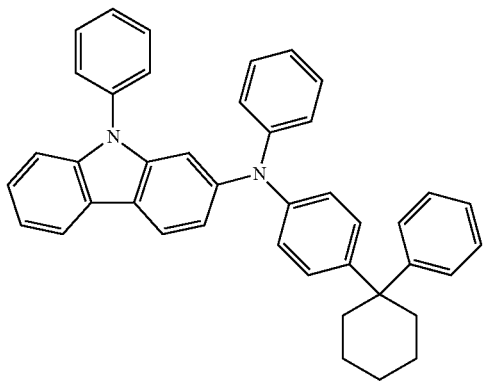
22
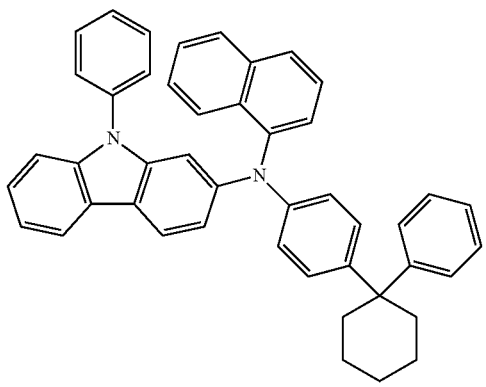

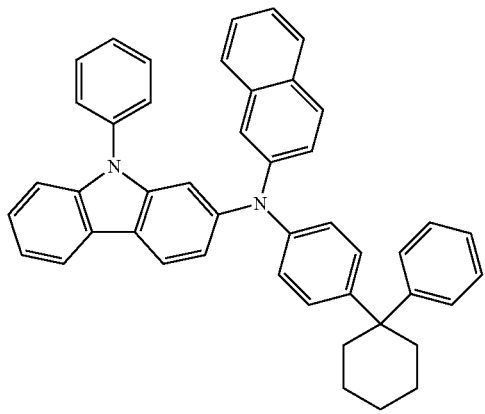
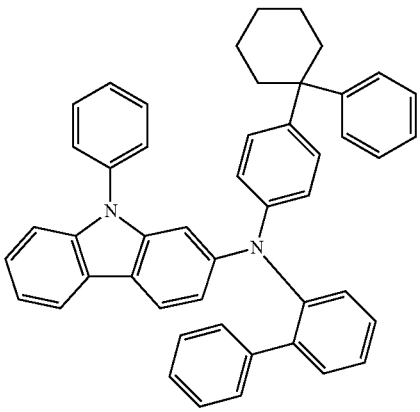
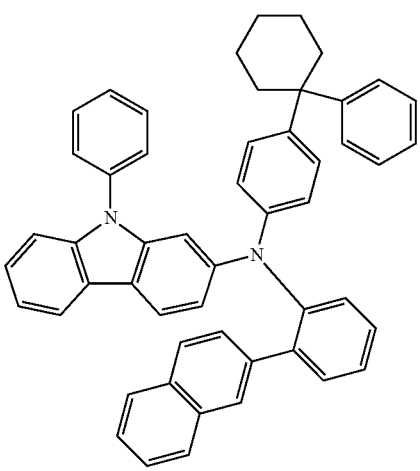
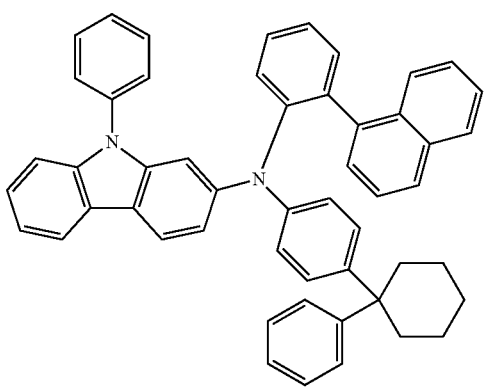
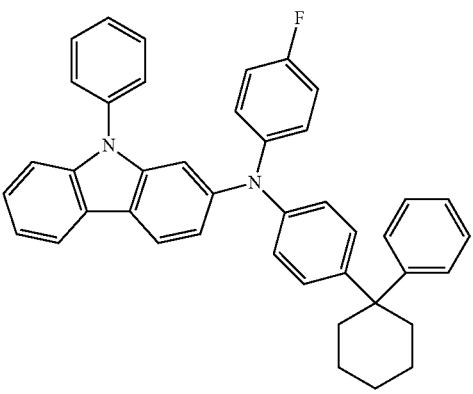

30
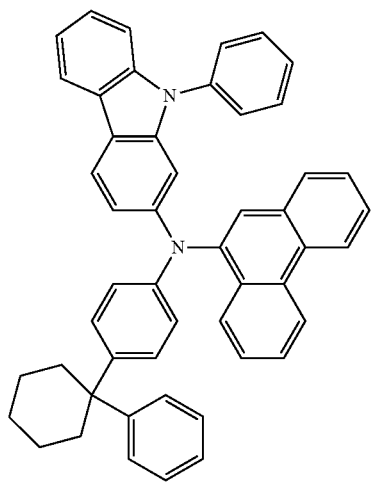
31
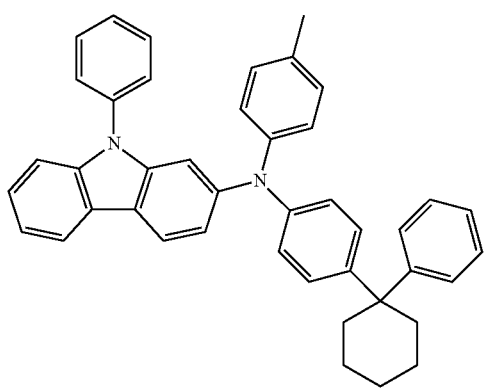
32
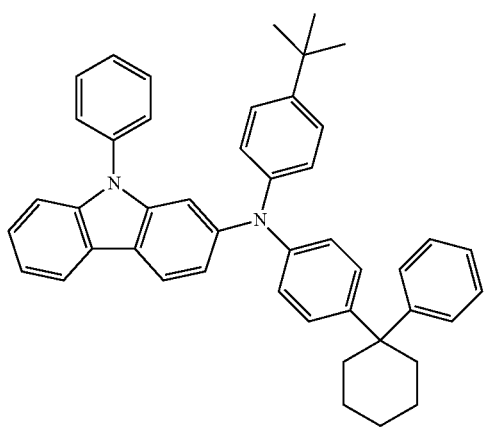
33
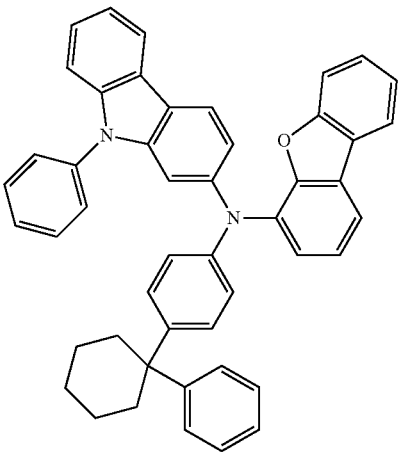
34
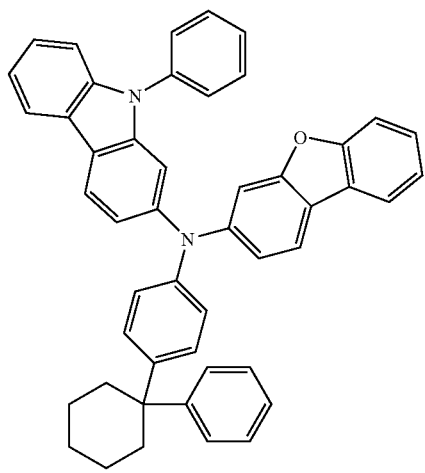
35
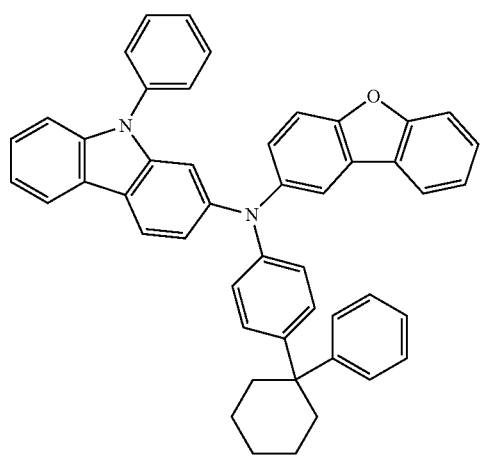

36
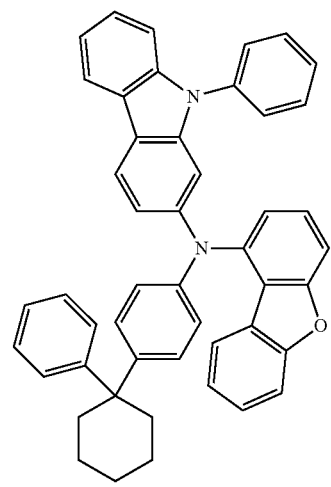
37
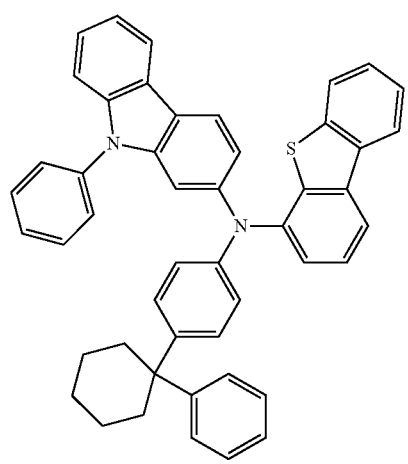
38
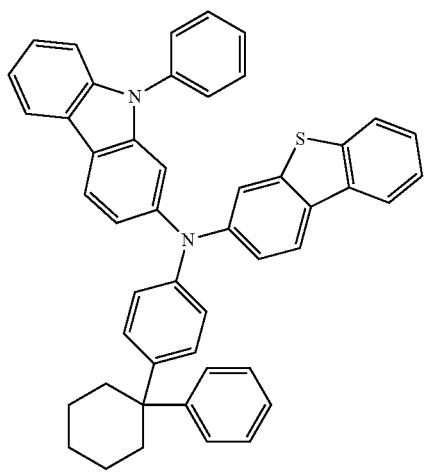
39
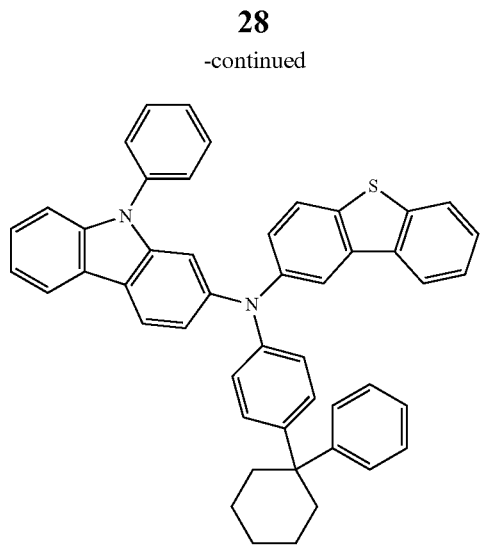
40
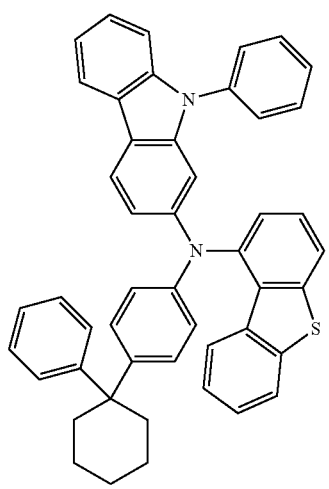
41
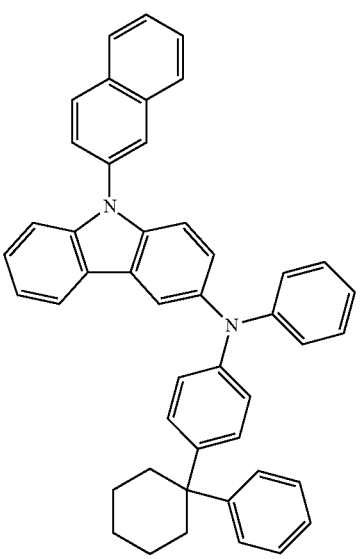

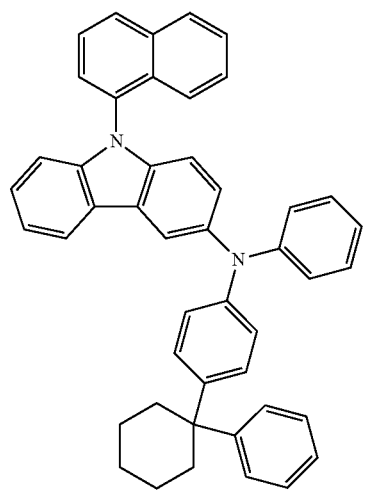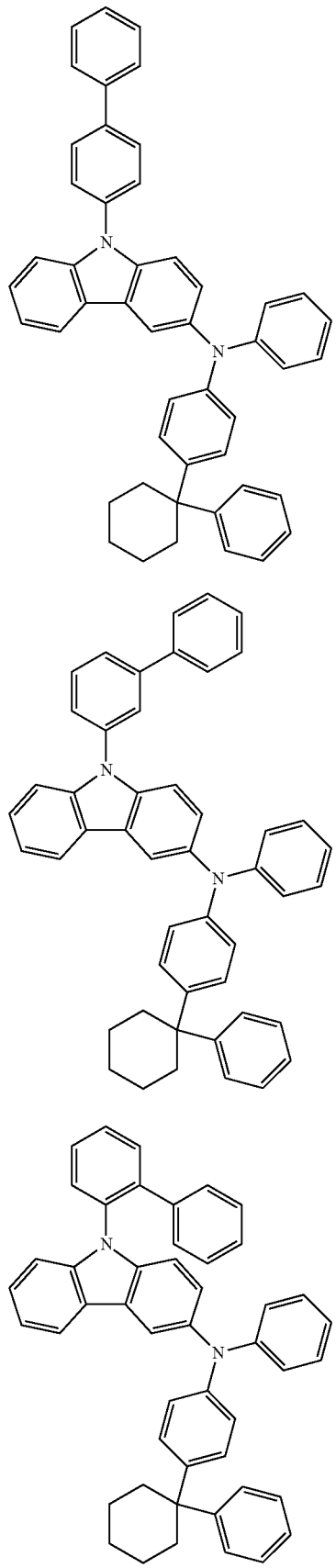

48
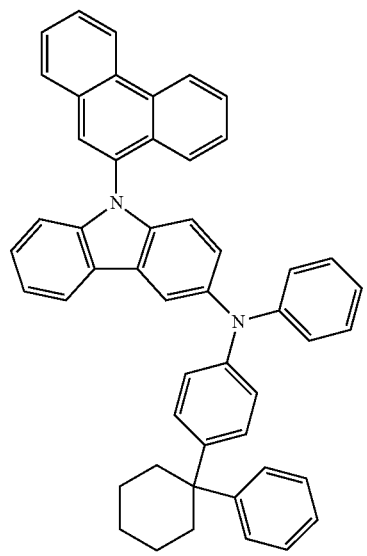
49
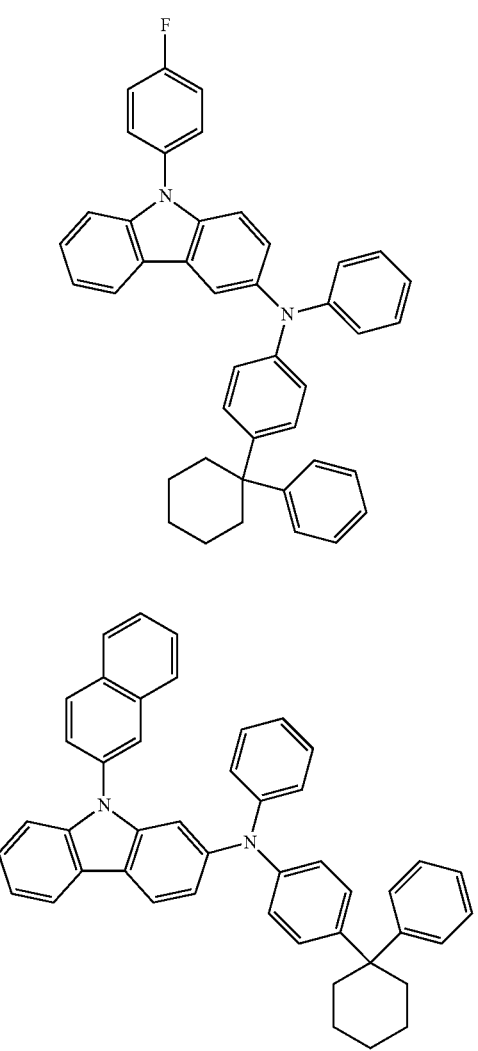
50
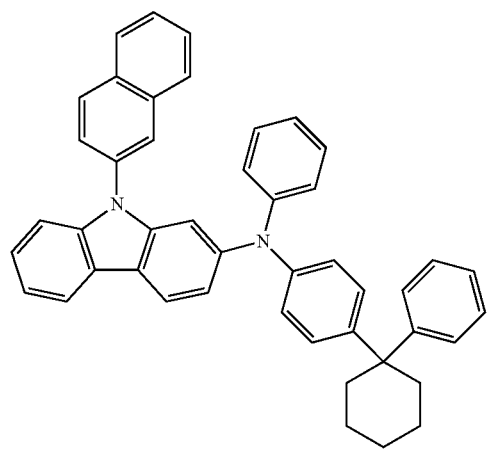
51
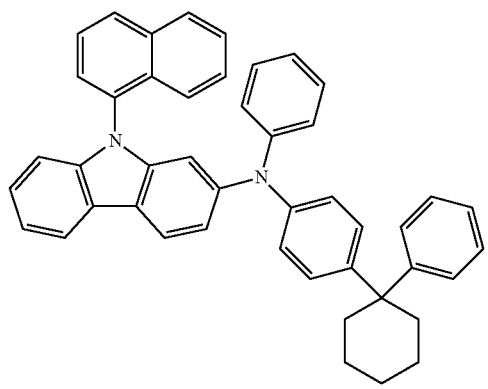
52
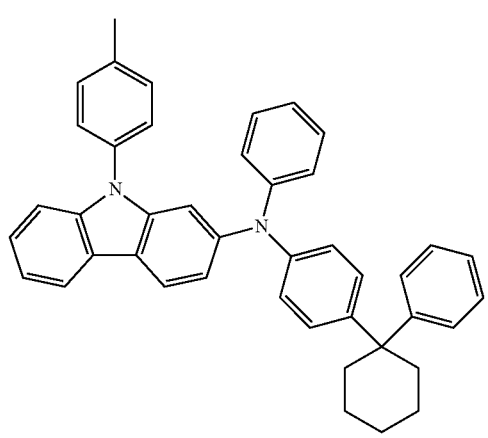
53
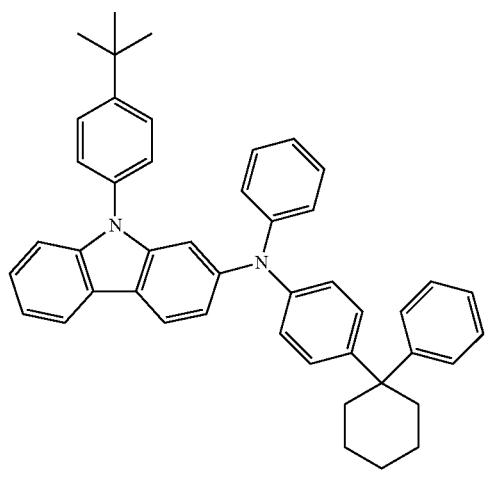

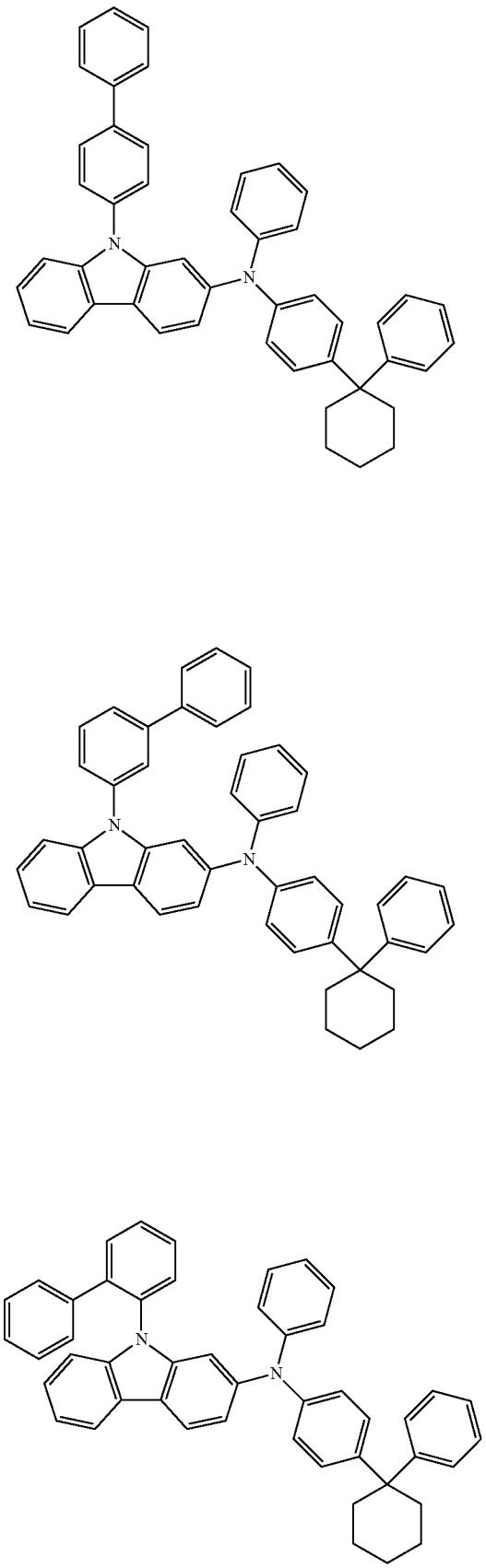
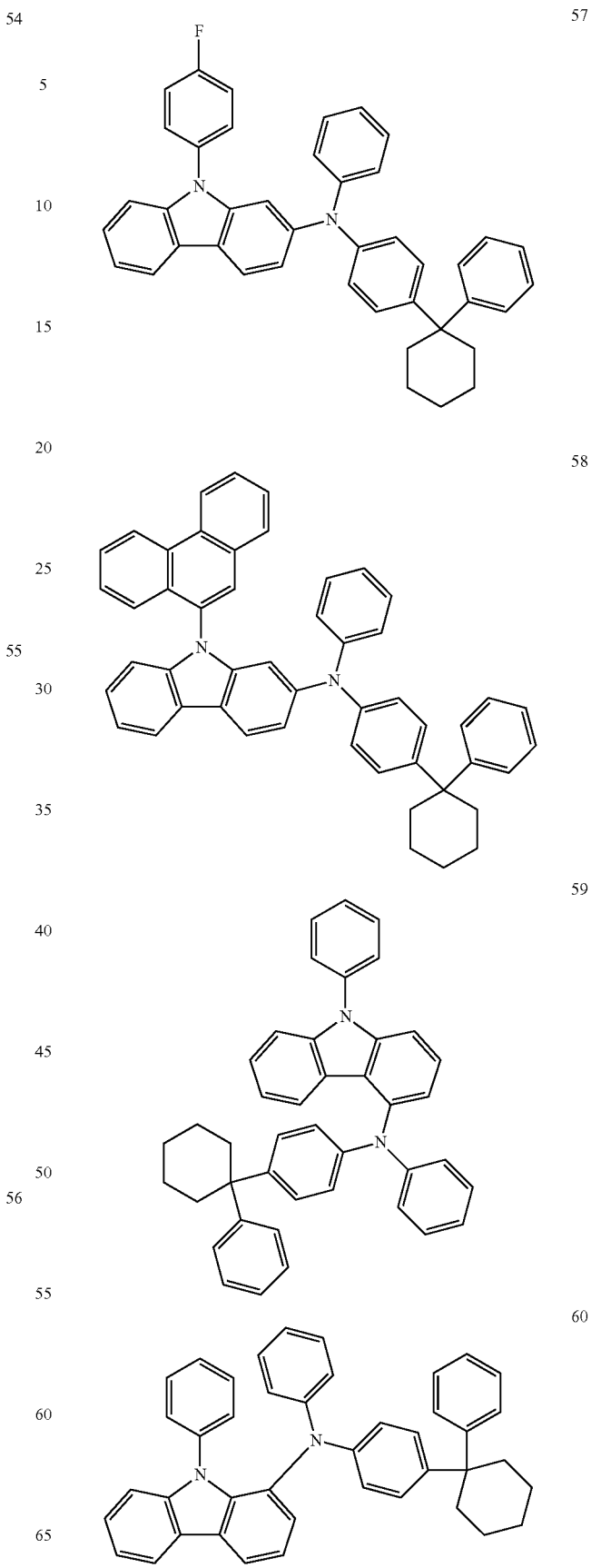

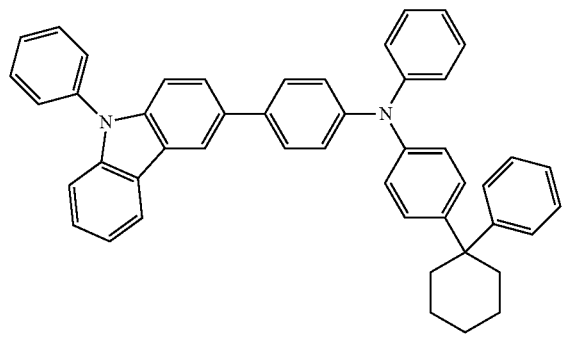
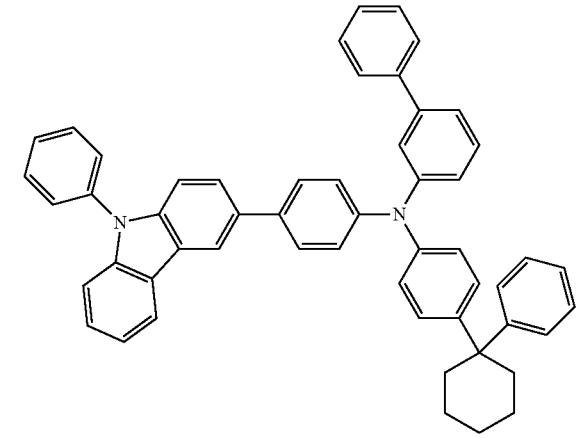

68
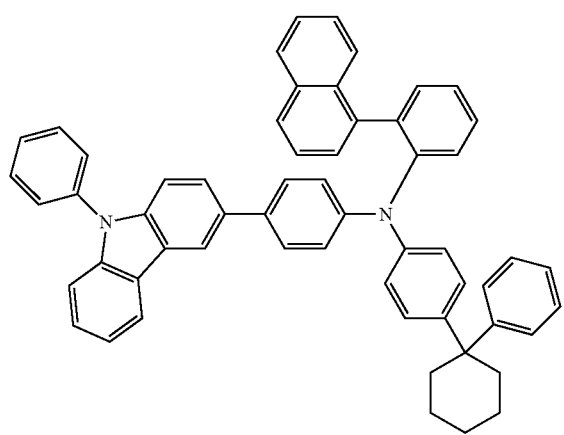
69
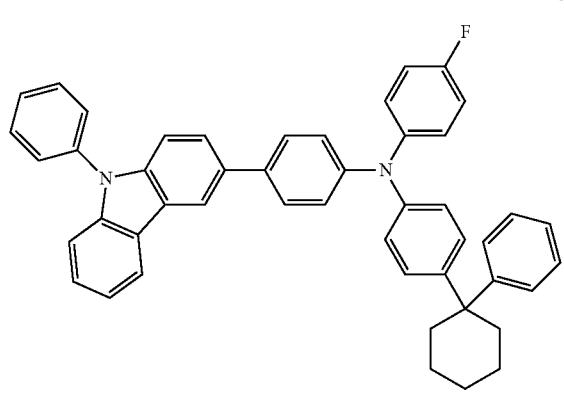
70
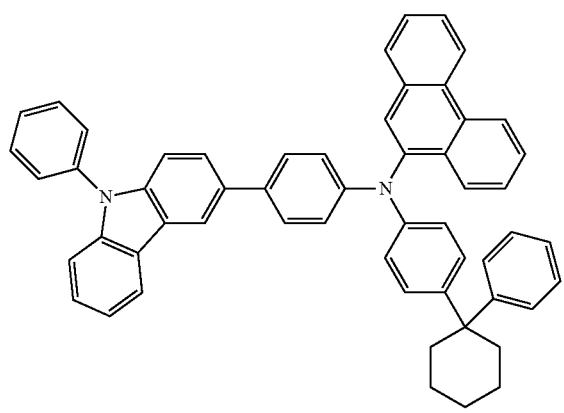
71
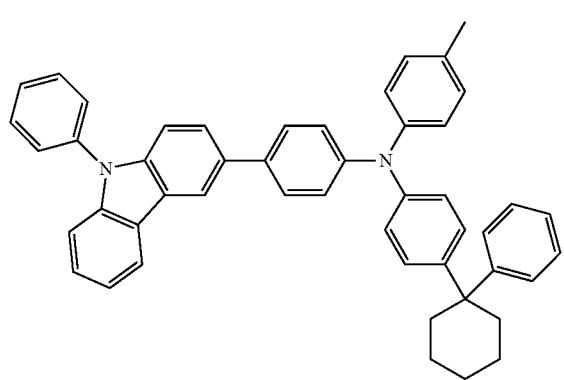
72
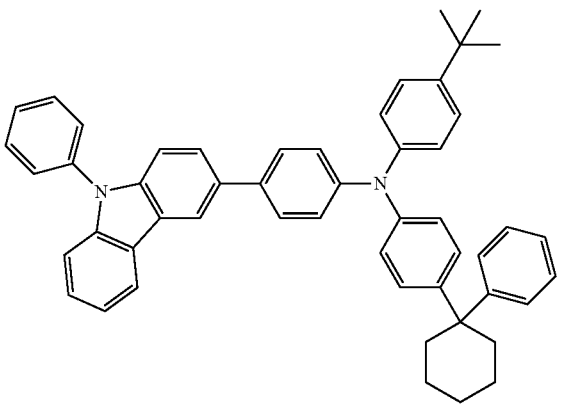
73
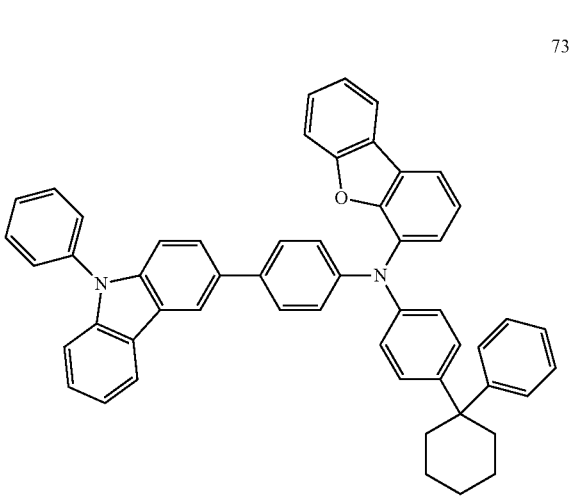
74
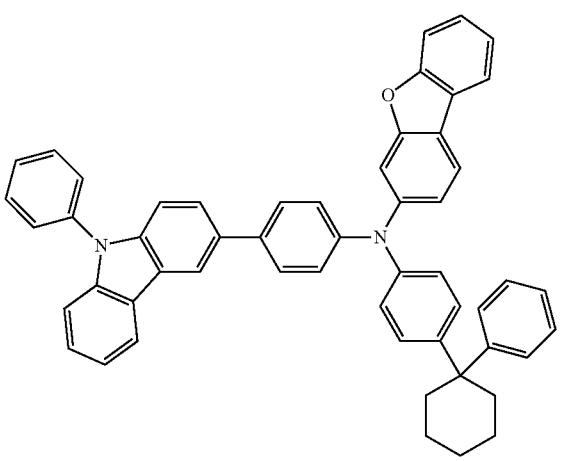

75
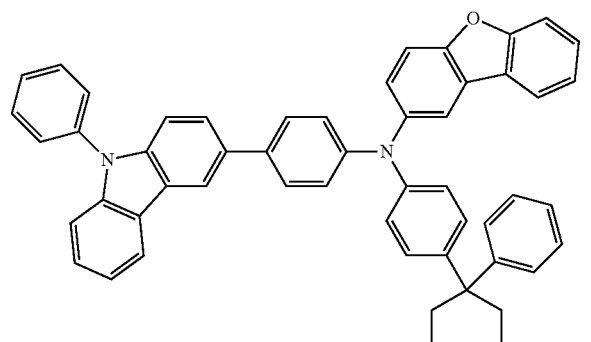
76
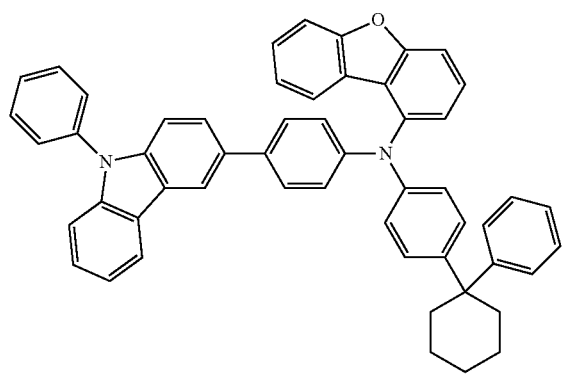
77
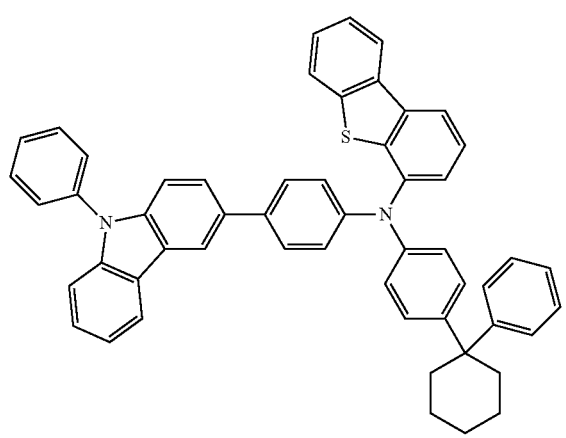
78
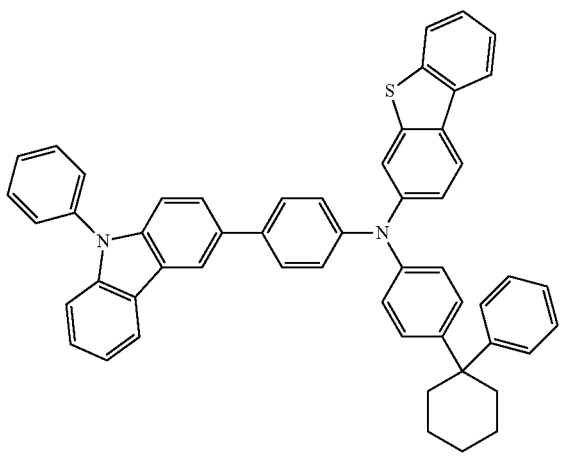
79
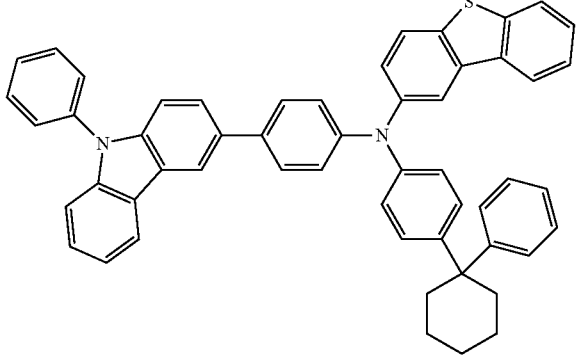
80
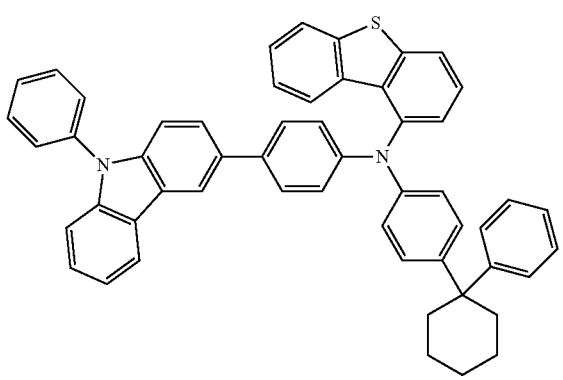

81
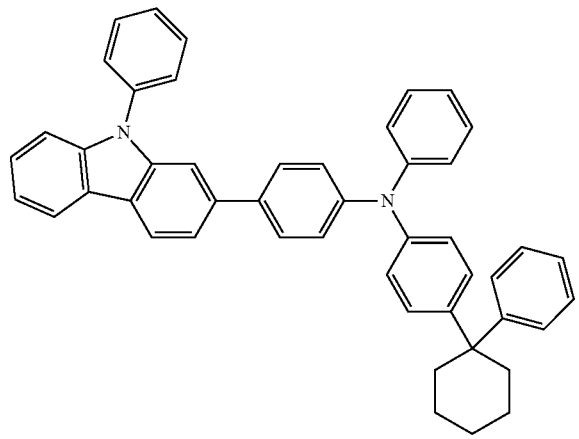
82
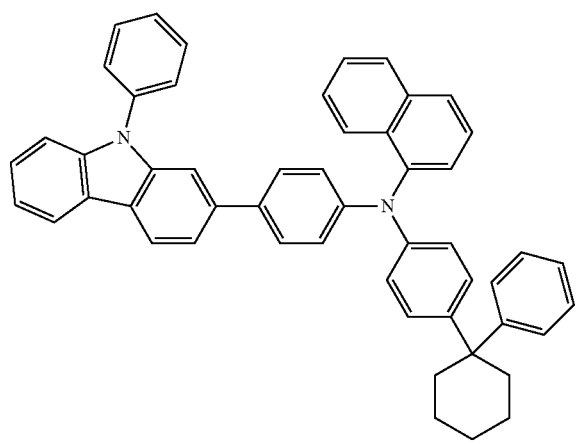
83
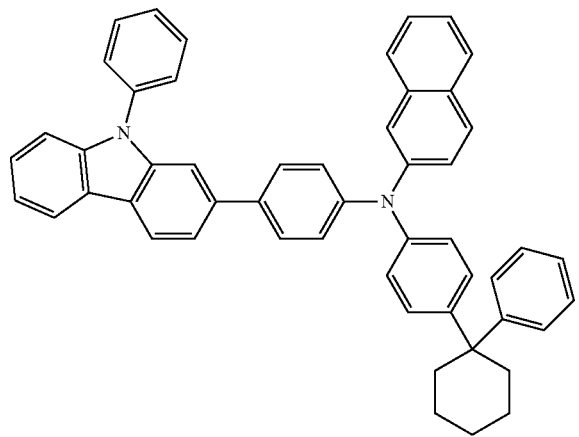
84
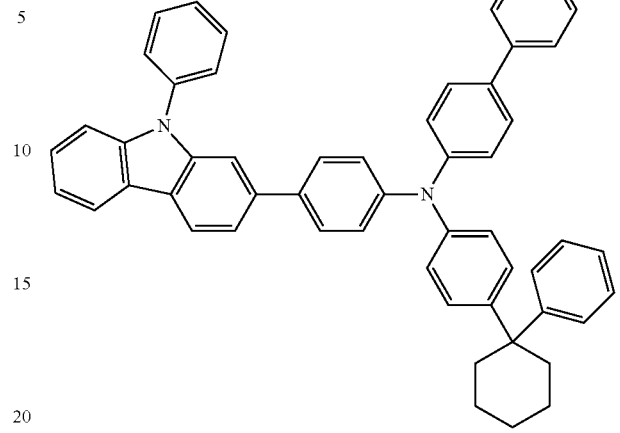
85
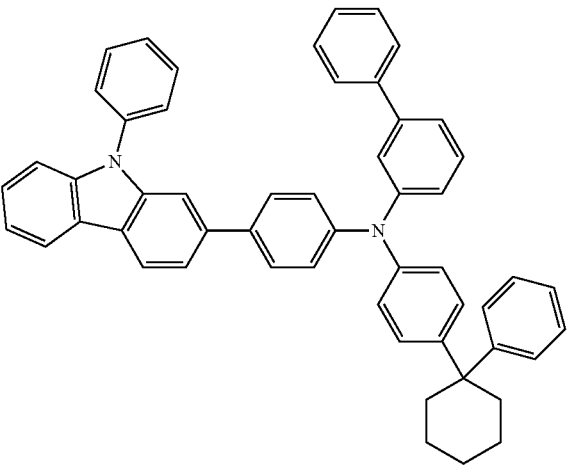
86
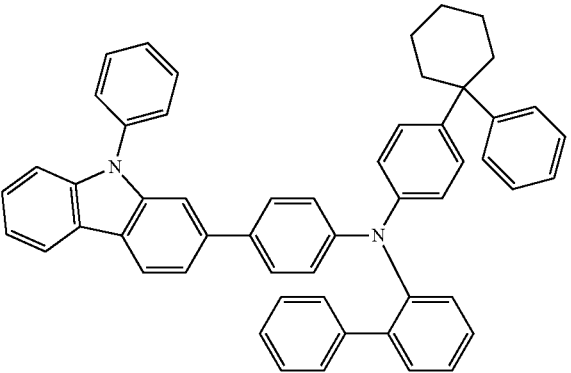

87
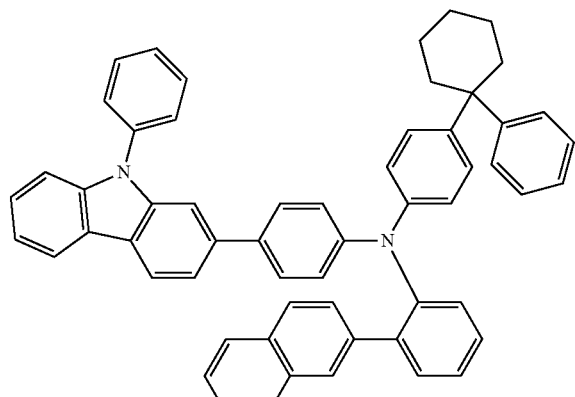
90
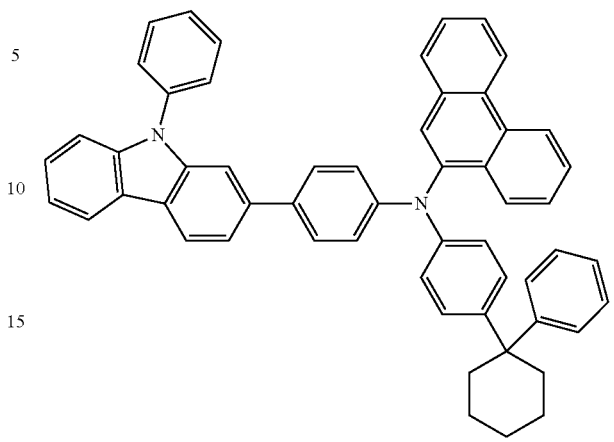
88
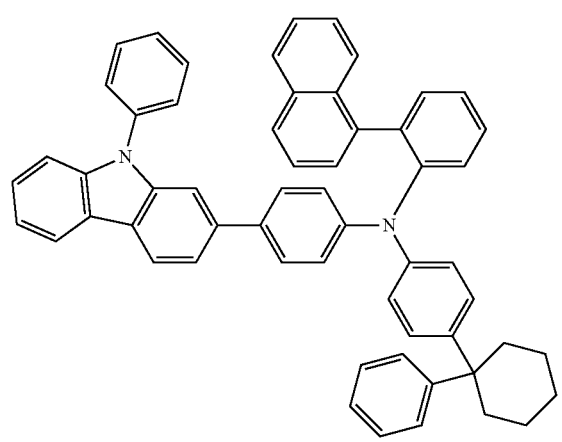
91
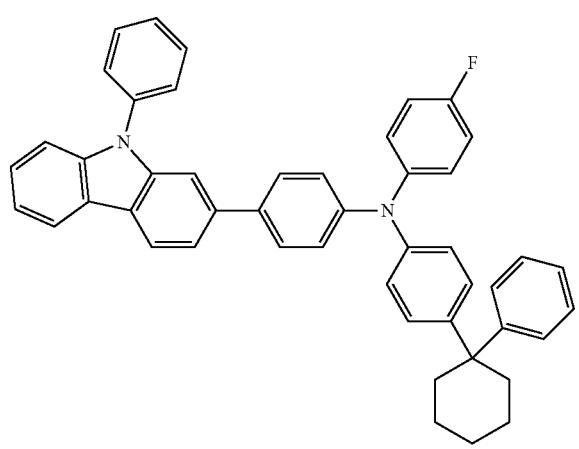
89
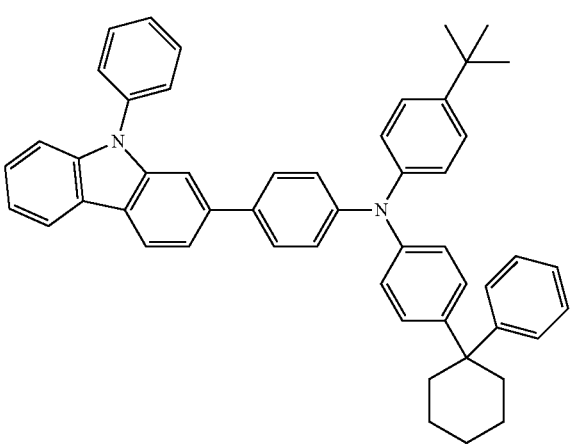
92

93
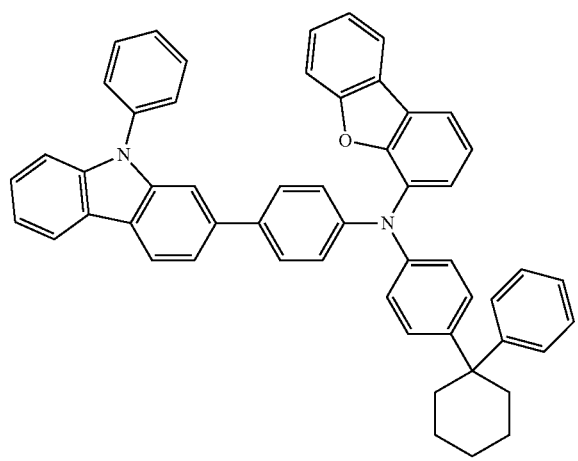
94
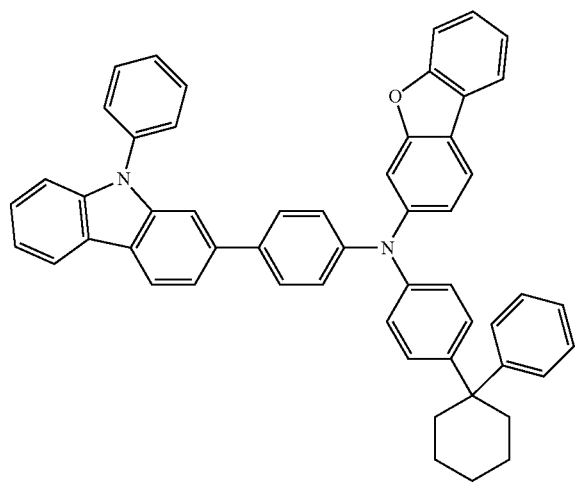
95
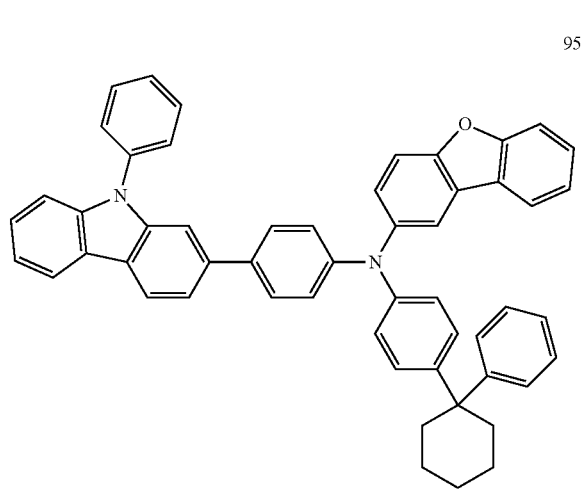
96
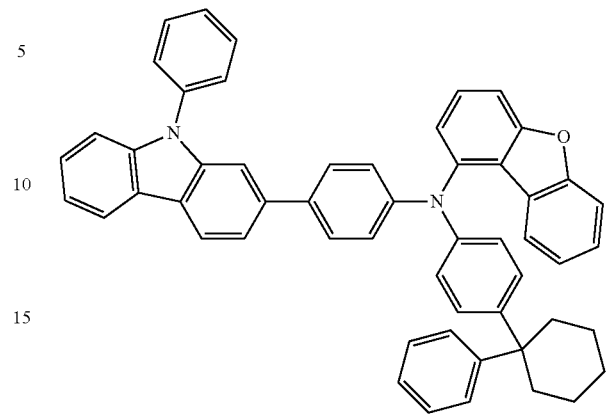
97
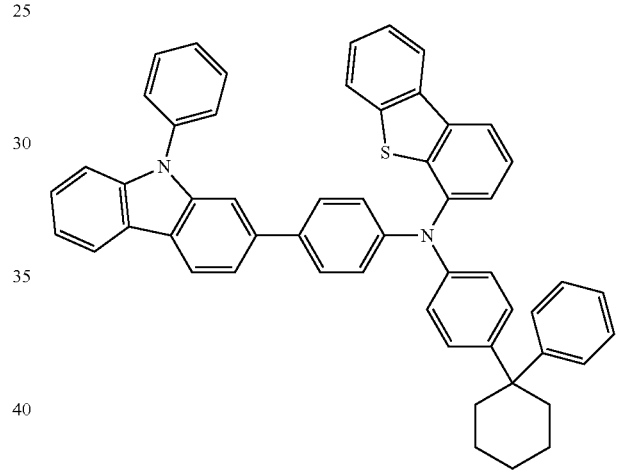
98
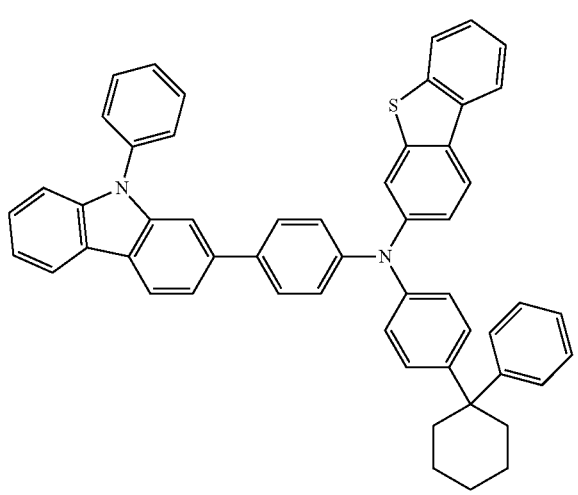

99
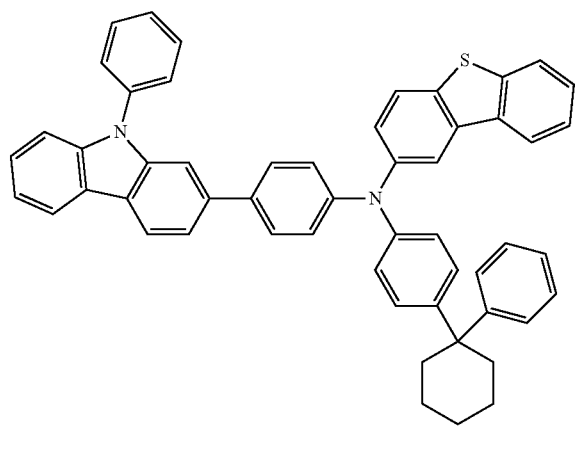
100
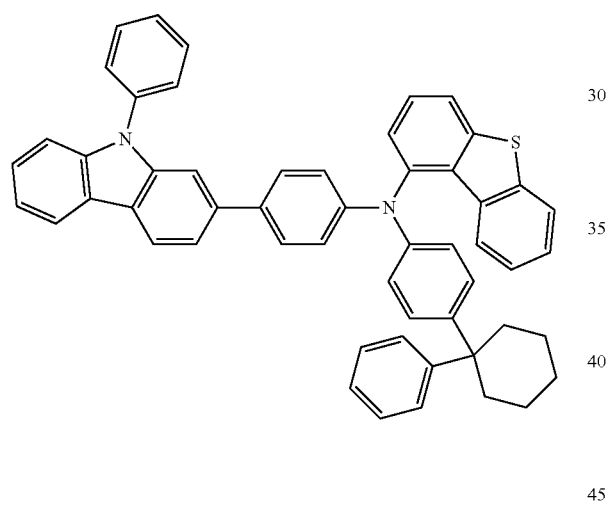
101
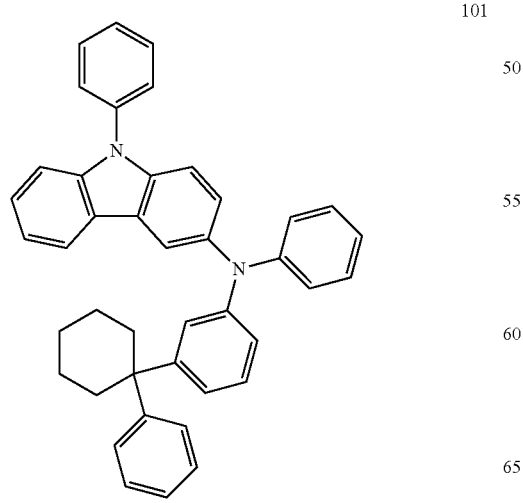
102
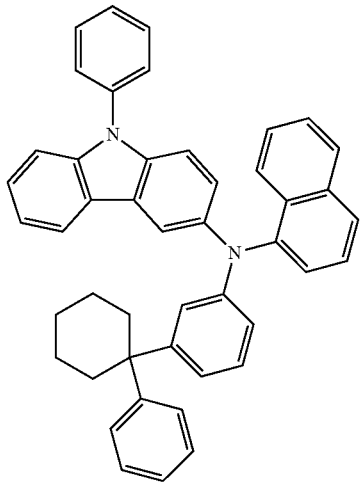
103
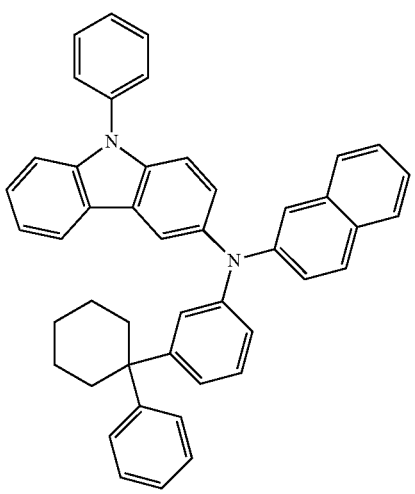
104
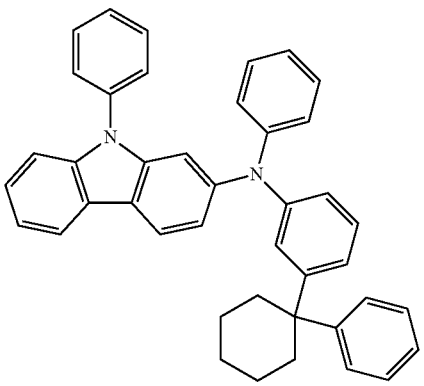

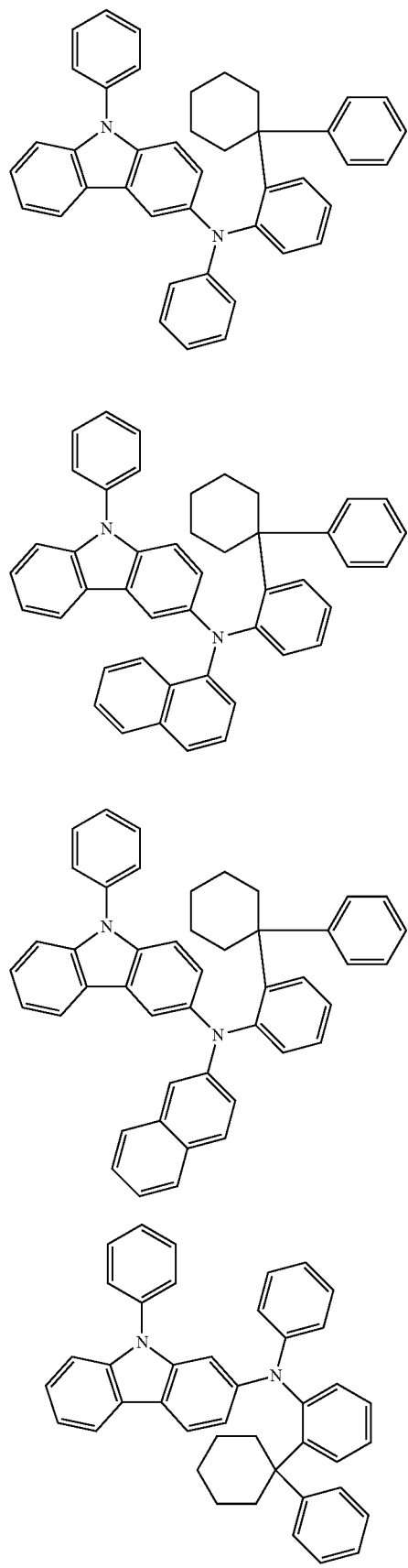
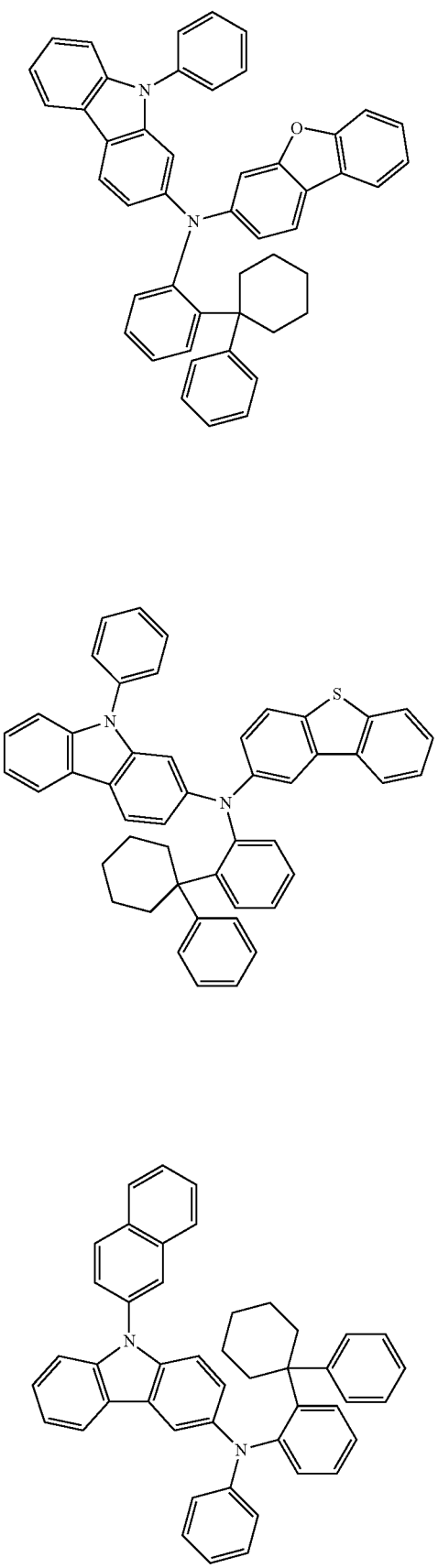

112
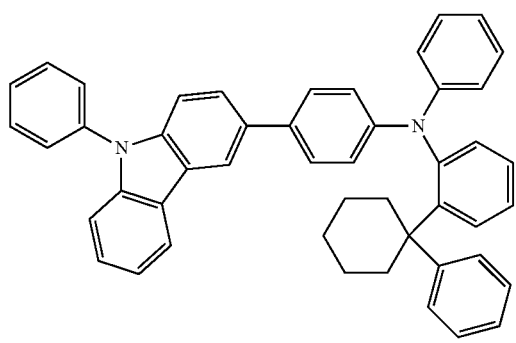
113
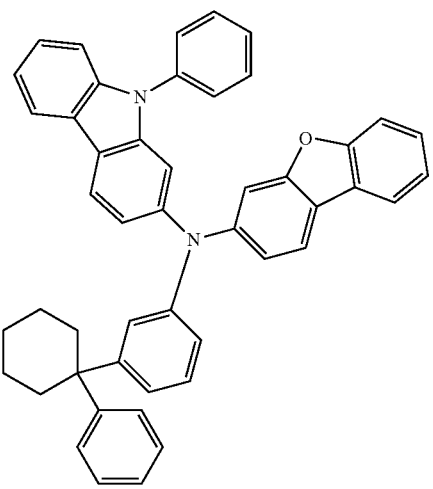
114
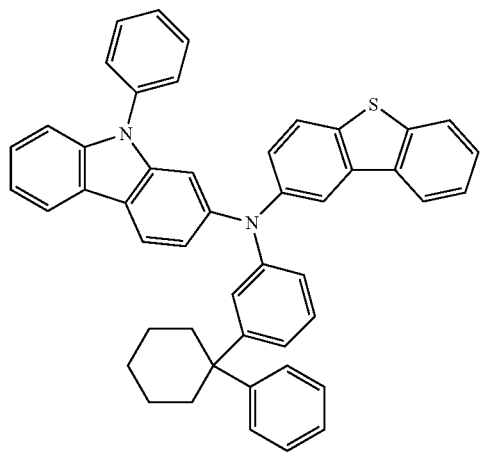
115
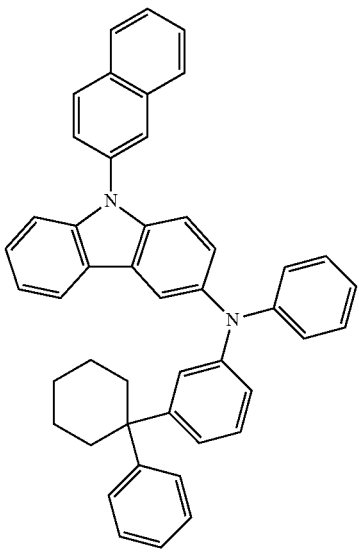
116
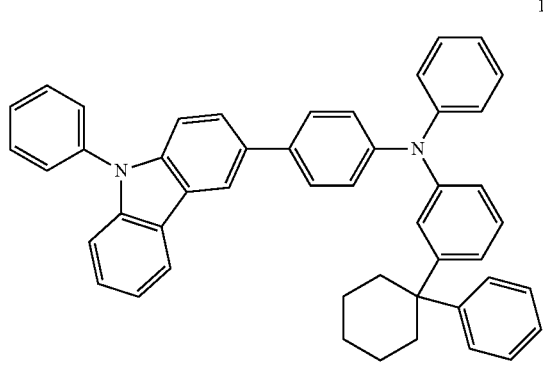
117
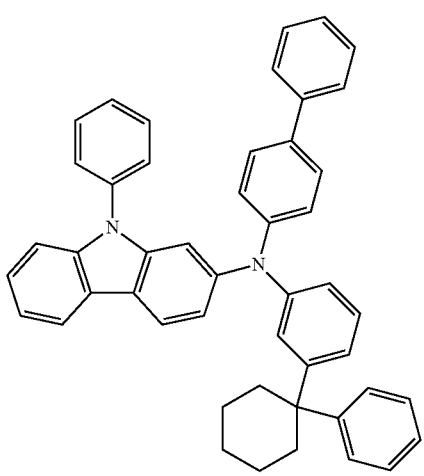

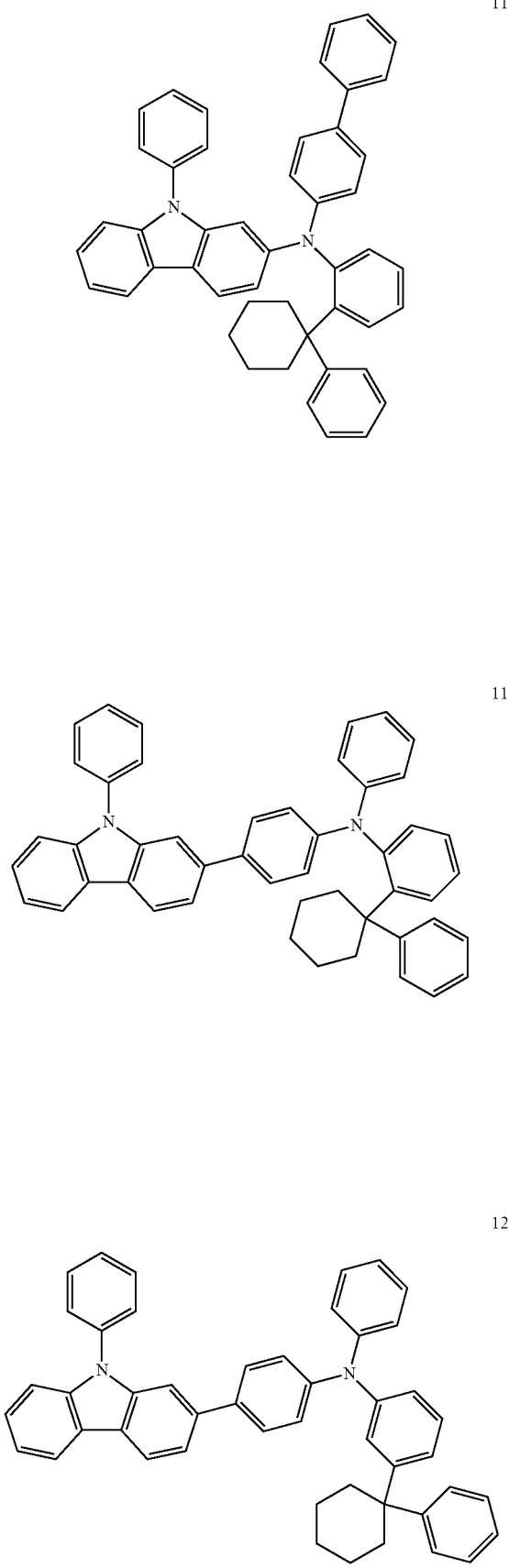
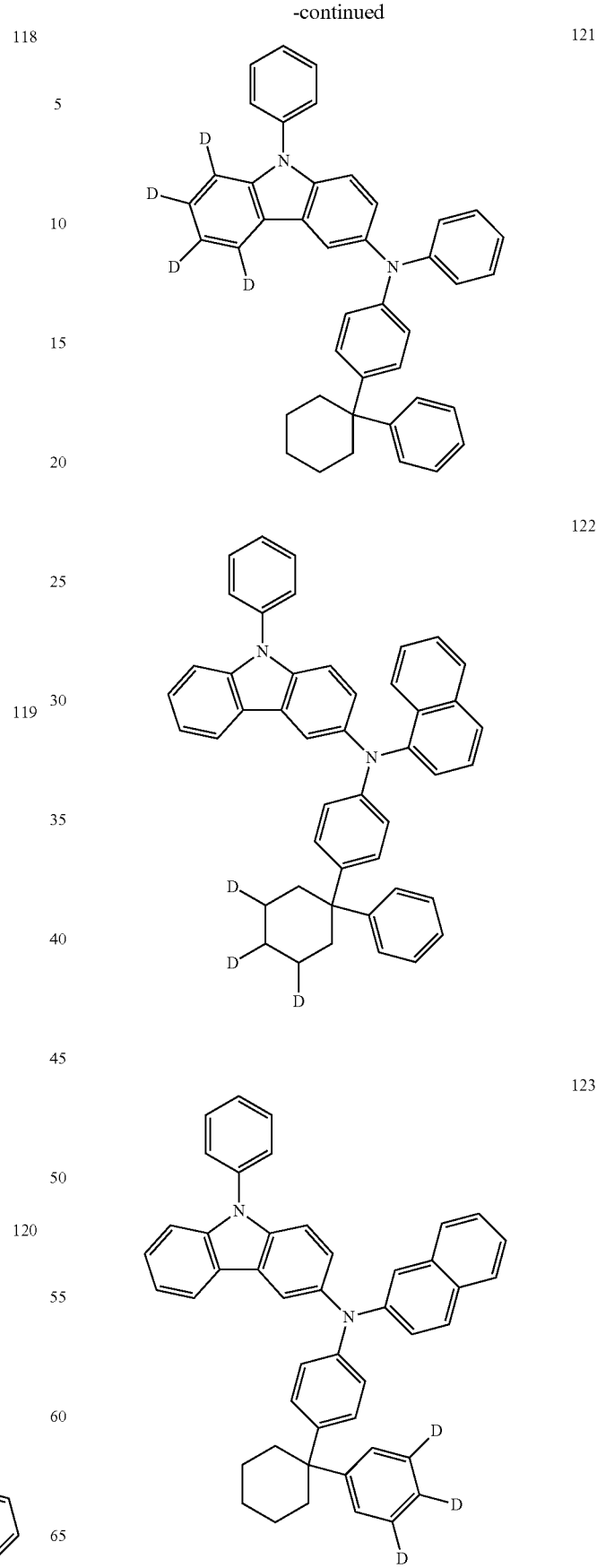

-continued

124

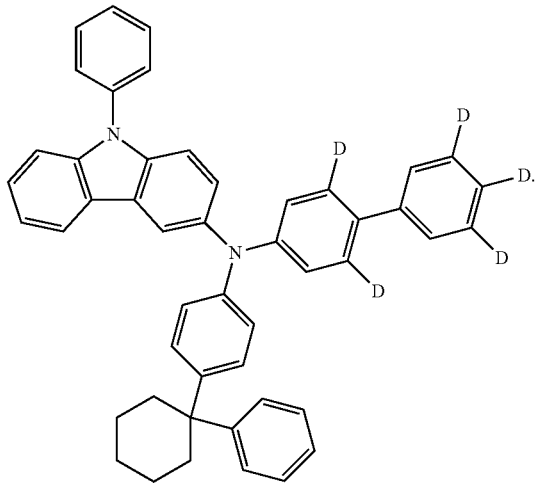

The above-described amine compound may be used in the organic electroluminescence device 10 of an embodiment to improve the efficiency and/or service life (e.g., life span) of the organic electroluminescence device. For example, the above-described amine compound may be used in the hole transport region HTR of the organic electroluminescence device 10 of an embodiment to improve the luminous efficiency, electron transport properties, and/or service life of the organic electroluminescence device.

An organic electroluminescence device according to an embodiment of the present disclosure will be further described with reference to FIGS. 1 to 3.

When the hole transport region HTR is a multilayer structure having a plurality of layers, at least one layer of the plurality of layers may include the amine compound represented by Formula 1. For example, the hole transport region HTR may include the hole injection layer HIL disposed on the first electrode EL1 and the hole transport layer HTL disposed on the hole injection layer HIL, wherein the hole injection layer HIL and/or the hole transport layer HTL may include the amine compound represented by Formula 1.

The hole transport region HTR may include one or two or more of the amine compounds represented by Formula 1. For example, the hole transport region HTR may include at least one selected from among the compounds represented by Compound Groups 1 as described above.

However, embodiments of the present disclosure are not limited thereto, and the hole injection layer HIL and the hole transport layer HTL may further include any suitable material.

The hole injection layer HIL may further include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4', 4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl) N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalene-1-yl)-N,N'-diphenyl-benzidine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorene derivatives, N,N'-bis (3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di (naphthalen-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The electron blocking layer EBL may include, for example, carbazole derivatives (such as N-phenyl carbazole and/or polyvinyl carbazole), fluorene derivatives, N,N'-bis (3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di (naphthalen-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-biscarbazole (CCP), 1,3-bis(N-carbazolyl)benzene (mCP), 1,3-bis(1,8-dimethyl-9H-carbazol-9-yl)benzene (mCDP), etc.

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be a quinone derivative, a metal oxide, or a cyano group-containing compound, but embodiments of the present disclosure are not limited thereto. Non-limiting examples of the p-dopant include quinone derivatives such as tetracyanoquinodimethane (TCNQ) and/or 2,3,5,6-tetrafluoro-7,7',8,8'-tetracyanoquinodimethane (F4-TCNQ), metal oxides such as tungsten oxide and/or molybdenum oxide, etc., but embodiments of the present disclosure are not limited thereto.

As described above, the hole transport region HTR may further include at least one of a hole buffer layer or an electron blocking layer EBL in addition to the hole injection layer HIL and the hole transport layer HTL. The hole buffer layer, may compensate for a resonance distance of the wavelength of light emitted from an emission layer EML, and may increase the light emission efficiency of the device. Materials that may be included in the hole transport region HTR may be included in the hole buffer layer. The electron blocking layer EBL may prevent or reduce electrons from being injected from the electron transport region ETR to the hole transport region HTR.

The emission layer EML is disposed on the hole transport region HTR. The thickness of the emission layer EML may be, for example, about 100 Å to about 1,000 Å or about 100 Å to about 300 Å. The emission layer EML may have (e.g., be) a single layer formed of (e.g., consisting of) a single material, a single layer formed of a plurality of different materials, or a multilayer structure having a plurality of layers formed of a plurality of different materials.

The emission layer may emit one of red, green, blue, white, yellow or cyan light. The emission layer EML may include a fluorescence-emitting material and/or a phosphorescence-emitting material.

Any suitable material in the art may be used in the emission layer EML, for example, one selected from fluoranthene derivatives, pyrene derivatives, arylacetylene derivatives, anthracene derivatives, fluorene derivatives, perylene derivatives, chrysene derivatives, etc. In some embodiments, the host materials may include pyrene derivatives, perylene derivatives, and/or anthracene derivatives. For example, anthracene derivatives represented by Formula 10 may be used as the host materials of the emission layer EML:

[Formula 10]

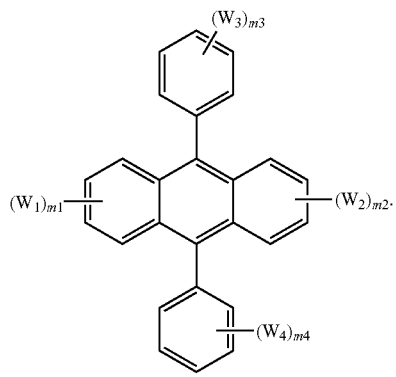

In Formula 10, $W_1$ to $W_4$ may each independently be a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, m1 and m2 are each independently an integer of 0 to 4, and m3 and m4 are each independently an integer of 0 to 5.

When m1 is 1, $W_1$ may not be a hydrogen atom, when m2 is 1, $W_2$ may not be a hydrogen atom, when m3 is 1, $W_3$ may not be a hydrogen atom, and when m4 is 1, $W_4$ may not be a hydrogen atom.

When m1 is 2 or more, a plurality of $W_1$'s may be the same or different. When m2 is 2 or more, a plurality of $W_2$'s may be the same or different. When m3 is 2 or more, a plurality of $W_3$'s may be the same or different. When m4 is 2 or more, a plurality of $W_4$'s may be the same or different.

The compound represented by Formula 10 may include, for example, a compound represented by (selected from) the following structures. However, the compound represented by Formula 10 is not limited thereto.

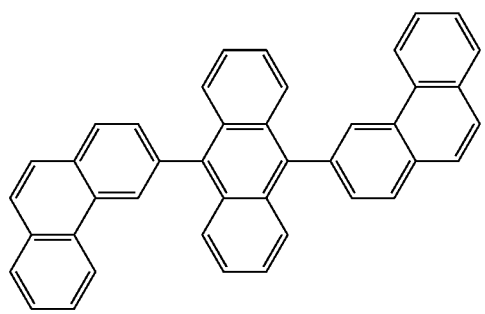

a-1

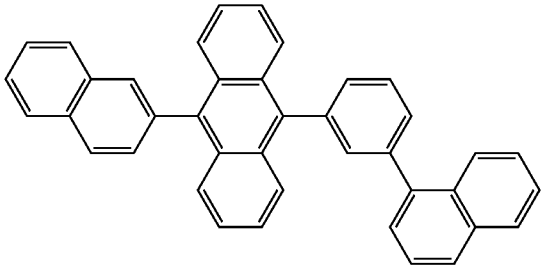

a-2

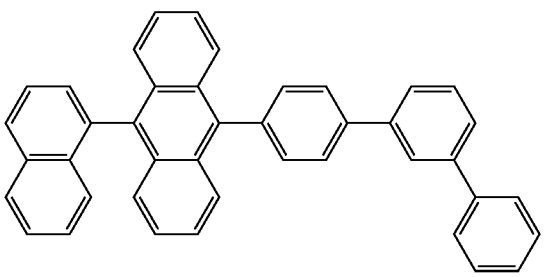

a-3

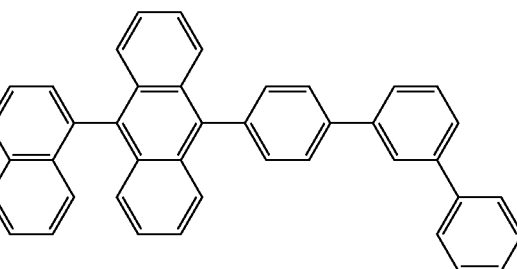

a-4

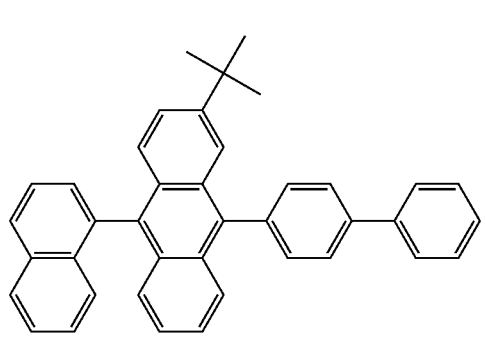

a-5

-continued
a-6
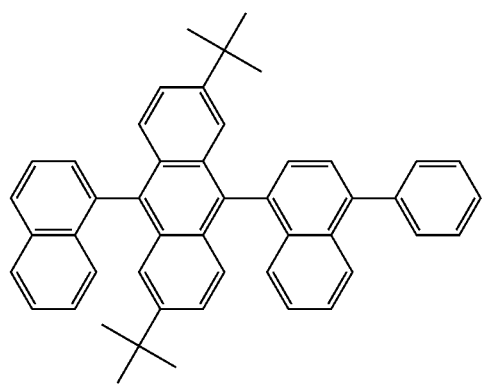
a-11
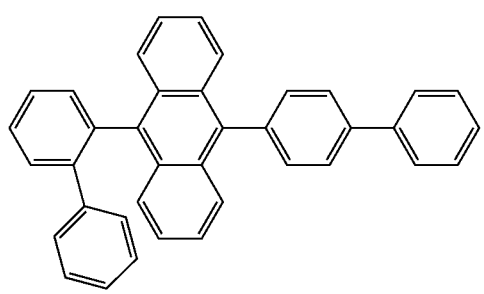
a-7
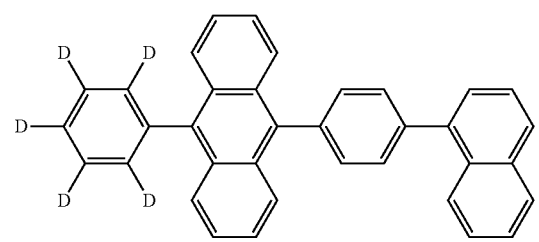
a-12
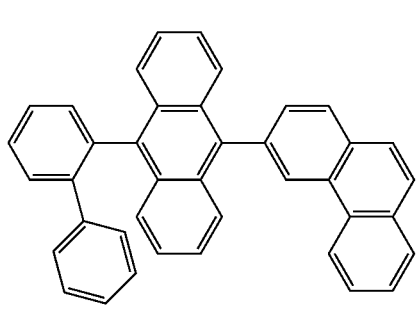
a-8
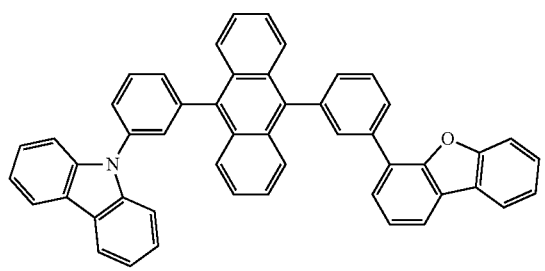
a-13
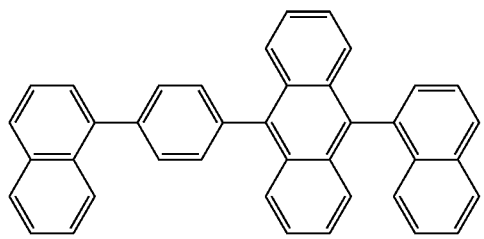
a-9
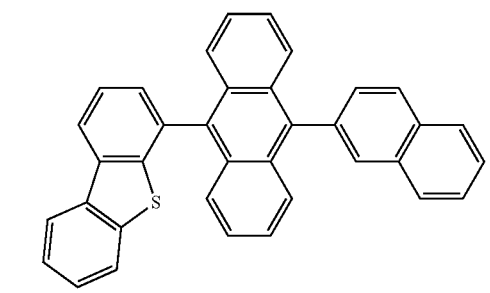
a-14
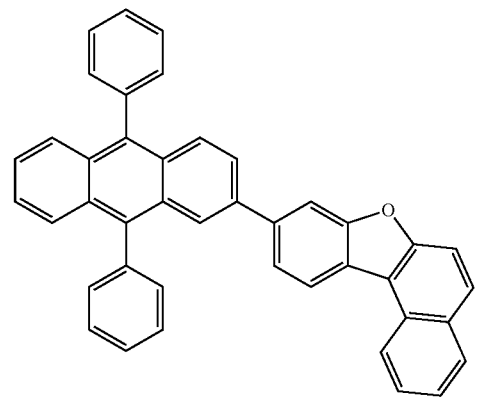
a-10
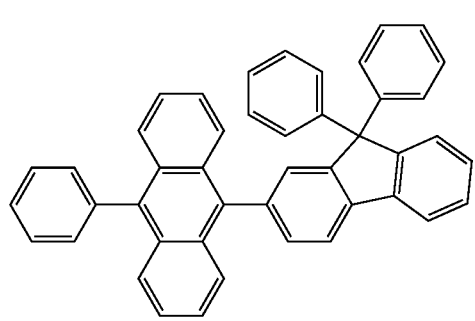

-continued

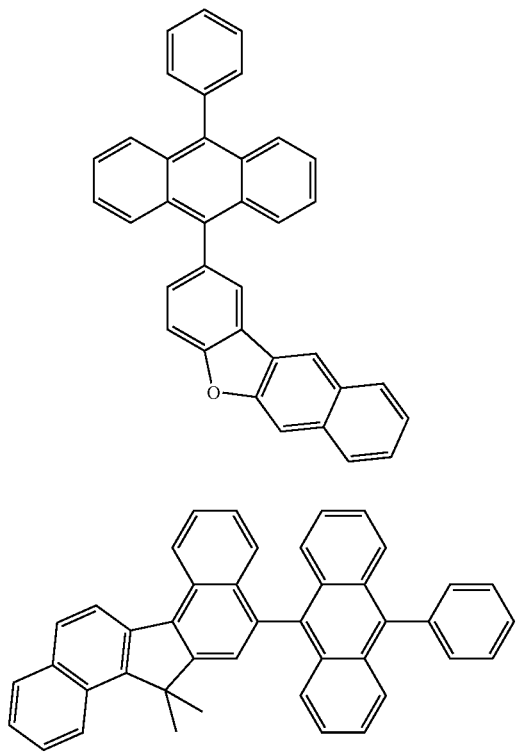

a-15 a-16

The emission layer EML may further include a dopant, and any suitable material may be used as the dopant. For example, at least one of a styryl derivative (for example, 1,4-bis[2-(3-N-ethylcarbazolyl)vinyl]benzene (BCzVB), 4-(di-p-tolylamino)-4"-[(di-p-tolylamino)styryl]stilbene (DPAVB), 4,4'-bis[2-(4-(N,N-diphenylamino)phenyl)vinyl]biphenyl (DPAVBi) and/or N-(4-((E)-2-(6-((E)-4-(diphenylamino)styryl)naphthalen-2-yl)vinyl)phenyl)-N-phenylbenzenamine (N-BDAVBi)), perylene and/or a derivative thereof (for example, 2,5,8,11-tetra-t-butylperylene (TBPe)), and/or pyrene and/or a derivative thereof (for example, 1,1-dipyrene, 1,4-dipyrenylbenzene, 1,4-bis(N,N-diphenylamino)pyrene, 1,6-bis(N,N-diphenylamino)pyrene), 2,5,8,11-tetra-t-butylperylene (TBP), and/or 1,3,5-tris(N-phenylbenzimidazole-2-yl)benzene (TPBi)) may be used as a dopant, but embodiments of the present disclosure are not limited thereto.

The emission layer EML may further include any suitable material in the art as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benz[d]imidazole-2-yl)benzene (TPBi). However, embodiments of the present disclosure are not limited thereto, and for example, tris(8-hydroxyquinolino)aluminum (Alq$_3$), 4,4'-bis(N-carbazolyl)-1,1'-biphenyl (CBP), poly(N-vinylcarbazole (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc. may be used as a host material.

In an embodiment, the emission layer EML may include any suitable phosphorescence dopant material in the art. For example, a metal complex including iridium (Ir), platinum (Pt), osmium (Os), aurum (Au), titanium (Ti), zirconium (Zr), hafnium (Hf), europium (Eu), terbium (Tb), and/or thulium (Tm) may be used as a phosphorescence dopant. For example, iridium(III) bis(4,6-difluorophenylpyridinato-N,C2')picolinate (Flrpic), bis(2,4-difluorophenylpyridinato)-tetrakis(1-pyrazolyl)borate iridium (III) (Fir6), and/or platinum octaethyl porphyrin (PtOEP) may be used as a phosphorescence dopant. However, embodiments of the present disclosure are not limited thereto.

The emission layer EML may further include any suitable phosphorescence host material in the art, for example, bis(4-(9H-carbazol-9-yl)phenyl)diphenylsilane (BCPDS).

When the emission layer EML is to emit red light, the emission layer EML may further include, for example, a fluorescent material including tris(dibenzoylmethanato) phenanthoroline europium (PBD: Eu(DBM)$_3$(Phen)) or perylene. When the emission layer EML is to emit red light, a dopant included in the emission layer EML may be, for example, a metal complex and/or an organometallic complex (such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and/or octaethylporphyrin platinum (PtOEP)), rubrene and/or a derivative thereof, and/or 4-dicyanomethylene-2-(p-dimethylaminostyryl)-6-methyl-4H-pyran (DCM) and/or a derivative thereof.

When the emission layer EML is to emit green light, the emission layer EML may further include, for example, a fluorescent material including tris(8-hydroxyquinolino)aluminum (Alq$_3$). When the emission layer EML is to emit green light, a dopant included in the emission layer EML may be, for example, selected from a metal complex or an organometallic complex (such as fac-tris(2-phenylpyridine) iridium (Ir(ppy)$_3$)) and coumarin and/or a derivative thereof.

When the emission layer EML is to emit blue light, the emission layer EML may further include, for example, a fluorescent material including one selected from the group consisting of spiro-DPVBi, spiro-6P, distyryl-benzene (DSB), distyryl-arylene (DSA), a polyfluorene (PFO)-based polymer, and a poly(p-phenylene vinylene (PPV)-based polymer. When the emission layer EML is to emit blue light, a dopant included in the emission layer EML may be, for example, selected from a metal complex and/or an organometallic complex (such as (4,6-F2ppy)$_2$Irpic), and/or perylene and a derivative thereof.

In some embodiments, the organic electroluminescence device 10 of an embodiment may include a plurality of emission layers. The plurality of emission layers may be sequentially stacked, and for example, the organic electroluminescence device 10 including the plurality of emission layers may be to emit white light. The organic electroluminescence device including a plurality of emission layers may be an organic electroluminescence device having a tandem structure.

The electron transport region ETR is disposed on the emission layer EML. The electron transport region ETR may include at least one of a hole blocking layer HBL, an electron transport layer ETL, or an electron injection layer EIL, but embodiments are not limited thereto.

The electron transport region ETR may have (e.g., be) a single layer formed of (e.g., consisting of) a single material, a single layer formed of a plurality of different materials, or a multilayer structure including a plurality of layers formed of a plurality of different materials.

For example, the electron transport region ETR may have (e.g., be) a single layer structure of an electron injection layer EIL or an electron transport layer ETL, or may have (e.g., be) a single layer structure formed of an electron injection material and an electron transport material. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, about 1,000 Å to about 1,500 Å.

The electron transport region ETR in the organic electroluminescence device 10 of an embodiment may include an amine compound according to an embodiment of the present disclosure. In another embodiment, the electron injection layer EIL or the electron transport layer ETL may include the amine compound according to an embodiment of the present disclosure.

The electron transport region ETR may be formed by utilizing any suitable method (such as a vacuum deposition method, a spin coating method, a cast method, a Langmuir-Blodgett (LB) method, an inkjet printing method, a laser printing method, a laser induced thermal imaging (LITI) method, etc.)

The electron transport region ETR may include any suitable material in the art. When the electron transport region ETR includes the electron transport layer ETL, the electron transport region ETR may include an anthracene-based compound. However, embodiments of the present disclosure are not limited thereto, and the electron transport region may include, for example, tris(8-hydroxyquinolinato) aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazol-1-yl)phenyl)-9,10-dinaphthylanthracene, 1,3,5-tris(1-phenyl-1H-benzo[d]imidazol-2-yl) benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate (Bebq$_2$), 9,10-di(naphthalene-2-yl)anthracene (ADN), 1,3-bis[3,5-di(pyridin-3-yl)phenyl] benzene (B3PyPB), or a mixture thereof. The thickness of the electron transport layers ETL may be about 100 Å to about 1,000 Å, for example, about 150 Å to about 500 Å. When the thickness of the electron transport layers ETL satisfies the above-described ranges, satisfactory electron transport characteristics may be obtained without a substantial increase in driving voltage.

When the electron transport region ETR includes the electron injection layer EIL, the electron transport region ETR may be formed utilizing a metal halide (such as LiF, NaCl, CsF, RbCl, RbI, and/or CuI), a lanthanide metal (such as Yb), a metal oxide (such as Li$_2$O and/or BaO), 8-hydroxyl-lithium quinolate (LiQ), etc., but embodiments of the present disclosure are not limited thereto. The electron injection layer EIL may also be formed of a mixture material of an electron transport material and an insulating organometallic salt. The organometallic salt may be a material having an energy band gap of about 4 eV or more. The organometallic salt may include, for example, metal acetates, metal benzoates, metal acetoacetates, metal acetylacetonates, and/or metal stearates. The thickness of the electron injection layer EIL may be about 1 Å to about 100 Å, and about 3 Å to about 90 Å. When the thickness of the electron injection layers EIL satisfies the above-described ranges, satisfactory electron injection properties may be obtained without a substantial increase in driving voltage.

The electron transport region ETR may include a hole blocking layer HBL as described above. The hole blocking layer HBL may include, but is not limited to, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen).

The second electrode EL2 is disposed on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a multilayer structure including a reflective layer or a transflective layer formed of the above-described materials, and a transparent conductive layer formed of ITO, IZO, ZnO, ITZO, etc.

In some embodiments, the second electrode EL2 may be connected with an auxiliary electrode. When the second electrode EL2 is connected to the auxiliary electrode, the resistance of the second electrode EL2 may decrease.

Referring to FIG. 4, the organic electroluminescence device 10 according to an embodiment may further include a capping layer CPL on the second electrode EL2. The capping layer CPL may include a multilayer or a single layer. In an embodiment, the capping layer CPL may be an organic layer or an inorganic layer. For example, when the capping layer CPL includes an inorganic material, the inorganic material may include an alkaline metal compound (such as LiF), an alkaline earth metal compound (such as MgF$_2$, SiON, SiN$_x$, and/or SiO$_y$), etc.

For example, when the capping layer CPL includes an organic material, the capping layer CPL may include the amine compound according to an embodiment. However, embodiments of the present disclosure are not limited thereto, and the capping layer CPL may include α-NPD, NPB, TPD, m-MTDATA, Alq$_3$, CuPc, N4,N4,N4',N4'-tetra (biphenyl-4-yl)biphenyl-4,4'-diamine (TPD15), 4,4',4''-tris (carbazol-9-yl)triphenylamine (TCTA), etc., or an epoxy resin, or an acrylate (such as methacrylate). However, embodiments of the present disclosure are not limited thereto, and the organic material may include at least one selected from Compounds P1 to P5.

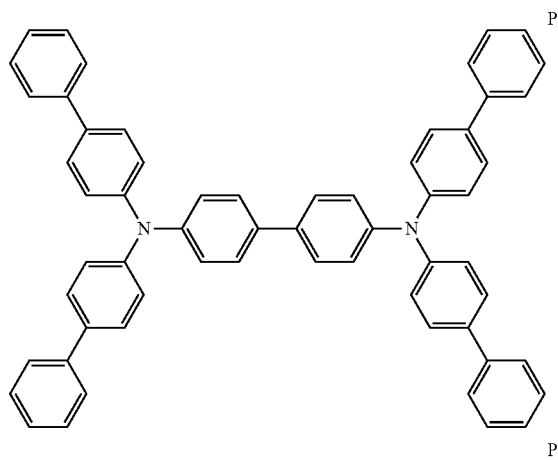
P1

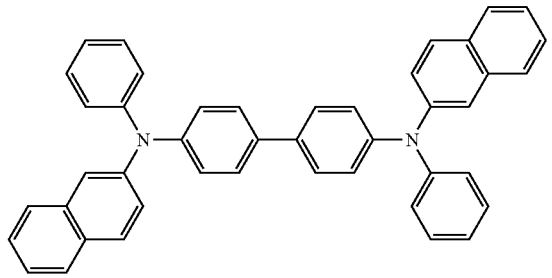
P2

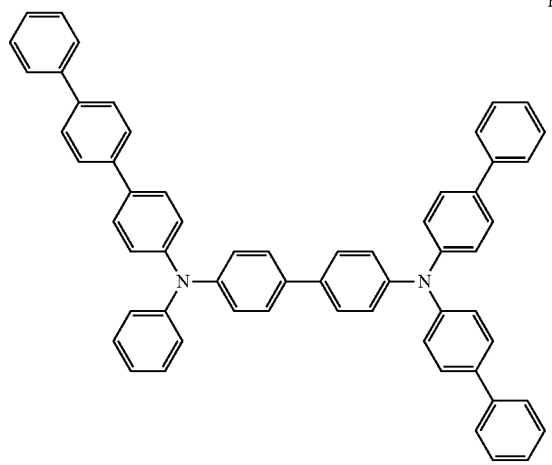
P3

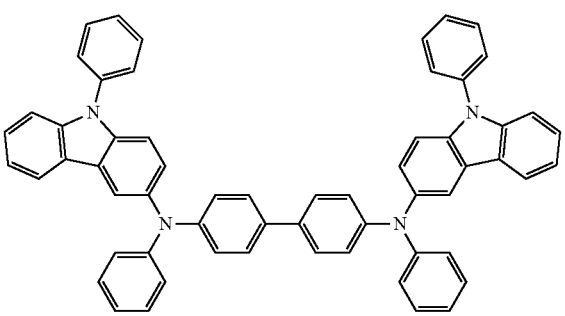
P4

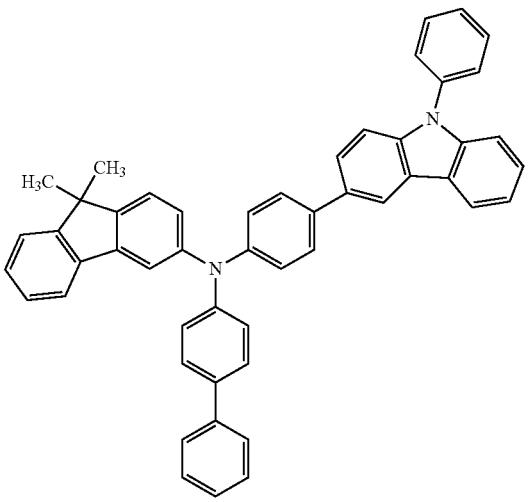
P5

The organic electroluminescence device 10 according to an embodiment of the present disclosure may include the amine compound represented by Formula 1 as described above to thereby exhibit excellent luminous efficiency and/or long service life characteristics. The organic electroluminescence device 10 of an embodiment may achieve high efficiency and/or long service life characteristics in a blue wavelength region.

Hereinafter, a compound according to an embodiment of the present disclosure and an organic electroluminescence device of an embodiment will be described in more detail with reference to Examples and Comparative Examples. The Examples are illustrated only to facilitate understanding of this present disclosure, and the scope of the present disclosure is not limited thereto.

EXAMPLES

Synthesis of Amine Compound

In the following descriptions, a synthetic method of an amine compound is provided as an example, but the synthetic method according to an embodiment of the present disclosure is not limited to the following examples.

1. Synthesis of Compound 1

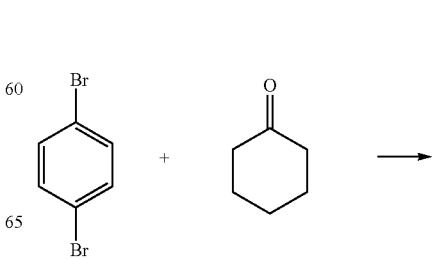

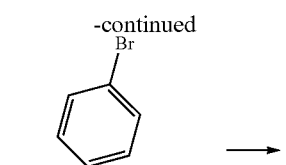

1-1

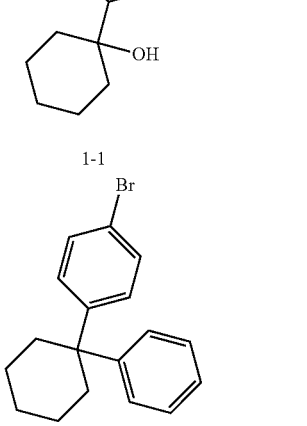

1-2

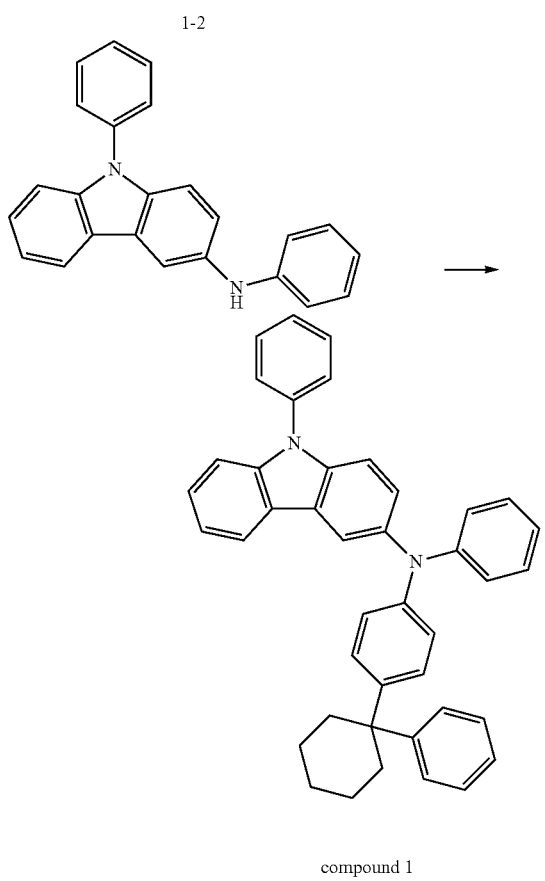

compound 1

Synthesis of Intermediate 1-1

1,4-dibromobenzene (2.36 g, 10 mmol) was dissolved in THF (20 mL), n-BuLi was added thereto at −78° C., and the mixture was stirred for 1 hour. Then, cyclohexanone (0.98 g, 10.0 mmol) was dissolved in THF (20 mL) and added to the mixture. The mixture was cooled to room temperature, stirred for 1 hour, and extracted with DCM and 1N HCl to obtain an organic layer. The obtained organic layer was dried with magnesium sulfate, and residues obtained by evaporating the solvent were separated and purified by silica gel chromatography to obtain Intermediate 1-1 (1.53 g, yield 60%). The produced compound was identified through LC-MS. $C_{12}H_{15}BrO$ $M^+$ 254.0

Synthesis of Intermediate 1-2

Intermediate 1-1 (2.55 g, 10 mmol), $AlCl_3$ (1.33 g, 10 mmol), and benzene (10 mL) were added, and the mixture was stirred at 70° C. for 3 hours, cooled to room temperature, neutralized with sodium bicarbonate, and extracted with DCM and water. The obtained organic layer was dried with magnesium sulfate, and residues obtained by evaporating the solvent were separated and purified by silica gel chromatography to obtain Intermediate 1-2 (1.58 g, yield 50%). The produced compound was identified through LC-MS. $C_{18}H_{19}Br$ $M^+$314.0

Synthesis of Compound 1

Intermediate 1-2 (3.15 g, 10 mmol), N,9-diphenyl-9H-carbazol-3-amine (3.34 g, 10 mmol), tris(dibenzylidene acetone)dipalladium(0) ($Pd_2dba_3$) (0.46 g, 0.5 mmol), and sodium tert-butoxide (2.88 g, 30 mmol) were dissolved in toluene (60 mL) and then stirred at 80° C. for 3 hours. The reaction solution was cooled to room temperature, 40 mL of water was added thereto, and the mixture was extracted three times with 50 mL of ethyl ether to collect an organic layer. The collected organic layer was dried with magnesium sulfate, and residues obtained by evaporating the solvent were separated and purified by silica gel chromatography to obtain Compound 1 (3.98 g, yield 70%). The produced compound was identified through MS/FAB and $^1H$ NMR.

2. Synthesis of Compound 2

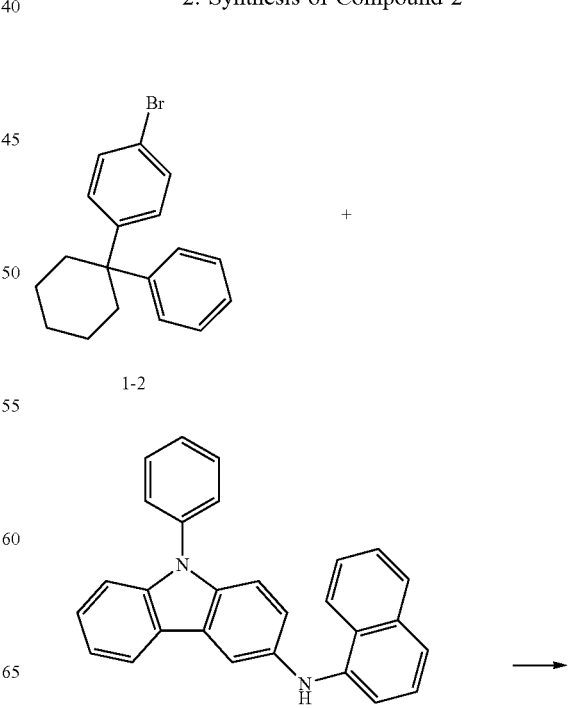

1-2

69

-continued

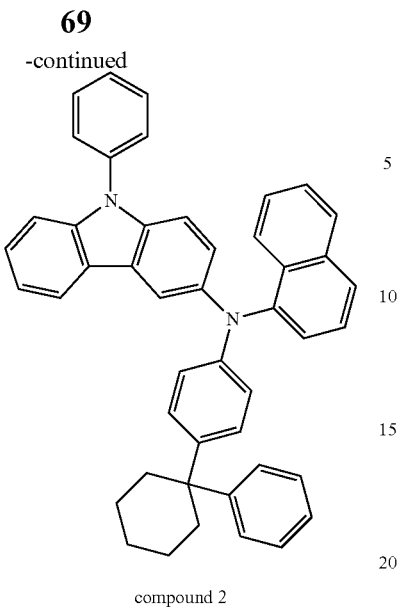

compound 2

Compound 2 was synthesized in substantially the same manner as the synthesis of Compound 1 by utilizing N-(naphthalen-1-yl)-9-phenyl-9H-carbazol-3-amine instead of N,9-diphenyl-9H-carbazol-3-amine. The produced compound was identified through MS/FAB and $^1$H NMR.

3. Synthesis of Compound 3

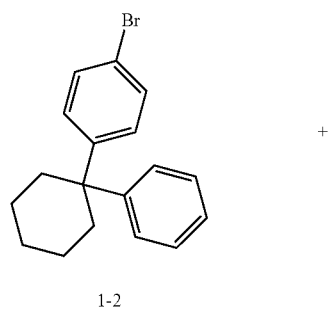

1-2

70

-continued

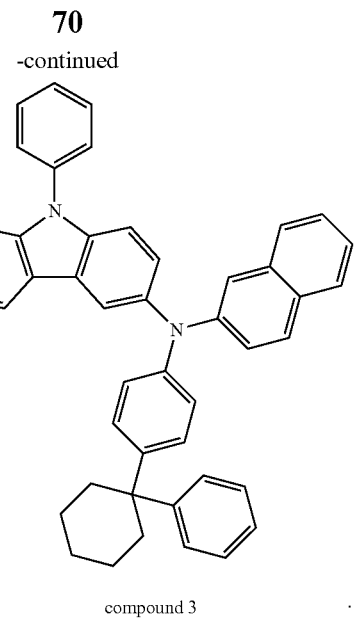

compound 3

Compound 3 was synthesized in substantially the same manner as the synthesis of Compound 1 by utilizing N-(naphthalen-2-yl)-9-phenyl-9H-carbazol-3-amine instead of N,9-diphenyl-9H-carbazol-3-amine. The produced compound was identified through MS/FAB and $^1$H NMR.

4. Synthesis of Compound 21

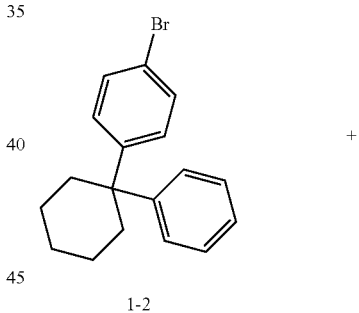

1-2

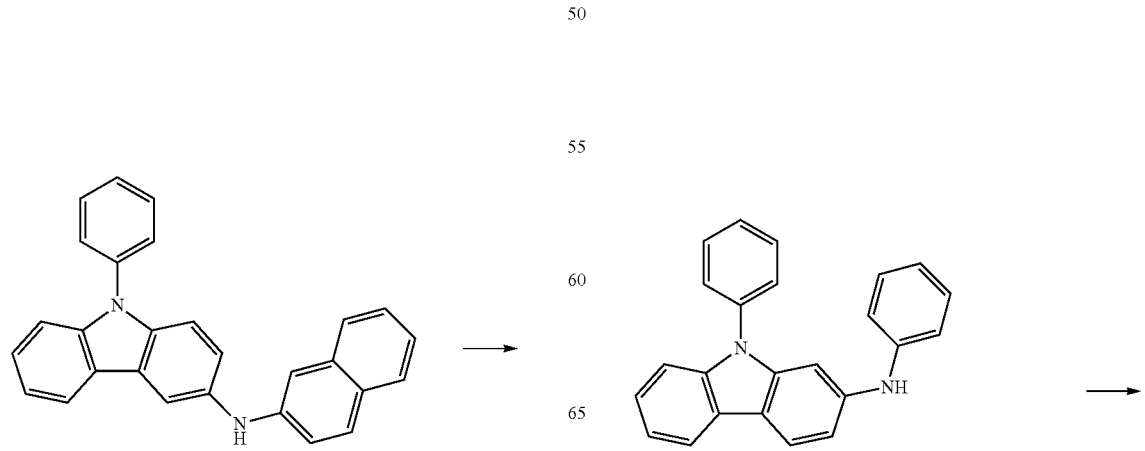

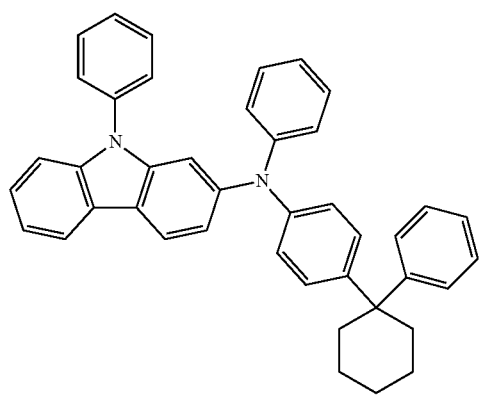

compound 21

Compound 21 was synthesized in substantially the same manner as the synthesis of Compound 1 by utilizing N,9-diphenyl-9H-carbazol-2-amine instead of N,9-diphenyl-9H-carbazol-3-amine. The produced compound was identified through MS/FAB and ¹H NMR.

5. Synthesis of Compound 24

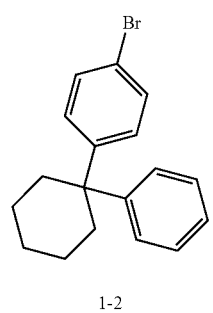

1-2

+

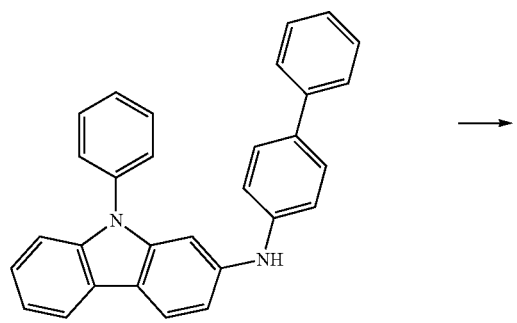

→

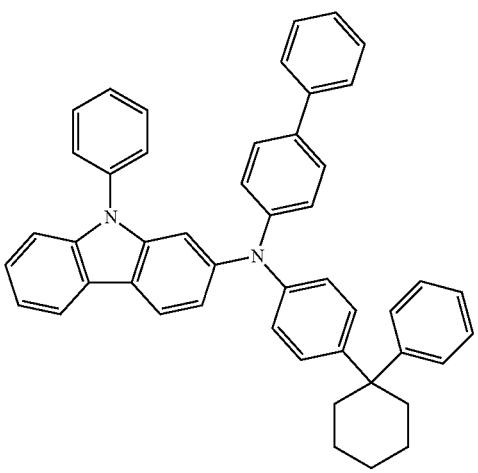

compound 24

Compound 24 was synthesized in substantially the same manner as the synthesis of Compound 1 by utilizing N-([1,1'-biphenyl]-4-yl)-9-phenyl-9H-carbazol-2-amine instead of N,9-diphenyl-9H-carbazol-3-amine. The produced compound was identified through MS/FAB and ¹H NMR.

6. Synthesis of Compound 34

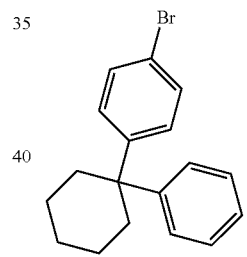

1-2

+

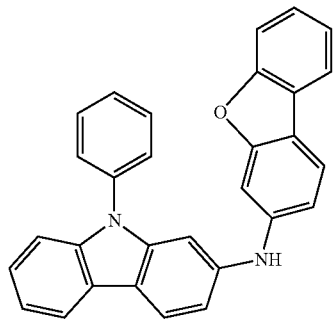

→

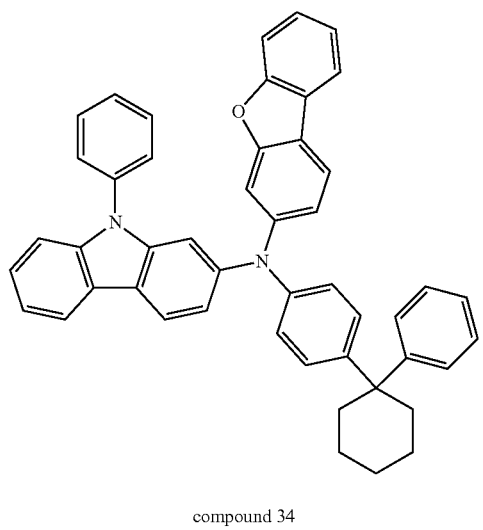

compound 34

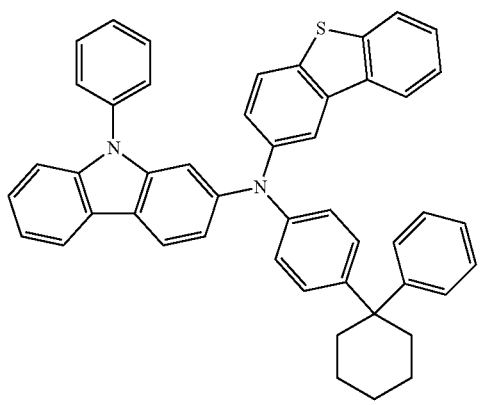

compound 39

Compound 34 was synthesized in substantially the same manner as the synthesis of Compound 1 by utilizing N-(dibenzo[b,d]furan-3-yl)-9-phenyl-9H-carbazol-2-amine instead of N,9-diphenyl-9H-carbazol-3-amine. The produced compound was identified through MS/FAB and $^1$H NMR.

7. Synthesis of Compound 39

Compound 39 was synthesized in substantially the same manner as the synthesis of Compound 1 by utilizing N-(dibenzo[b,d]thiophen-2-yl)-9-phenyl-9H-carbazol-2-amine instead of N,9-diphenyl-9H-carbazol-3-amine. The produced compound was identified through MS/FAB and $^1$H NMR.

8. Synthesis of Compound 41

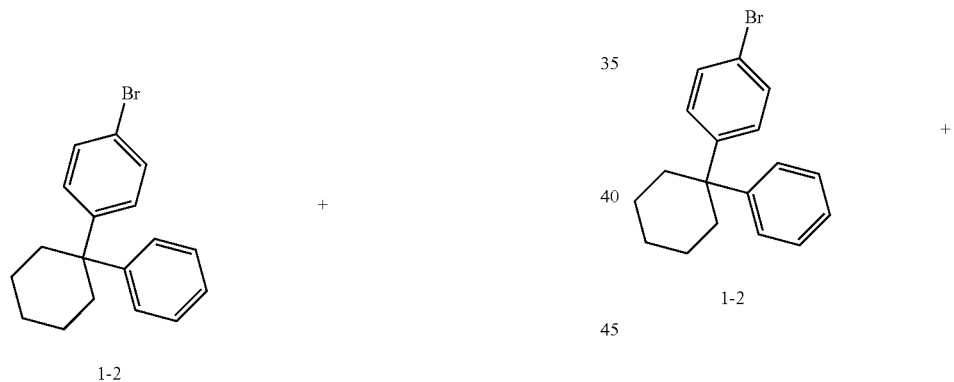

1-2

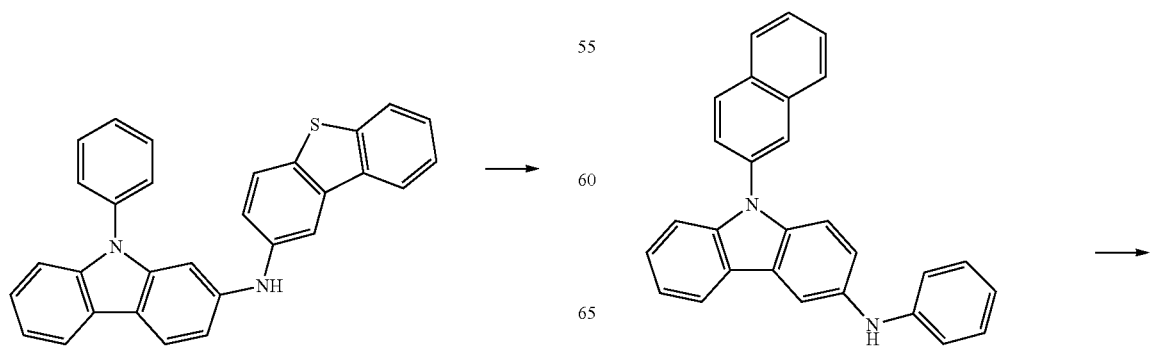

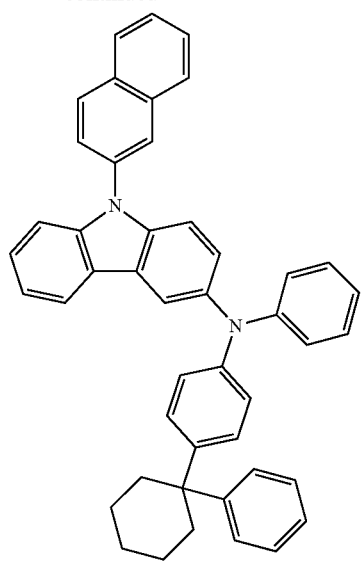

compound 41

Compound 41 was synthesized in substantially the same manner as the synthesis of Compound 1 by utilizing 9-(naphthalen-2-yl)-N-phenyl-9H-carbazol-3-amine instead of N,9-diphenyl-9H-carbazol-3-amine. The produced compound was identified through MS/FAB and $^1$H NMR.

9. Synthesis of Compound 61

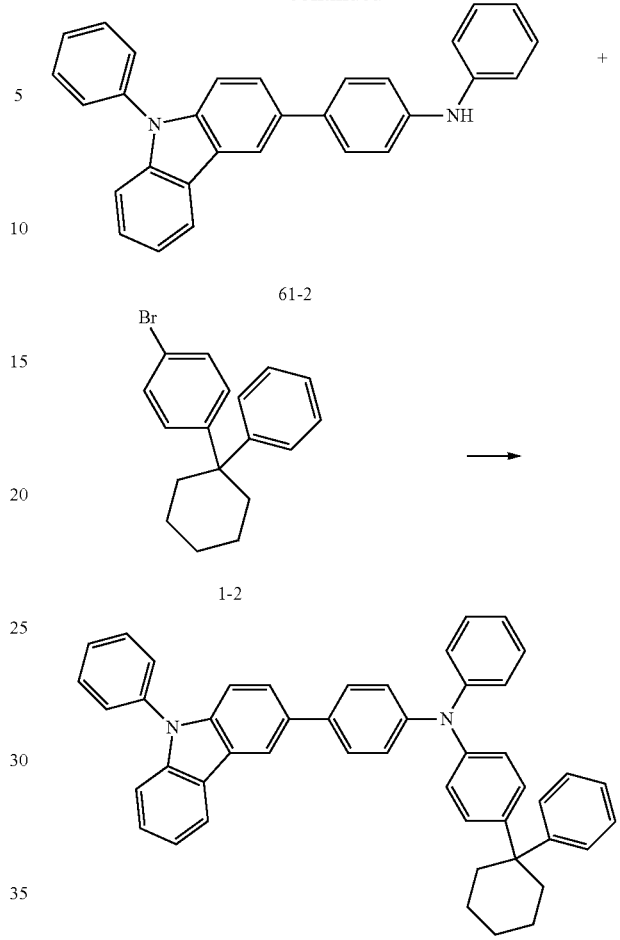

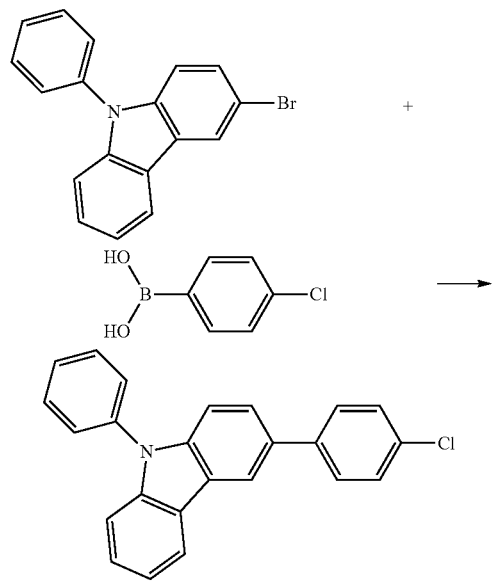

61-1

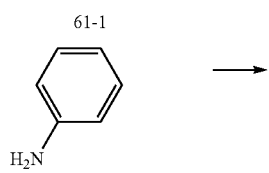

Synthesis of Intermediate 61-1

3-bromo-9-phenyl-9H-carbazole (3.22 g, 10.0 mmol), (4-chlorophenyl)boronic acid (1.56 g, 10.0 mmol), Pd(PPh$_3$)$_4$ (0.58 g, 0.5 mmol), and K$_2$CO$_3$ (4.14 g, 30.0 mmol) were dissolved in a mixed solution (60 mL) of THF/H$_2$O (2/1), and the mixture was stirred at 80° C. for 16 hours. The reaction solution was cooled to room temperature and then extracted three times with water (60 mL) and diethyl ether (60 mL) to obtain an organic layer. The obtained organic layer was dried with magnesium sulfate, and residues obtained by evaporating the solvent were separated and purified by silica gel chromatography to obtain Intermediate 61-2 (2.12 g, yield 60%). The produced compound was identified through LC-MS. C$_{24}$H$_{16}$ClN M$^+$353.1

Synthesis of Intermediate 61-2

Intermediate 61-1 (3.54 g, 10 mmol), aniline (1.40 g, 15 mmol), tris(dibenzylidene acetone)dipalladium(0) (Pd$_2$dba$_3$) (0.46 g, 0.5 mmol), and sodium tert-butoxide (2.88 g, 30 mmol) were dissolved in toluene (60 mL) and then stirred at 100° C. for 3 hours. The reaction solution was cooled to room temperature, 40 mL of water was added thereto, and the mixture was extracted three times with 50 mL of ethyl ether to collect an organic layer. The collected organic layer was dried with magnesium sulfate, and residues obtained by evaporating the solvent were separated and purified by silica gel chromatography to obtain Intermediate 61-2 (3.08 g, yield 75%). The produced compound was identified through LC-MS. $C_{30}H_{22}N_2$ M$^+$410.1

Synthesis of Compound 61

Intermediate 61-2 (4.11 g, 10 mmol), Intermediate 1-2 (3.15 g, 10 mmol), tris(dibenzylidene acetone)dipalladium (0) (Pd$_2$dba$_3$) (0.46 g, 0.5 mmol), and sodium tert-butoxide (2.88 g, 30 mmol) were dissolved in toluene (60 mL) and then stirred at 80° C. for 3 hours. The reaction solution was cooled to room temperature, 40 mL of water was added thereto, and the mixture was extracted three times with 50 mL of ethyl ether to collect an organic layer. The collected organic layer was dried with magnesium sulfate, and residues obtained by evaporating the solvent were separated and purified by silica gel chromatography to obtain Compound 61 (4.52 g, yield 70%). The produced compound was identified through MS/FAB and $^1$H NMR.

10. Synthesis of Compound 81

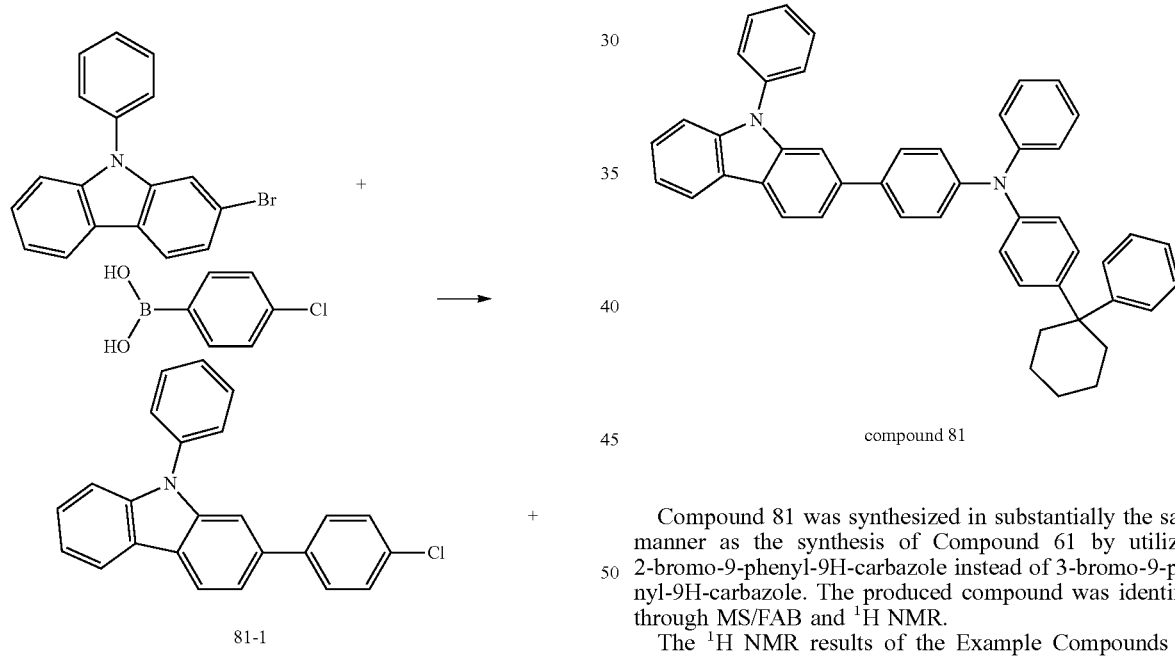

compound 81

Compound 81 was synthesized in substantially the same manner as the synthesis of Compound 61 by utilizing 2-bromo-9-phenyl-9H-carbazole instead of 3-bromo-9-phenyl-9H-carbazole. The produced compound was identified through MS/FAB and $^1$H NMR.

The $^1$H NMR results of the Example Compounds are listed in Table 1:

| Compound | $^1$H NMR(CDCl$_3$, 400 MHz) | MS/FAB found | calc. |
|---|---|---|---|
| Compound 1 | 8.55(d, 1H), 7.94(d, 1H), 7.62-7.50(m, 6H), 7.35-7.00(m, 18H), 2.15-1.98(m, 4H), 1.53-1.43(m, 6H) | 568.25 | 568.29 |
| Compound 2 | 8.55(d, 1H), 8.22(d, 1H), 8.15(d, 1H), 7.94(d, 1H), 7.81(d, 1H), 7.63-7.49 (m, 10H), 7.35-7.13(m, 13H), 2.15-1.98(m, 4H), 1.53-1.43(m, 6H) | 618.25 | 618.30 |
| Compound 3 | 8.55(d, 1H), 7.94(d, 1H), 7.78(d, 1H), 7.71(d, 1H), 7.62-7.14(m, 24H), 2.15-1.98(m, 4H), 1.53-1.43(m, 6H) | 618.25 | 618.30 |
| Compound 21 | 8.55(d, 1H), 8.24(d, 1H), 7.94(d, 1H), 7.62-7.50(m, 5H), 7.35-7.00(m, 18H), 2.15-1.98(m, 4H), 1.53-1.43(m, 6H) | 568.25 | 568.29 |

-continued
| Compound | ¹H NMR(CDCl₃, 400 MHz) | MS/FAB found | MS/FAB calc. |
|---|---|---|---|
| Compound 24 | 8.55(d, 1H), 8.24(d, 1H), 7.94(d, 1H), 7.75(d, 2H), 7.62-7.14(m, 25H), 2.15-1.98(m, 4H), 1.53-1.43(m, 6H) | 644.27 | 644.32 |
| Compound 34 | 8.55(d, 1H), 8.24(d, 1H), 8.03(s, 1H), 7.98-7.94(m, 2H), 7.80(d, 1H), 7.62-7.50(m, 6H), 7.39-7.14(m, 15H)6.91(d, 1H), 2.15-1.98(m, 4H), 1.53-1.43(m, 6H) | 658.25 | 658.30 |
| Compound 39 | 8.55(d, 1H), 8.45(d, 1H), 8.24(d, 1H), 7.95-7.93(m, 3H),7.85(d, 1H), 7.62-7.14(m, 21H), 2.15-1.98(m, 4H), 1.53-1.43(m, 6H) | 674.23 | 674.28 |
| Compound 41 | 8.55(d, 1H), 8.03-8.01(m, 3H), 7.94(d, 1H), 7.83(s, 1H), 7.59-7.54(m, 3H), 7.35-7.00(m, 19H), 2.15-1.98(m, 4H), 1.53-1.43(m, 6H) | 618.25 | 618.30 |
| Compound 61 | 8.55(d, 1H), 7.99-7.89(m, 3H), 7.77(d, 1H), 7.62-7.50(m, 7H), 7.37-7.00(m, 18H), 2.15-1.98(m, 4H), 1.53-1.43(m, 6H) | 644.27 | 644.32 |
| Compound 81 | 8.55(d, 1H), 8.31(d, 1H), 7.94-7.91(m, 2H), 7.74(s, 1H), 7.62-7.50(m, 7H), 7.37-7.00(m, 18H), 2.15-1.98(m, 4H), 1.53-1.43(m, 6H) | 644.27 | 644.32 |
Example Compounds
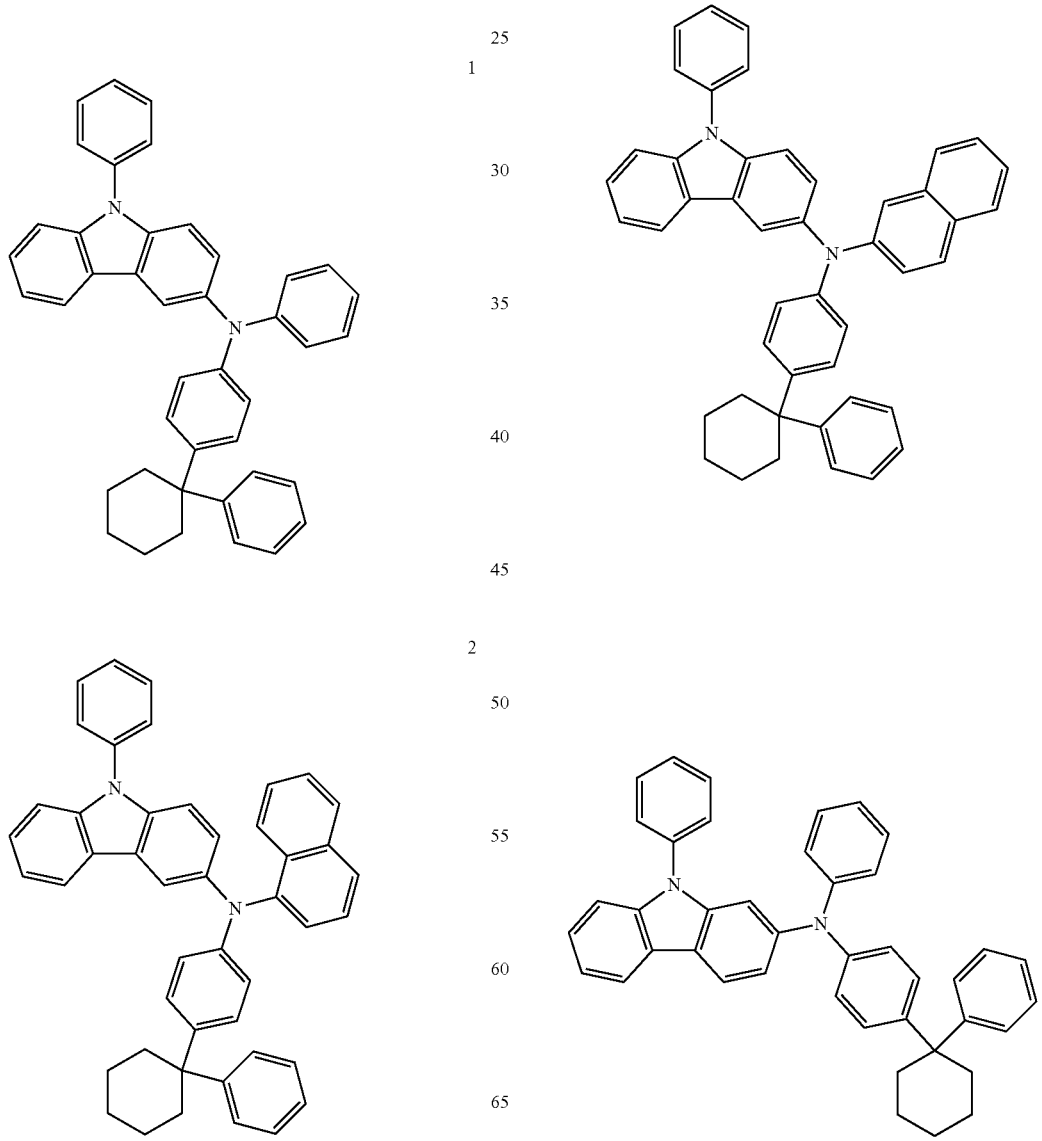

24
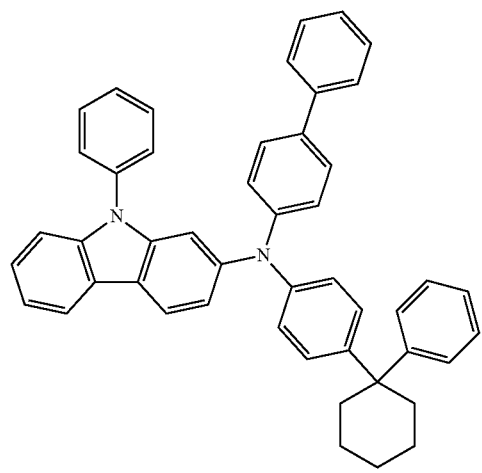
34
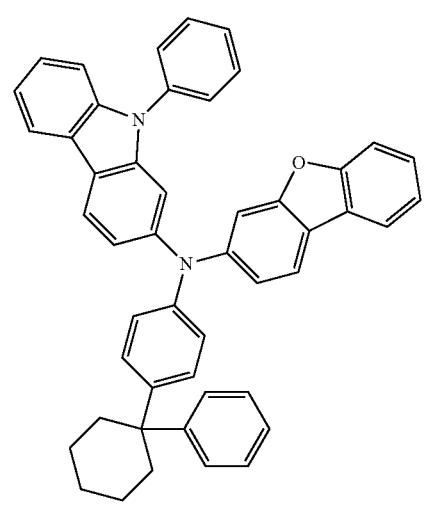
39
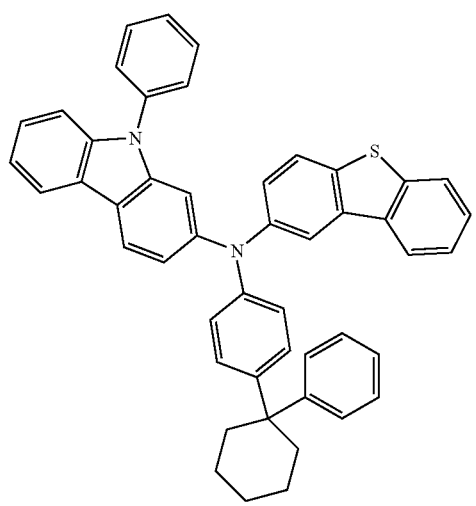
41
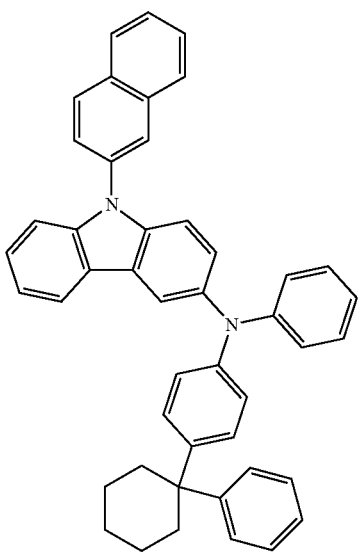
61
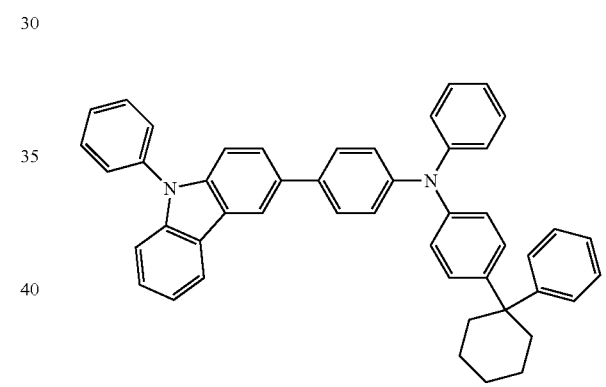
81
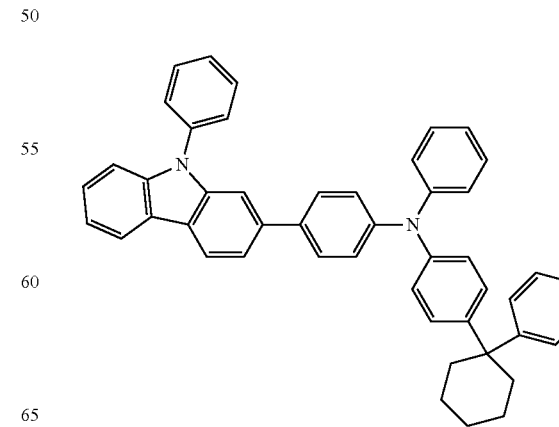

Comparative Example Compounds

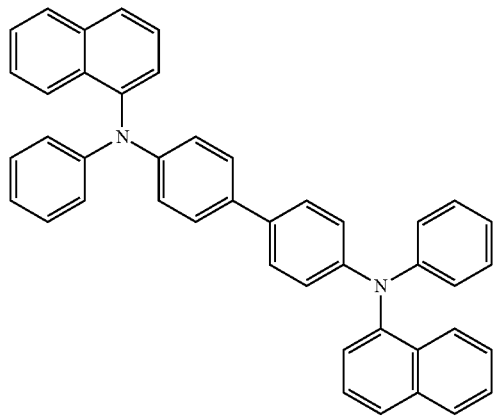

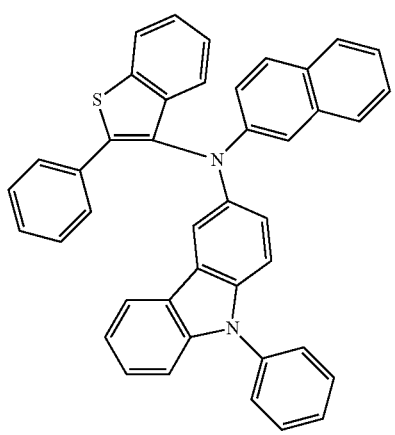

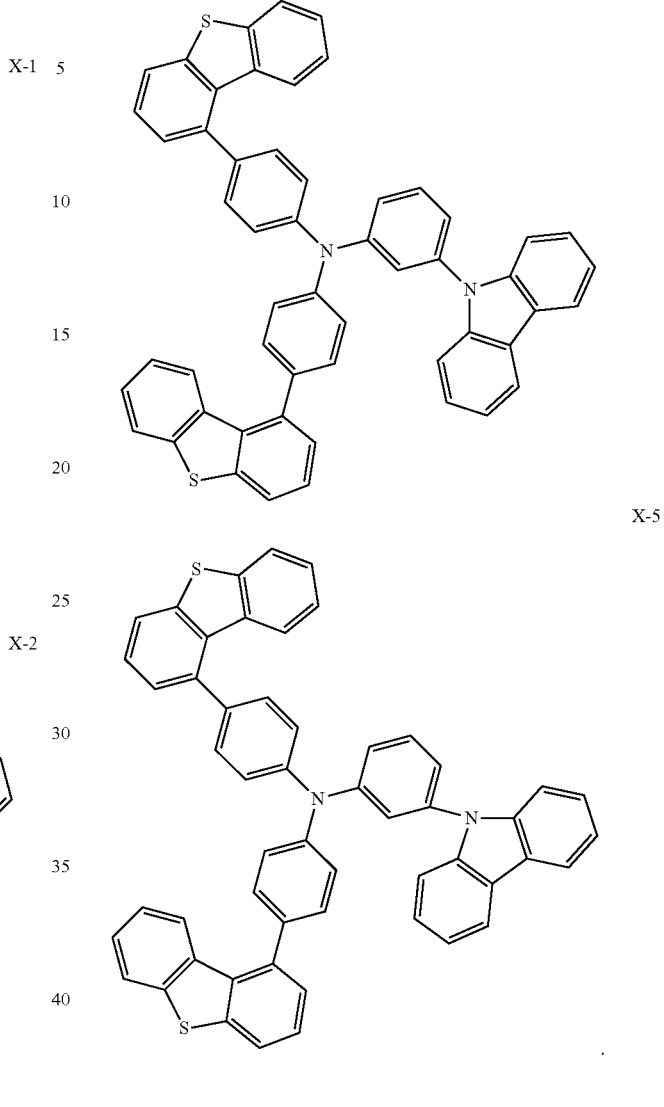

(Manufacture of Organic Electroluminescence Device)

For an anode, an ITO glass substrate of about 15 Ω/cm² (about 1,200 Å) made by Corning Co. was cut to a size of 50 mm×50 mm×0.7 mm, cleansed by ultrasonic waves utilizing isopropyl alcohol and pure water for about 5 minutes, and then irradiated with ultraviolet rays for about 30 minutes and exposed to ozone and cleansed. The glass substrate was installed on a vacuum deposition apparatus.

On the upper portion of the substrate, 2-TNATA was deposited in vacuum to form a 600 Å-thick hole injection layer, and then an Example Compound or Comparative Example Compound was deposited in vacuum to form a 300 Å-thick hole transport layer.

On the upper portion of the hole transport layer, 9,10-di (naphthalen-2-yl)anthracene (hereinafter, DNA) as a blue fluorescent host and DPAVBi as a blue fluorescent dopant were co-deposited at a weight ratio of 98:2 to form a 300 Å-thick emission layer.

Then, Alq3 was deposited on the upper portion of the emission layer to form a 300 Å-thick electron transport layer; LiF which is an alkaline metal halide was deposited on the upper portion of the electron transport layer to form a 10 Å-thick electron injection layer; and Al was deposited in vacuum to form a 3,000 Å-thick LiF/Al electrode (negative electrode), thereby manufacturing an organic electroluminescence device.
(Evaluation of Organic Electroluminescence Device Characteristics)

or less than 10.0, such as, for example, 2.4 to 7.6. Any maximum numerical limitation recited herein is intended to include all lower numerical limitations subsumed therein and any minimum numerical limitation recited in this specification is intended to include all higher numerical limita-

TABLE 2

|  | Hole transport material | Driving voltage (V) | Current density (mA/cm$^2$) | Brightness (cd/m$^2$) | Efficiency (cd/A) | luminous color | Half service life (hr@100 mA/cm$^2$) |
|---|---|---|---|---|---|---|---|
| Comparative Example 1 | X-1 | 7.01 | 50 | 2645 | 5.29 | Blue | 258 |
| Comparative Example 2 | X-2 | 5.52 | 50 | 2780 | 5.56 | Blue | 352 |
| Comparative Example 3 | X-3 | 5.62 | 50 | 2815 | 5.63 | Blue | 366 |
| Comparative Example 4 | X-4 | 5.83 | 50 | 2760 | 5.52 | Blue | 400 |
| Comparative Example 5 | X-5 | 5.95 | 50 | 2625 | 5.25 | Blue | 390 |
| Example 1 | Compound 1 | 5.23 | 50 | 3225 | 6.45 | Blue | 480 |
| Example 2 | Compound 2 | 5.36 | 50 | 3060 | 6.12 | Blue | 510 |
| Example 3 | Compound 3 | 4.96 | 50 | 3260 | 6.52 | Blue | 550 |
| Example 4 | Compound 21 | 5.22 | 50 | 3065 | 6.13 | Blue | 605 |
| Example 5 | Compound 24 | 4.88 | 50 | 3145 | 6.29 | Blue | 470 |
| Example 6 | Compound 34 | 4.69 | 50 | 3065 | 6.13 | Blue | 510 |
| Example 7 | Compound 39 | 5.15 | 50 | 3075 | 6.15 | Blue | 412 |
| Example 8 | Compound 41 | 4.99 | 50 | 3160 | 6.32 | Blue | 400 |
| Example 9 | Compound 61 | 5.10 | 50 | 3080 | 6.16 | Blue | 405 |
| Example 10 | Compound 81 | 4.91 | 50 | 3000 | 6.00 | Blue | 550 |

Referring to the results of Table 2, it may be confirmed that when the amine compound according to an example is included in the hole transport region, the organic electroluminescence device has low driving voltage, and improved brightness, efficiency, and service life compared to the devices of the Comparative Examples.

The organic electroluminescence device of an example may achieve high luminous efficiency and a long service life by utilizing the amine compound represented by Formula 1 as a hole transporting material.

The amine compound of an example may facilitate high luminous efficiency and a long service life of the organic electroluminescence device.

The organic electroluminescence device according to an embodiment of the present disclosure may achieve high efficiency and a long service life.

The amine compound according to an embodiment of the present disclosure may improve a service life and efficiency of the organic electroluminescence device.

Although the present disclosure has been described with reference to example embodiments of the present disclosure, it will be understood that the present disclosure should not be limited to these example embodiments, and that various changes and modifications can be made by those skilled in the art without departing from the spirit and scope of the present disclosure.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to tions subsumed therein. Accordingly, Applicant reserves the right to amend this specification, including the claims, to expressly recite any sub-range subsumed within the ranges expressly recited herein.

Accordingly, the technical scope of the present disclosure is not intended to be limited to the contents set forth in the detailed description of the specification, but is intended to be defined by the appended claims and equivalents thereof.

What is claimed is:
1. An organic electroluminescence device comprising:
a first electrode;
a hole transport region on the first electrode;
an emission layer on the hole transport region; and
an electron transport region on the emission layer,
wherein the hole transport region comprises an amine compound represented by Formula 1:

[Formula 1]

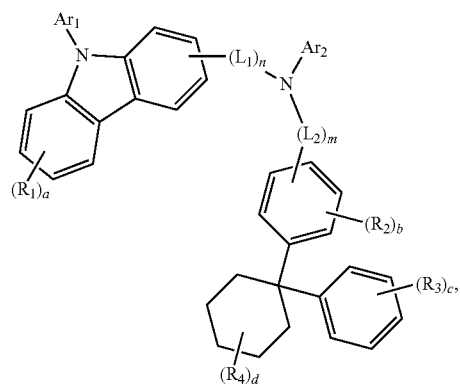

and
wherein, in Formula 1,

L₁ and L₂ are each independently a direct linkage, a substituted or unsubstituted arylene group having 6 to 30 ring-forming carbon atoms, or a substituted or unsubstituted heteroarylene group having 2 to 30 ring-forming carbon atoms, m and n are each independently an integer of 0 to 2, Ar₁ and Ar₂ are each independently a substituted or unsubstituted aryl group having 6 to 30 ring-forming carbon atoms, or a substituted or unsubstituted heteroaryl group having 2 to 30 ring-forming carbon atoms, R₁ to R₄ are each independently a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a and b are each independently an integer of 0 to 4, and c and d are each independently an integer of 0 to 5.

2. The organic electroluminescence device of claim 1, wherein the hole transport region comprises:

a hole injection layer on the first electrode; and a hole transport layer on the hole injection layer, and wherein the hole injection layer or the hole transport layer comprises the amine compound.

3. The organic electroluminescence device of claim 1, wherein the amine compound represented by Formula 1 is represented by Formula 2:

[Formula 2]

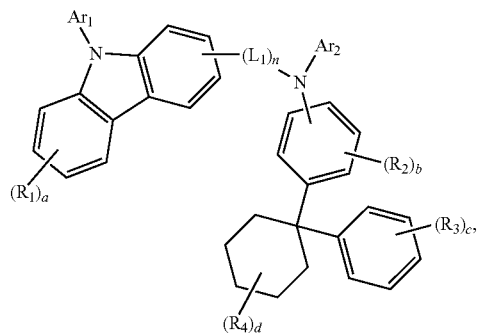

and wherein, in Formula 2,

Ar₁, Ar₂, L₁, R₁ to R₄, n, and a to d are each independently the same as defined in Formula 1.

4. The organic electroluminescence device of claim 3, wherein the amine compound represented by Formula 2 is represented by Formula 3:

[Formula 3]

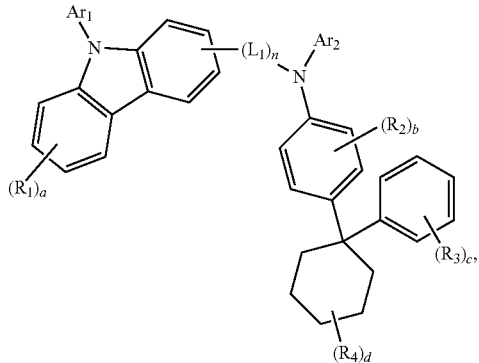

and wherein, in Formula 3,

Ar₁, Ar₂, L₁, R₁ to R₄, n, and a to d are each independently the same as defined in Formula 2.

5. The organic electroluminescence device of claim 4, wherein the amine compound represented by Formula 3 is represented by Formula 4-1 or Formula 4-2:

[Formula 4-1]

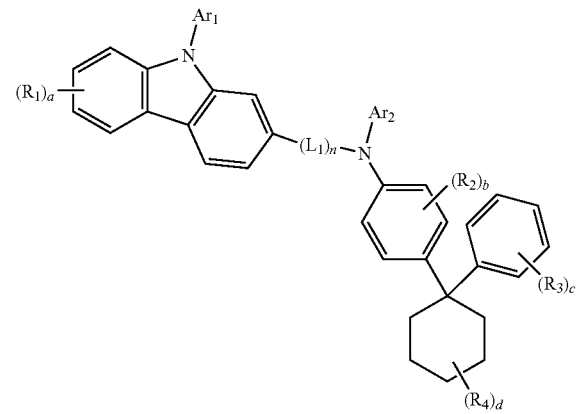

[Formula 4-2]

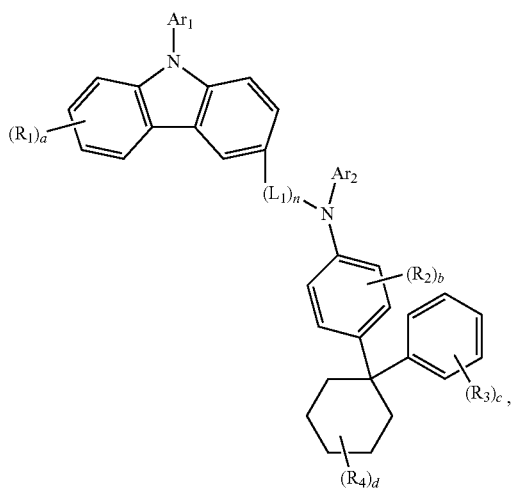

and wherein, in Formula 4-1 and Formula 4-2, $Ar_1, Ar_2, L_1, R_1$ to $R_4$, n, and a to d are each independently the same as defined in Formula 3.

6. The organic electroluminescence device of claim 4, wherein the amine compound represented by Formula 3 is represented by Formula 4-3 or Formula 4-4:

[Formula 4-3]

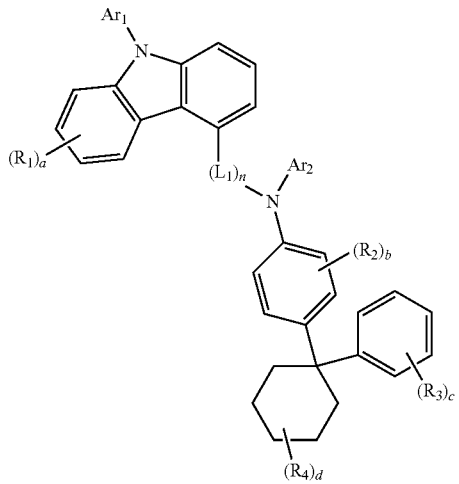

[Formula 4-4]

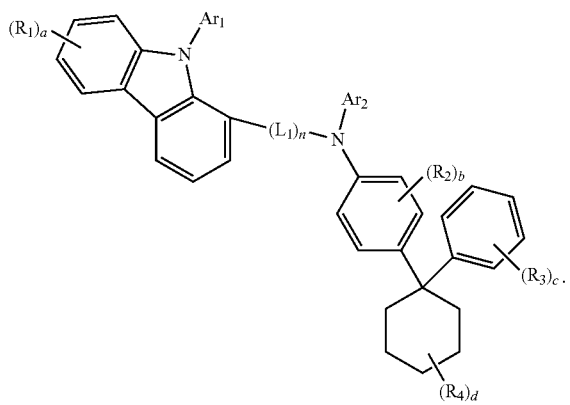

and wherein, in Formula 4-3 and Formula 4-4, $Ar_1, Ar_2, L_1, R_1$ to $R_4$, n, and a to d are each independently the same as defined in Formula 3.

7. The organic electroluminescence device of claim 1, wherein $L_1$ is a direct linkage, a substituted or unsubstituted phenylene, or a substituted or unsubstituted naphthylene.

8. The organic electroluminescence device of claim 1, wherein $L_1$ is represented by Formula 5:

[Formula 5]

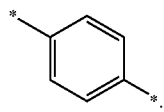

9. The organic electroluminescence device of claim 1, wherein $Ar_2$ is a substituted or unsubstituted aryl group having 6 to 16 ring-forming carbon atoms.

10. The organic electroluminescence device of claim 9, wherein $Ar_2$ is a substituted or unsubstituted phenyl group, a substituted or unsubstituted naphthyl group, a substituted or unsubstituted biphenyl group, or a substituted or unsubstituted phenanthrenyl group.

11. The organic electroluminescence device of claim 1, wherein $Ar_2$ is a substituted or unsubstituted dibenzofuranyl group or a substituted or unsubstituted dibenzothiophenyl group.

12. The organic electroluminescence device of claim 1, wherein $Ar_1$ is represented by Formula 6:

[Formula 6]

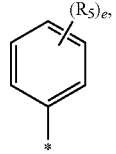

and wherein, in Formula 6, $R_5$ is a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and e is an integer of 0 to 5.

13. The organic electroluminescence device of claim 1, wherein the amine compound represented by Formula 1 is any one selected from the compounds represented by Compound Group 1:

[Compound Group 1]

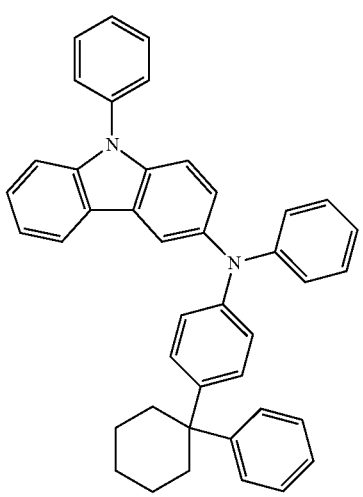

-continued

93
-continued
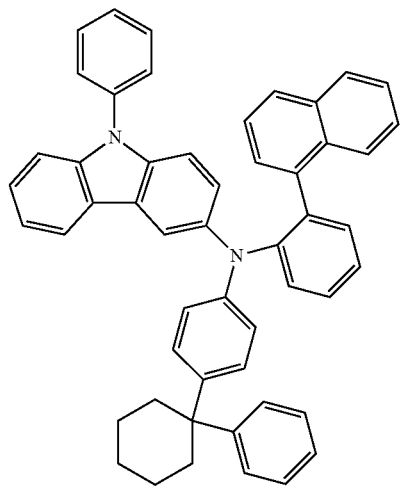
8
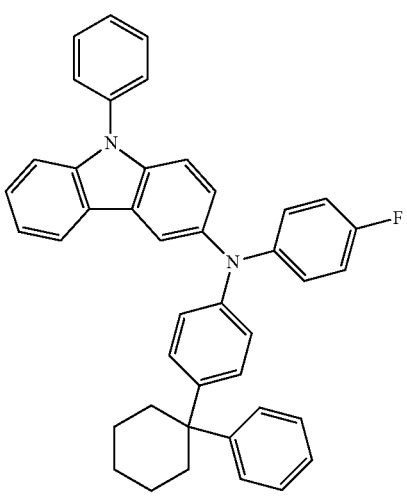
9
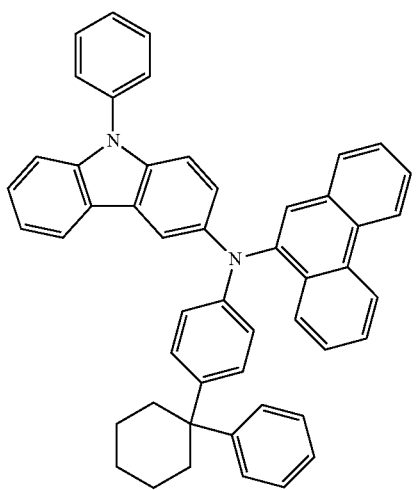
10
94
-continued
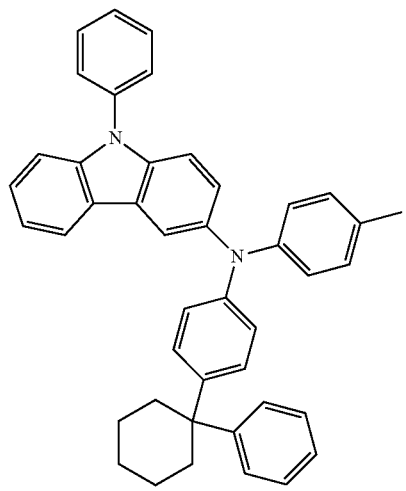
11
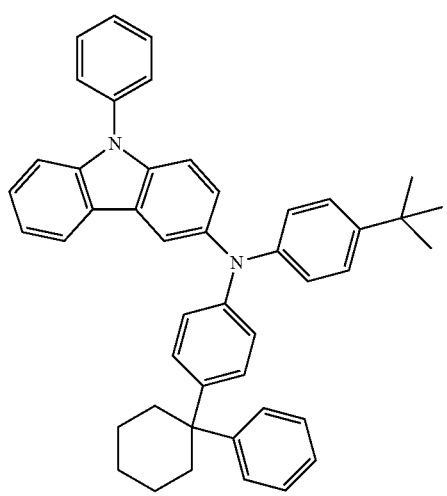
12
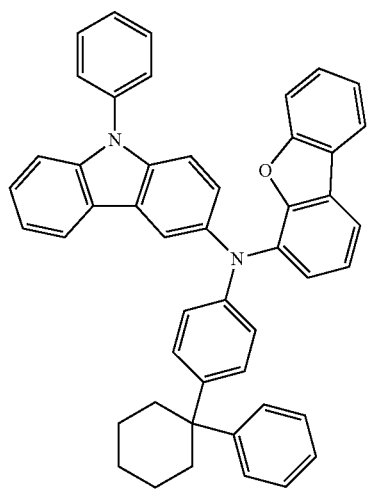
13

14
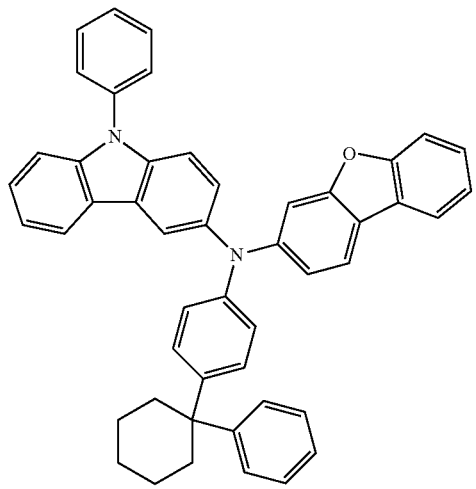
15
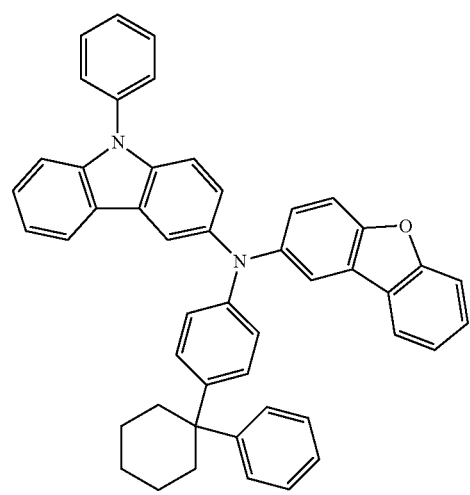
16
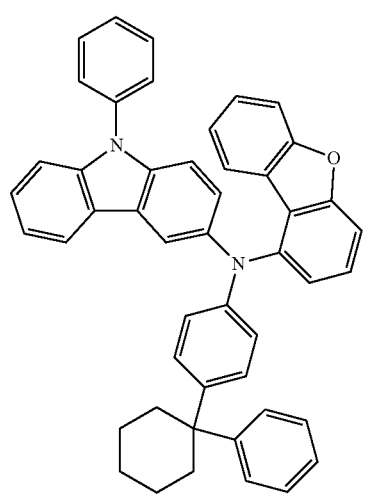
17
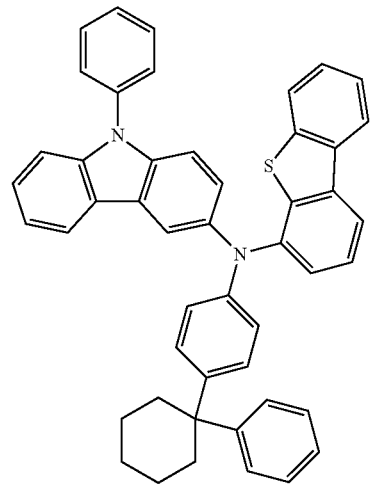
18
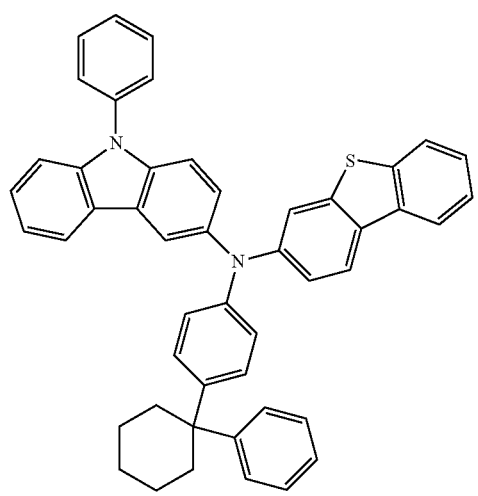
19
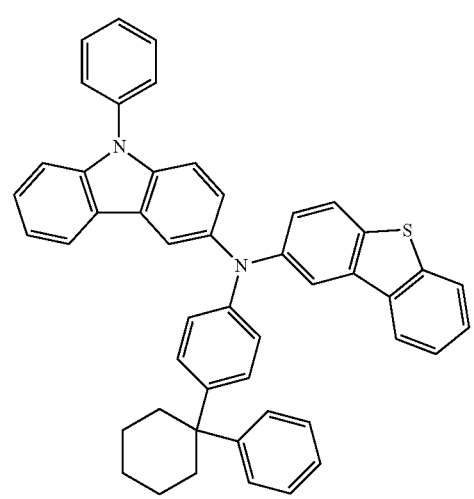

20
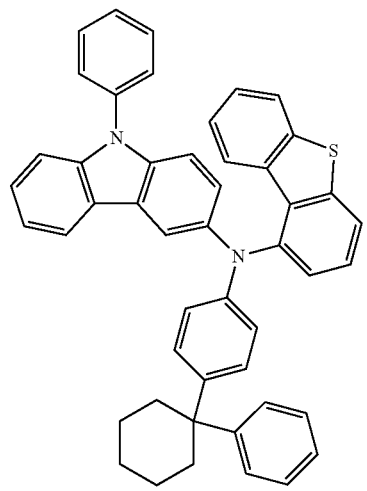
23
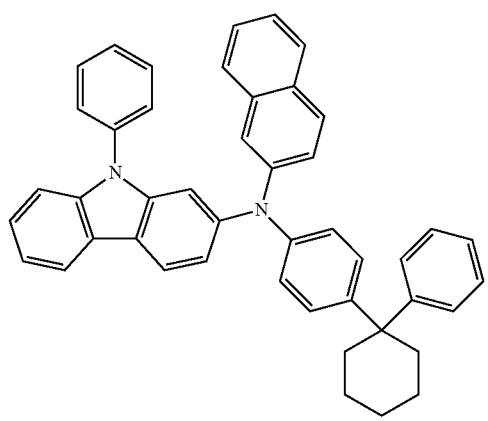
21
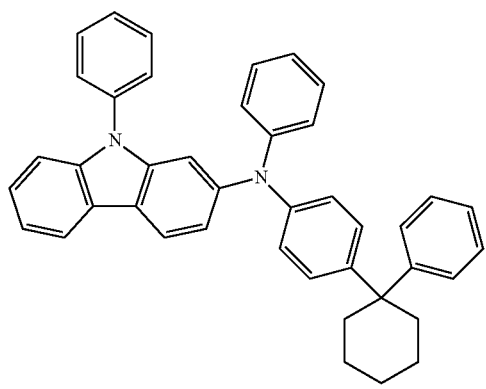
24
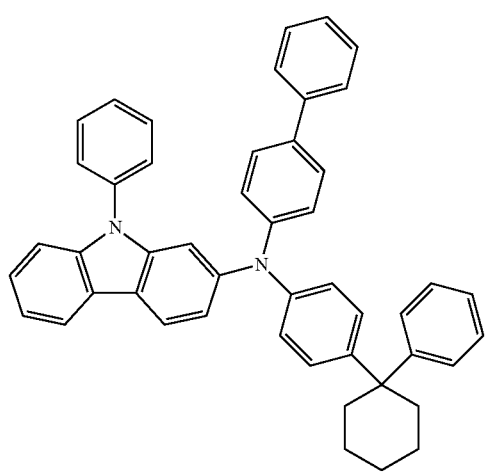
22
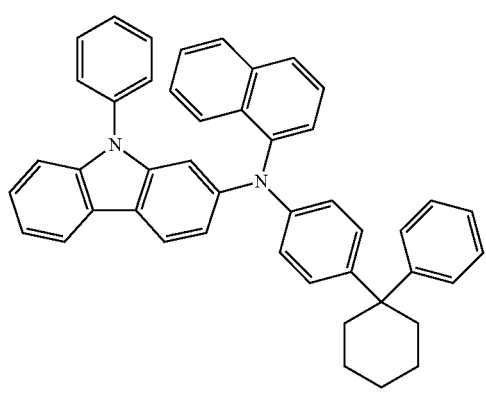
25
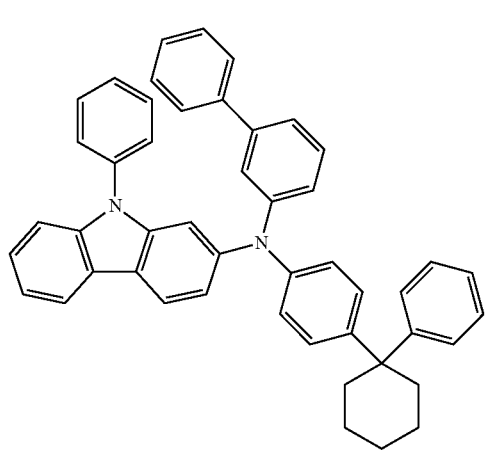

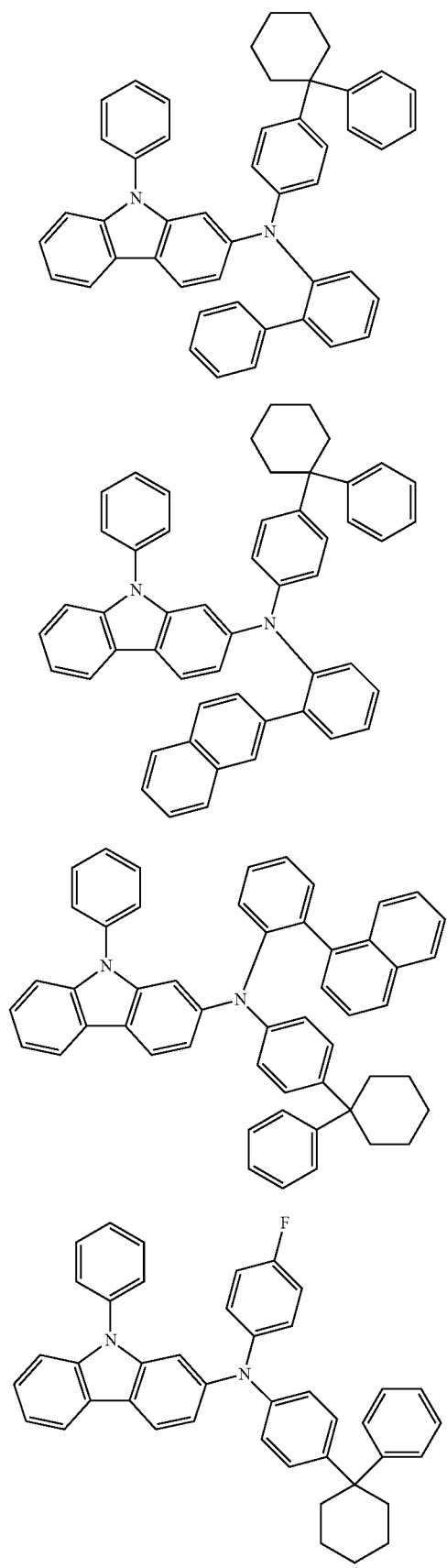
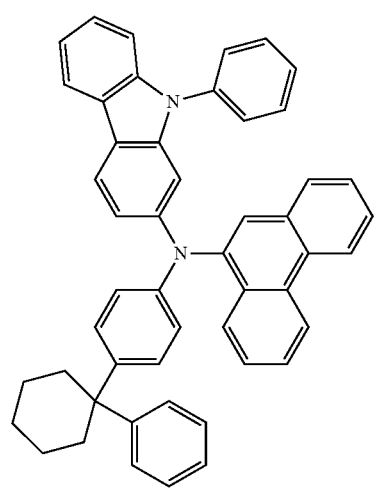
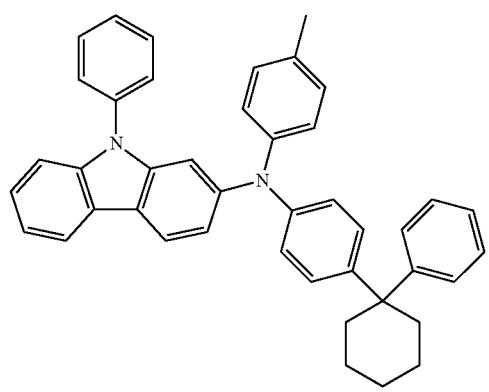
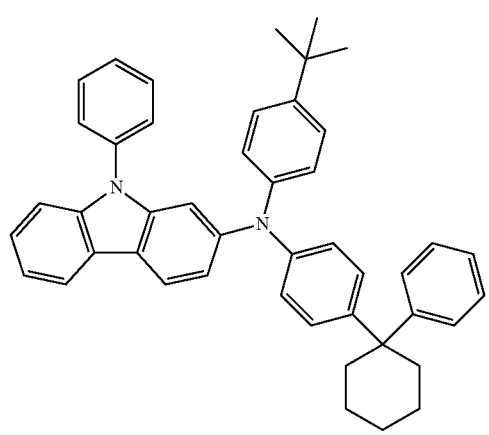

33
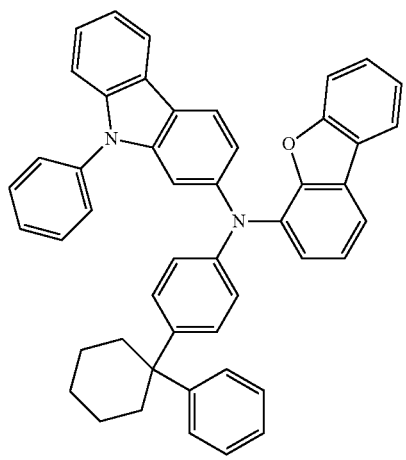
34
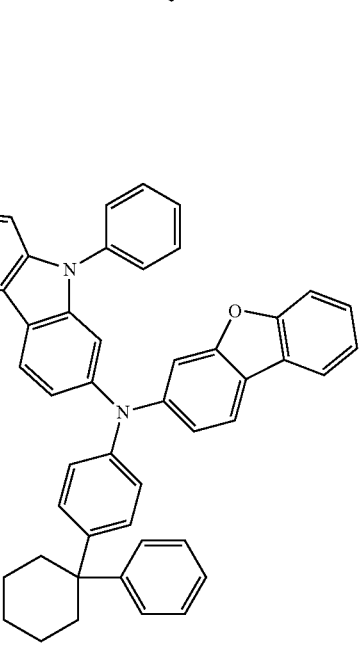
35
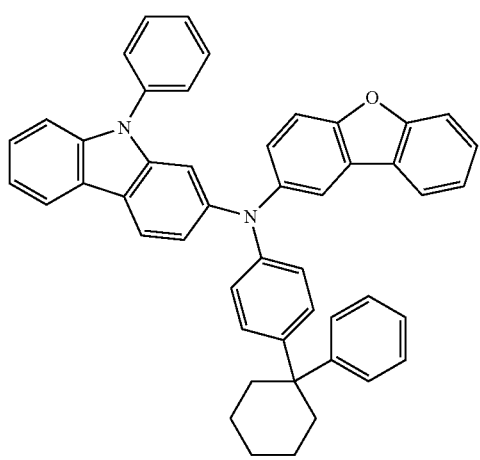
36
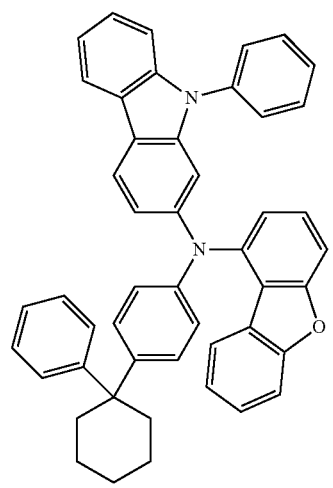
37
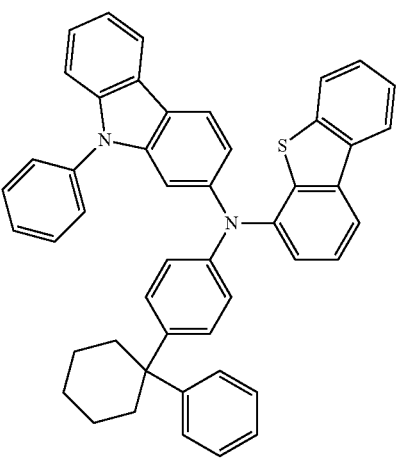
38
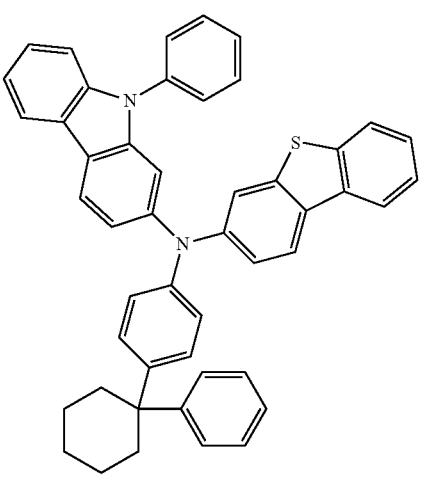

39
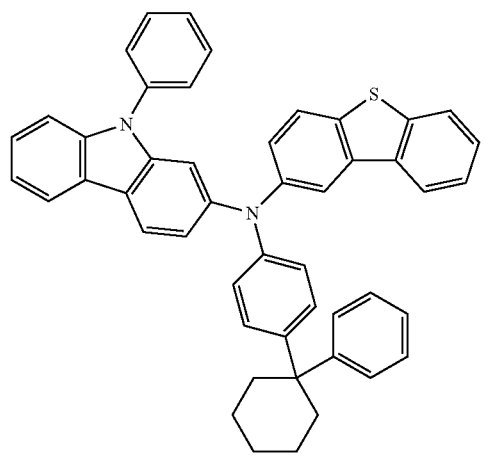
40
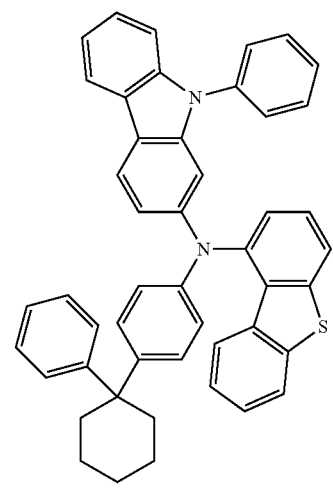
41
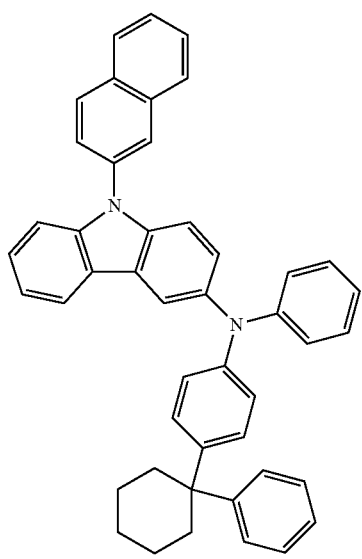
42
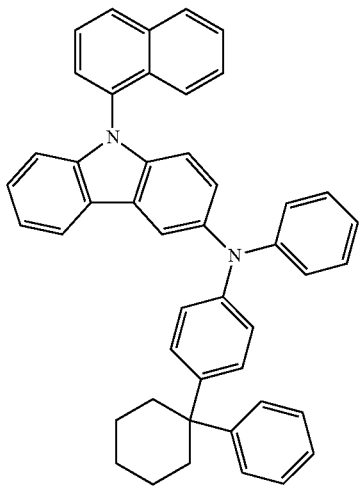
43
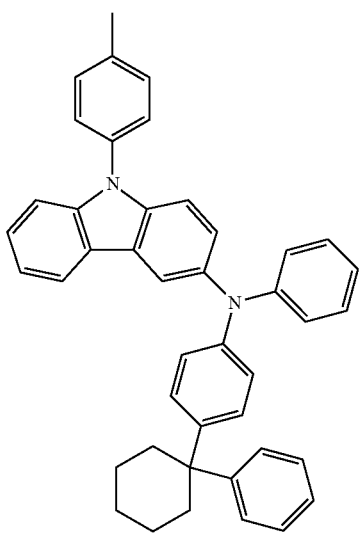
44
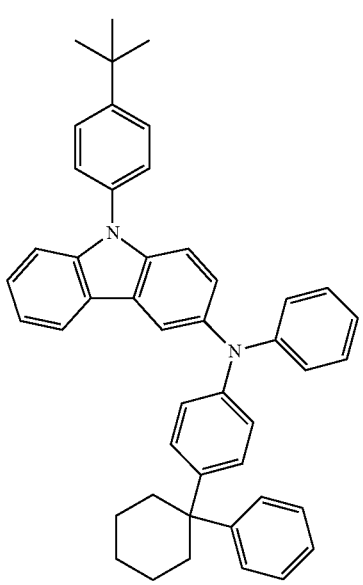

45
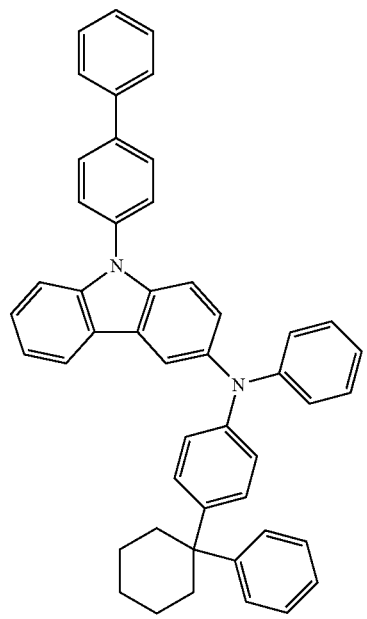
46
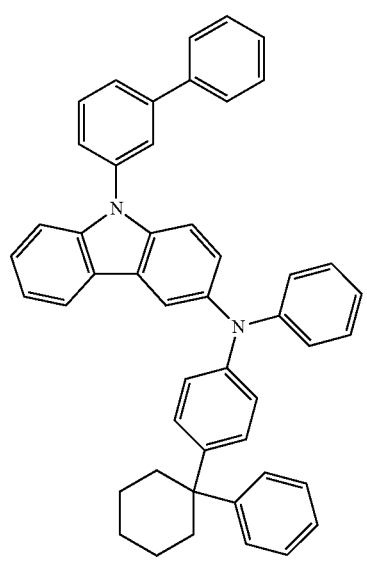
47
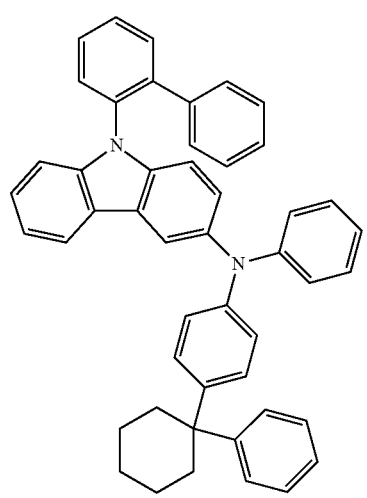
48
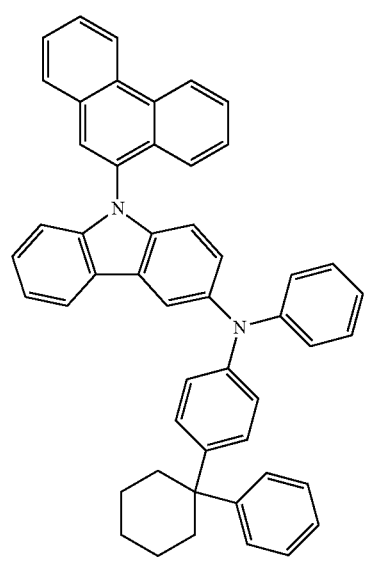
49
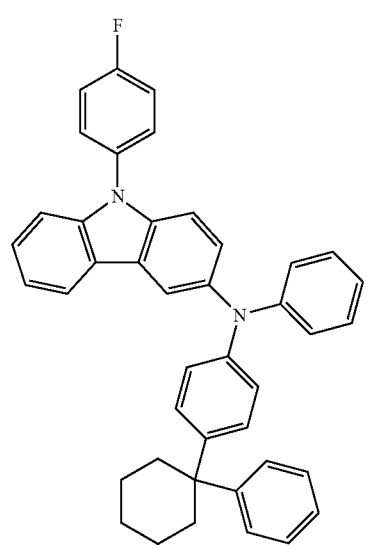
50
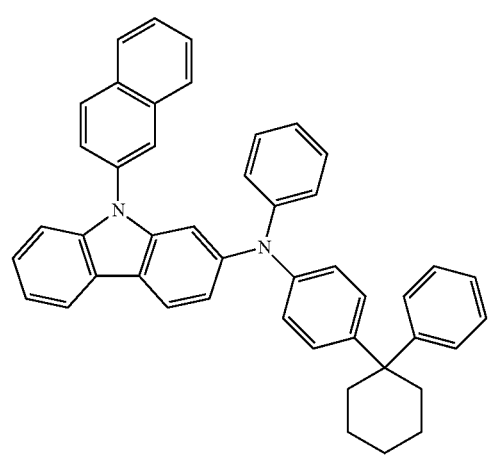

51
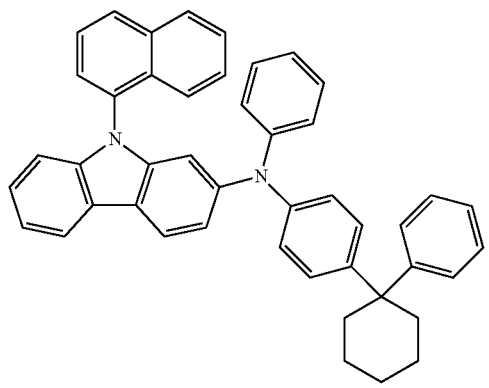
52
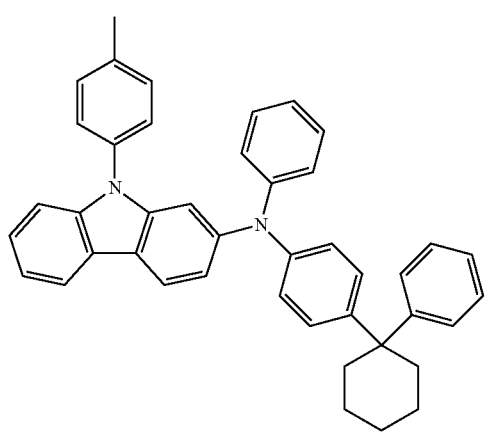
53
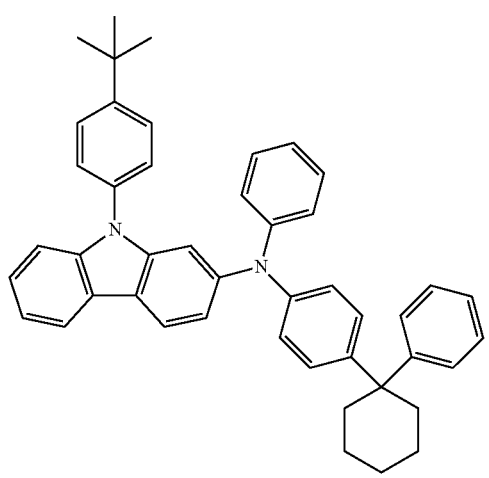
54
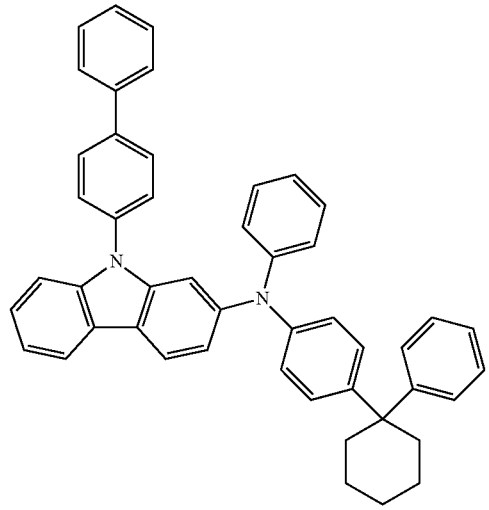
55
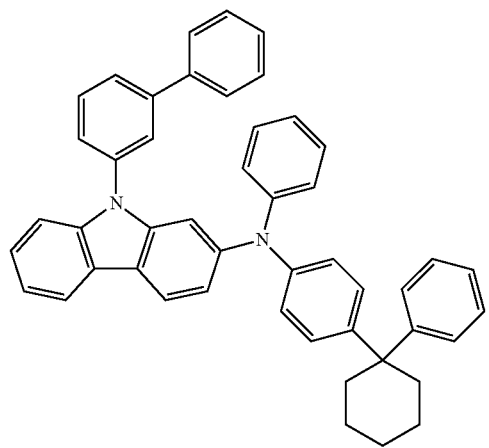
56
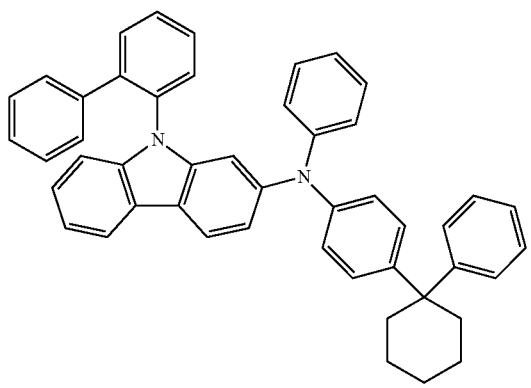

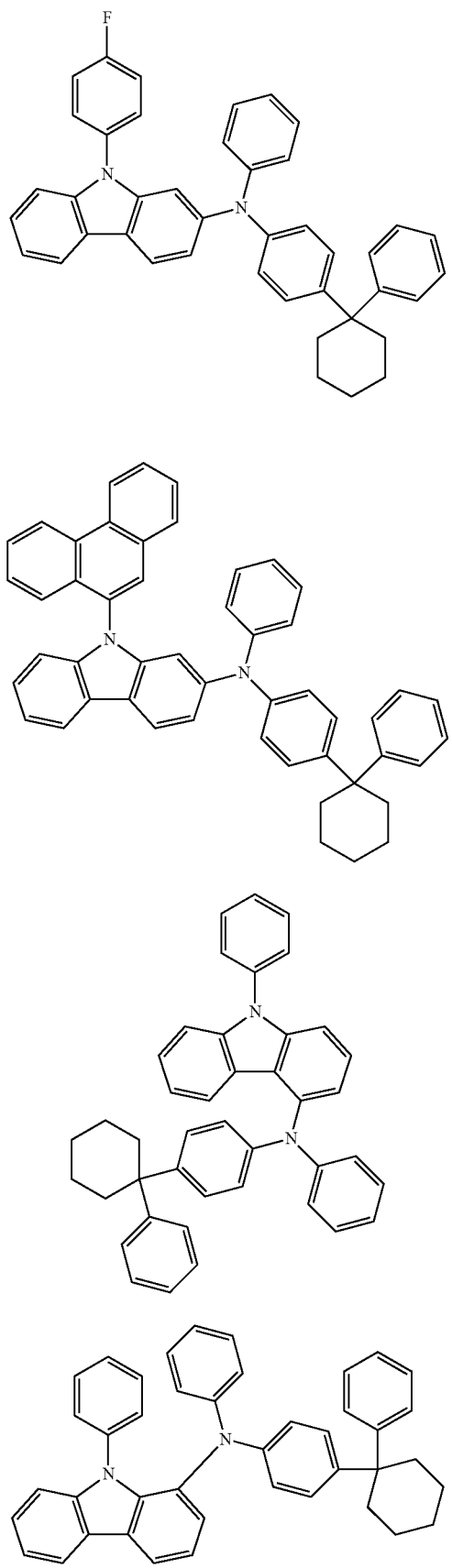
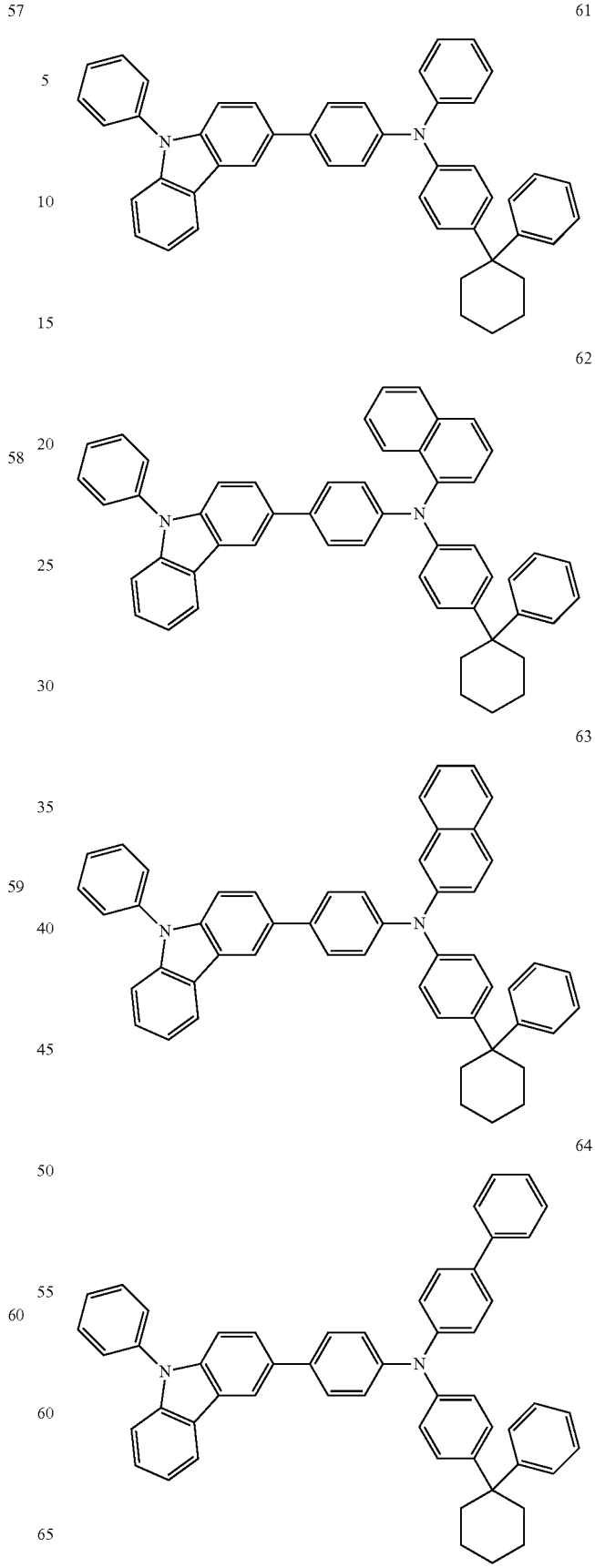

65
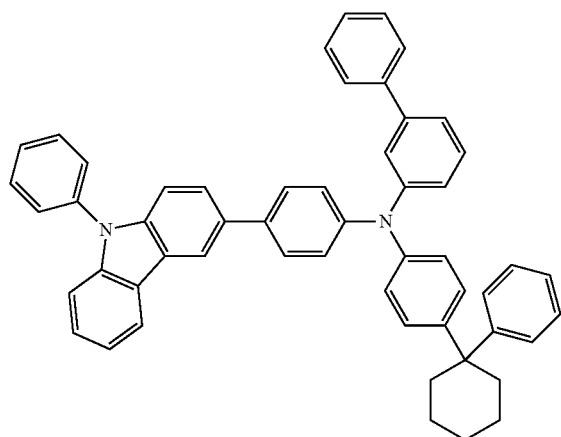
66
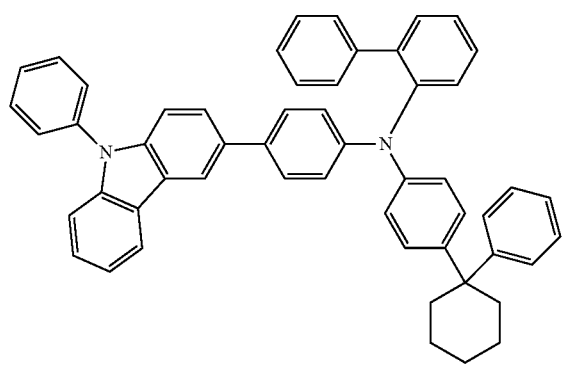
67
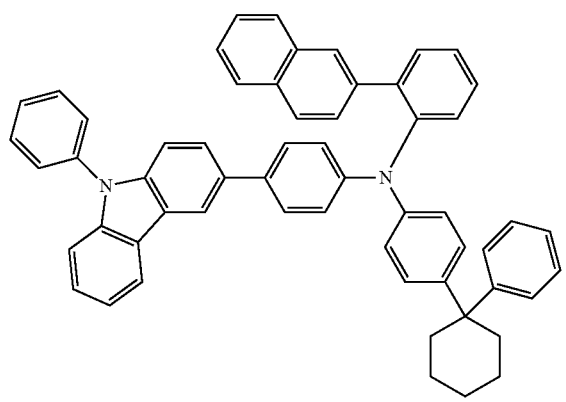
68
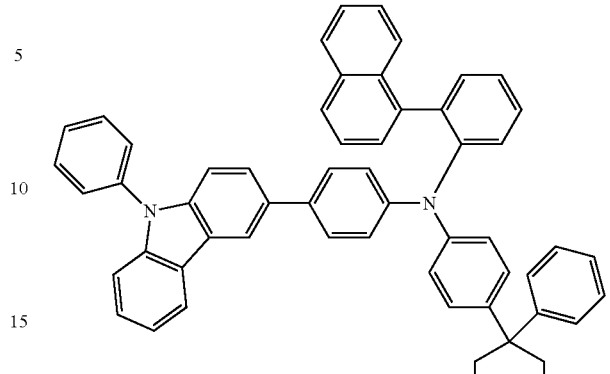
69
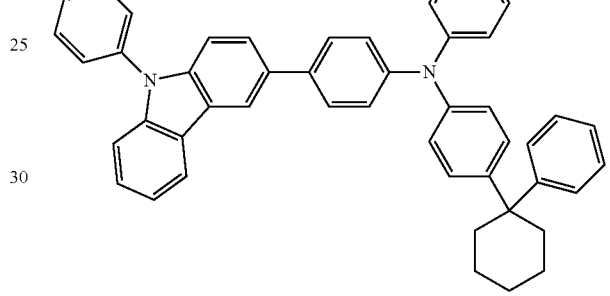
70
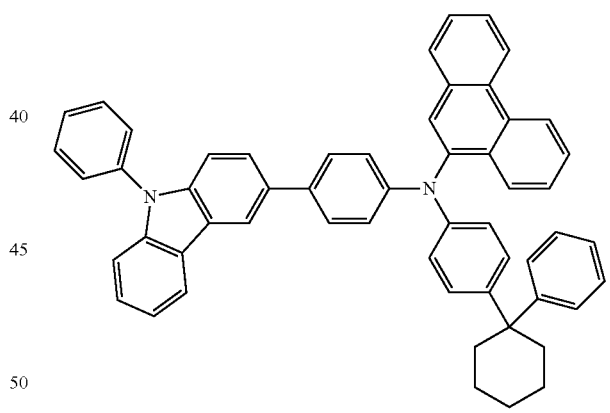
71
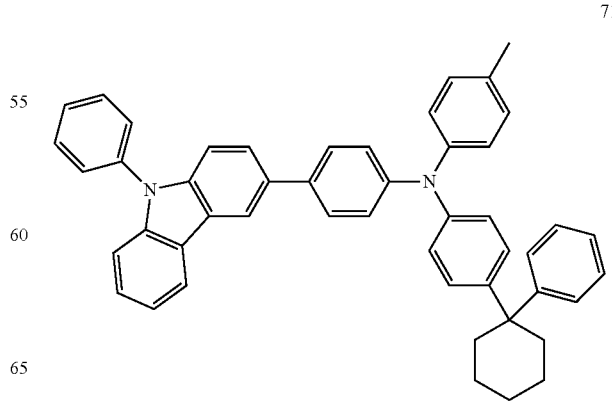

72
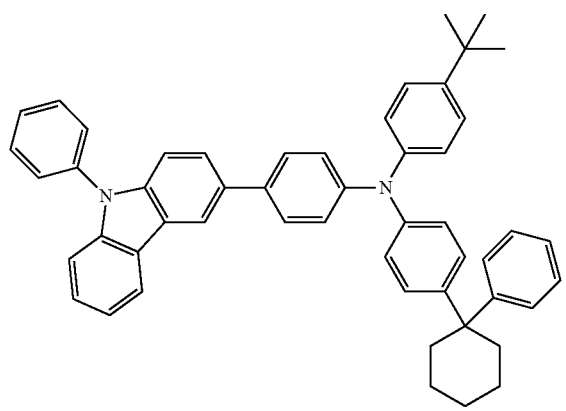
73
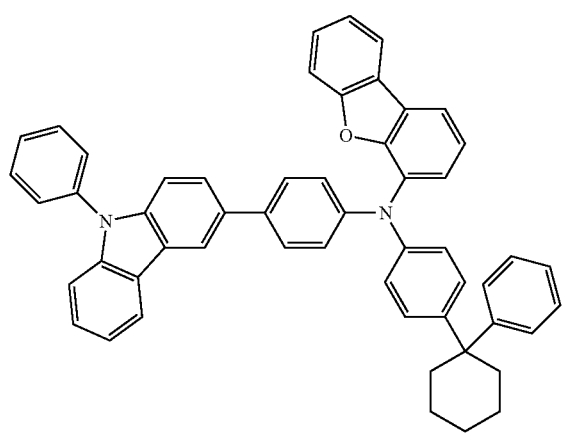
74
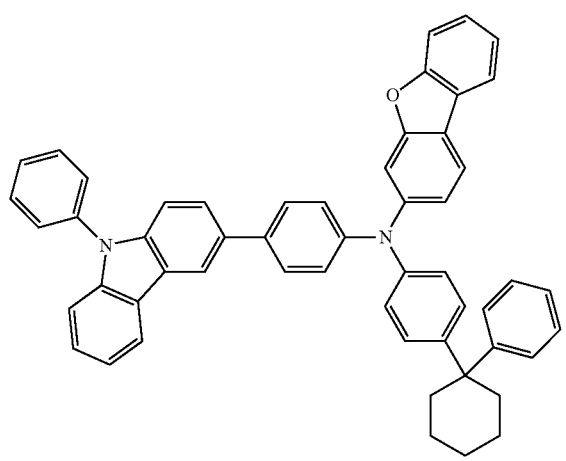
75
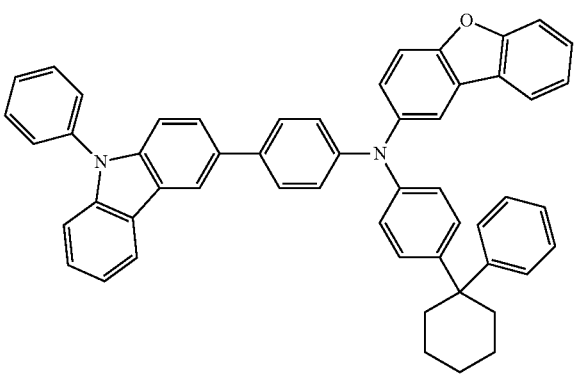
76
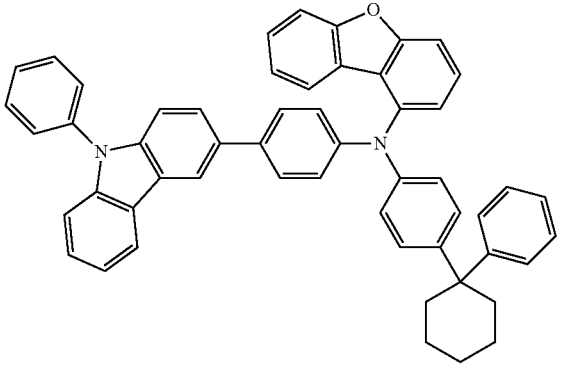
77
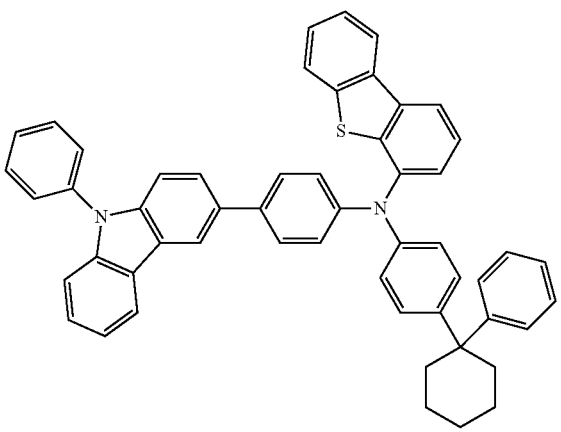

78
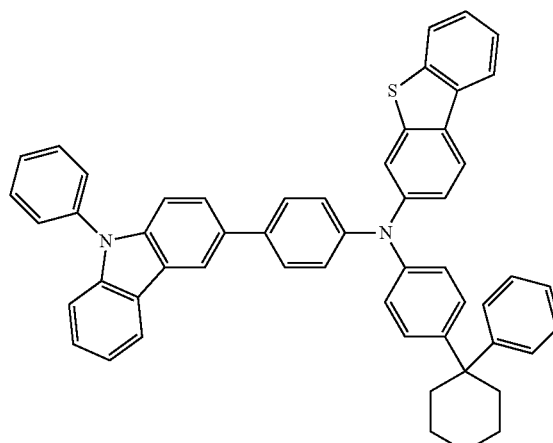
79
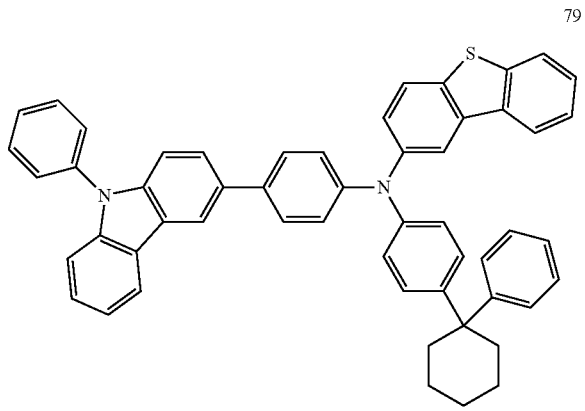
80
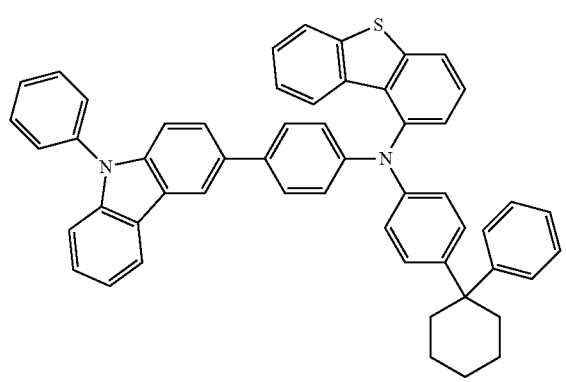
81
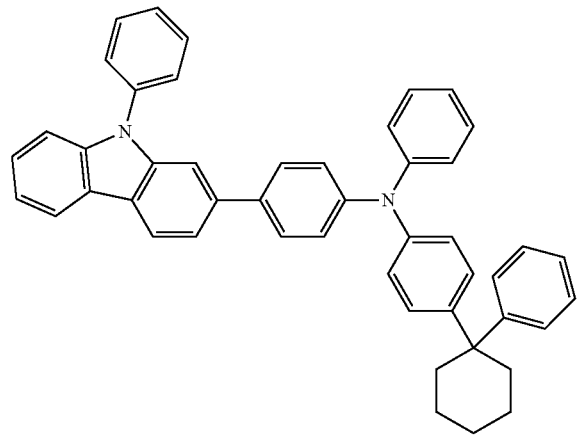
82
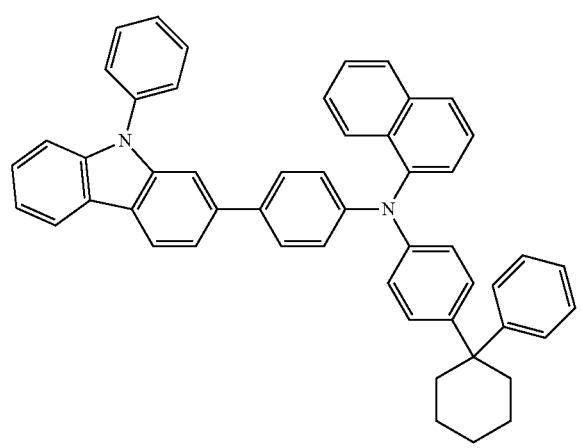
83
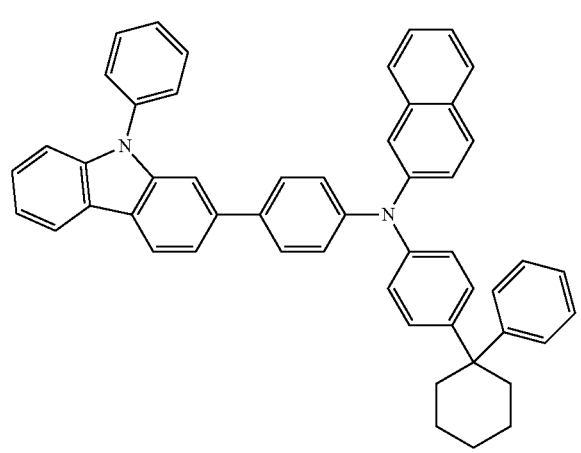

84
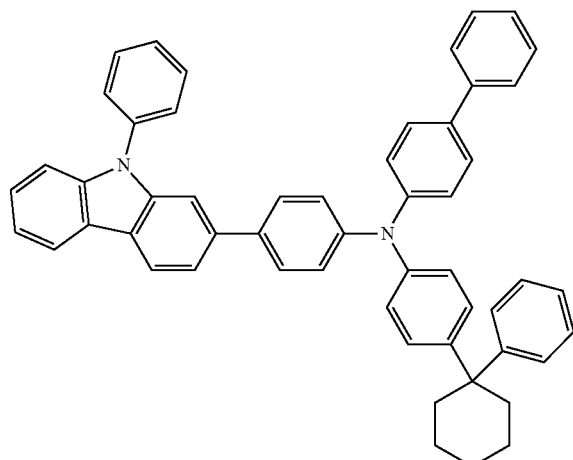
87
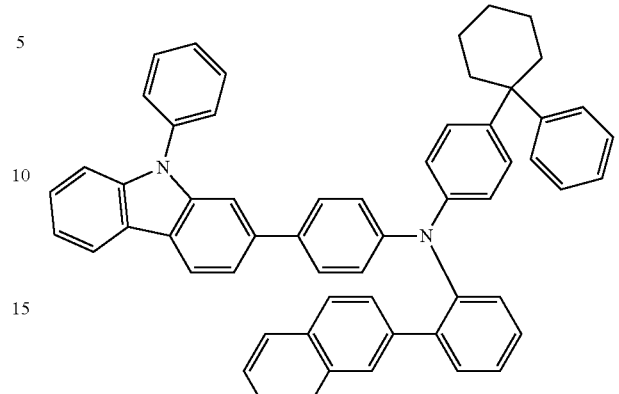
85
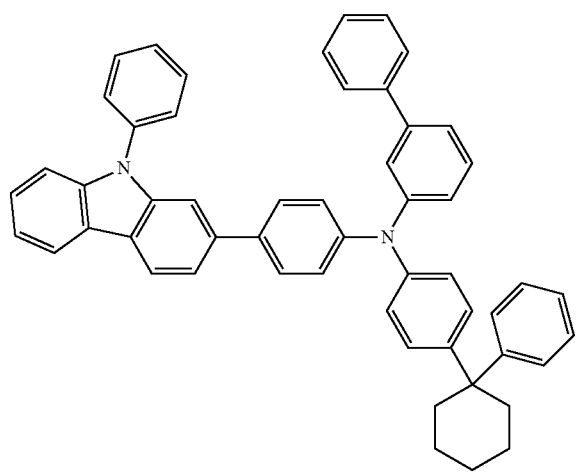
88
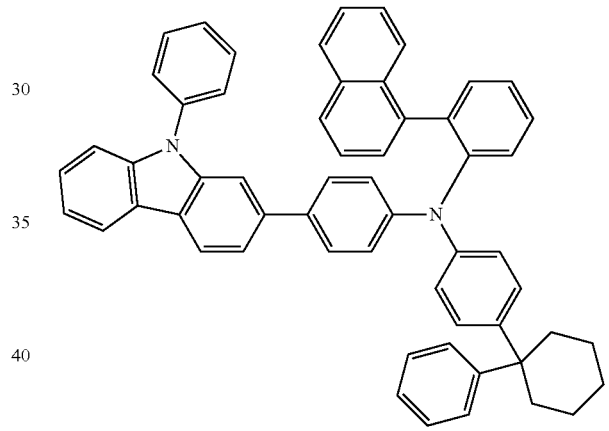
86
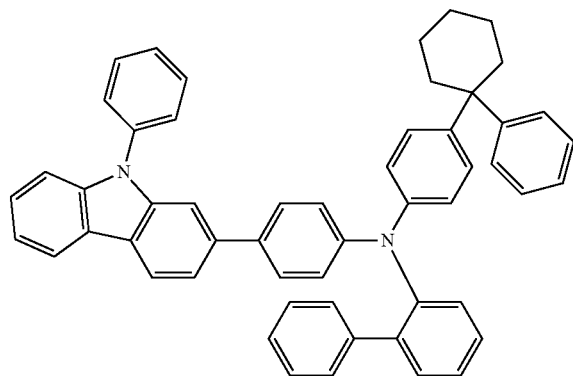
89
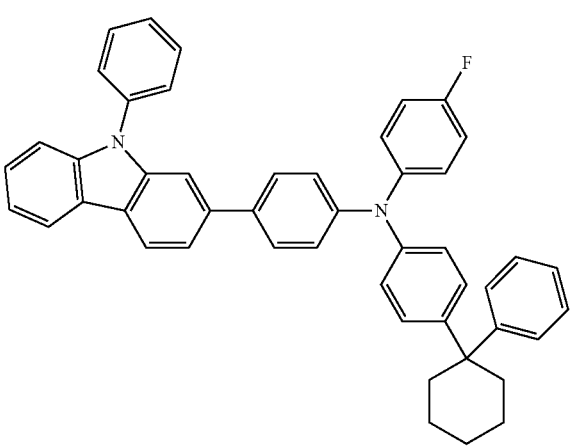

119
-continued
90
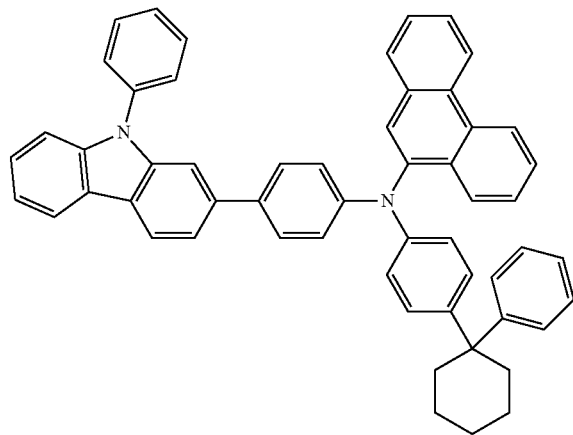
91
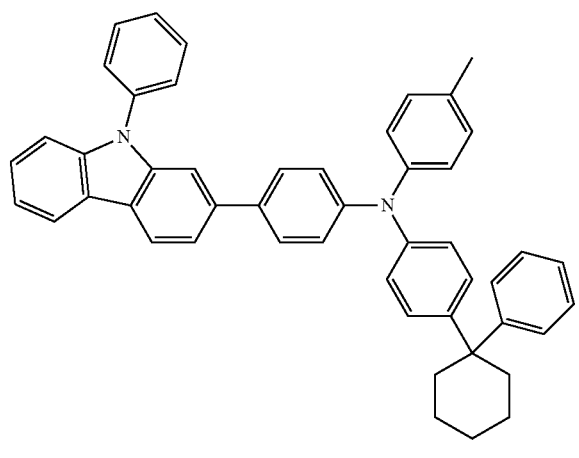
92
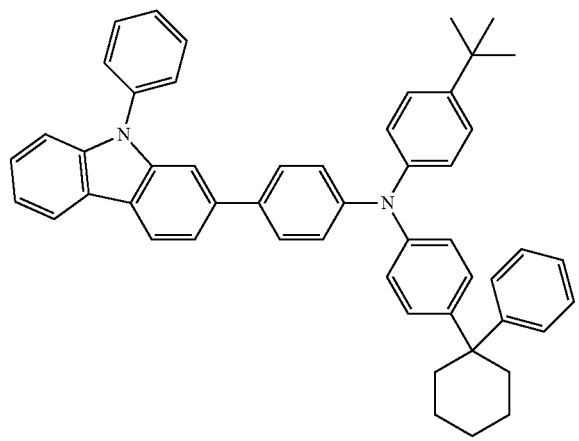
120
-continued
93
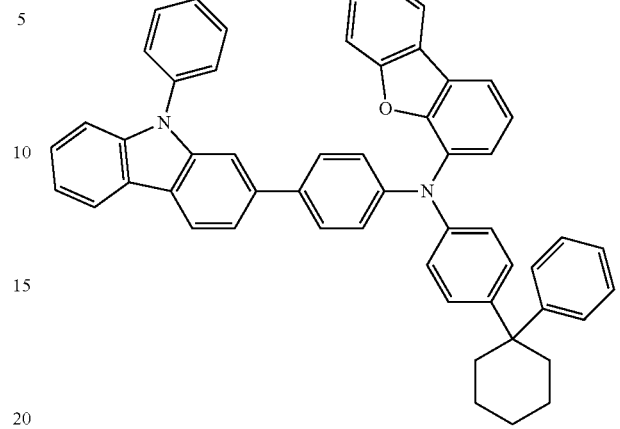
94
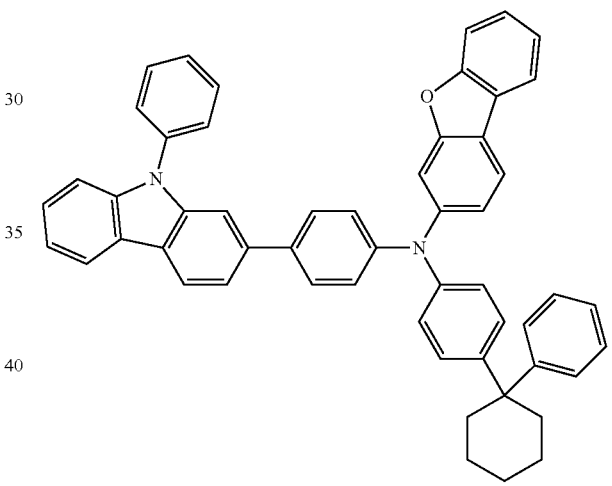
95
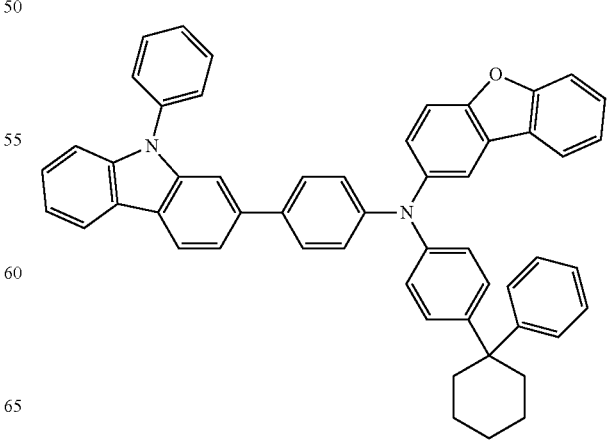

96
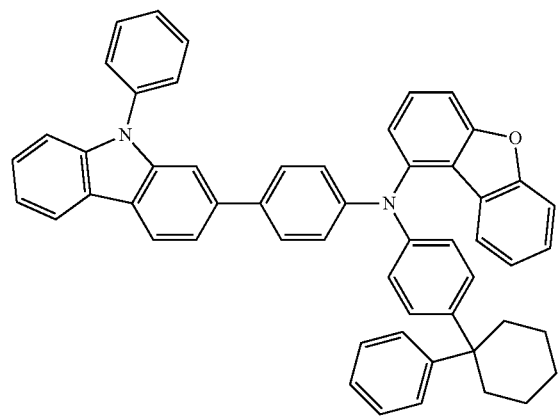
97
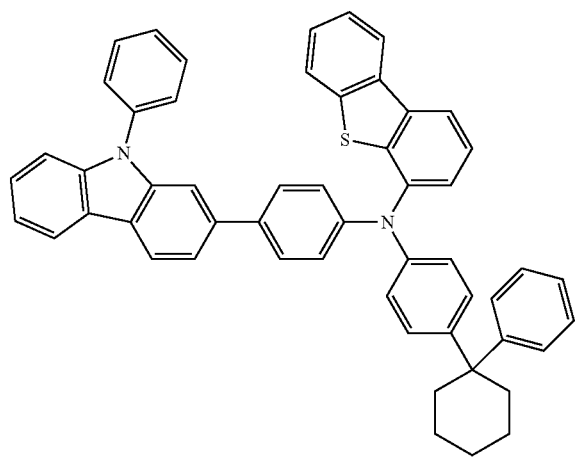
98
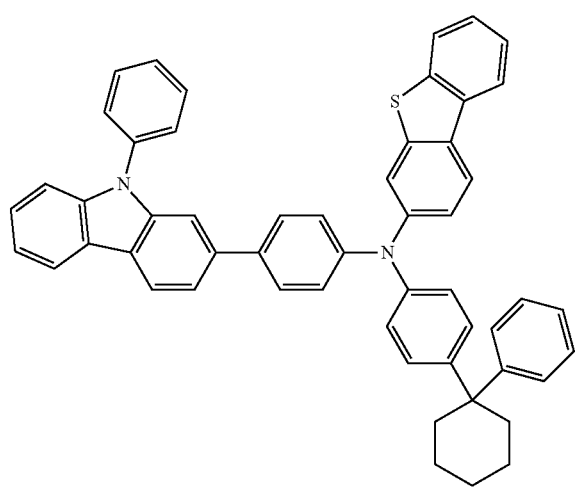
99
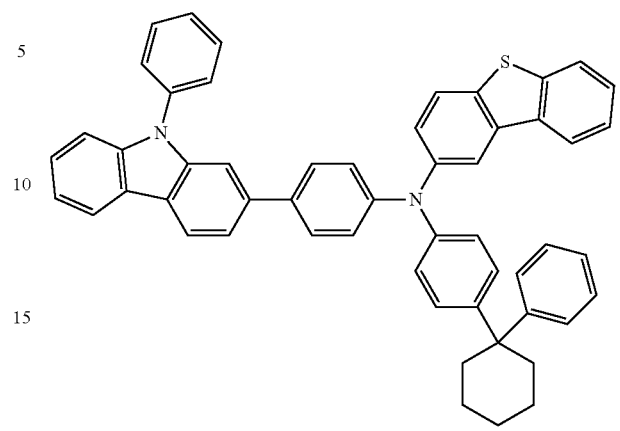
100
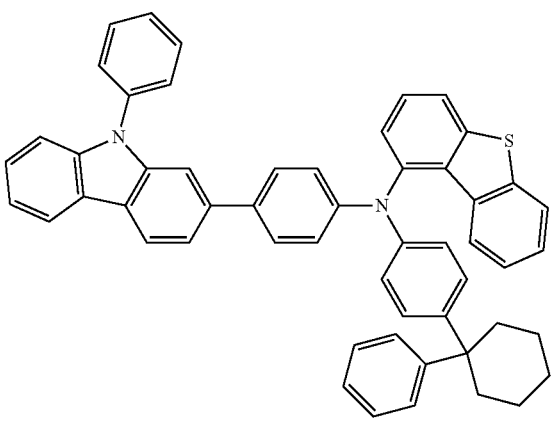
101
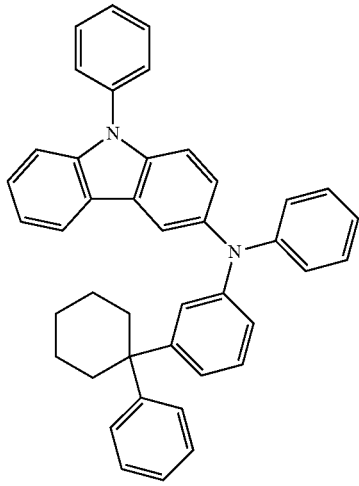

123
-continued
102
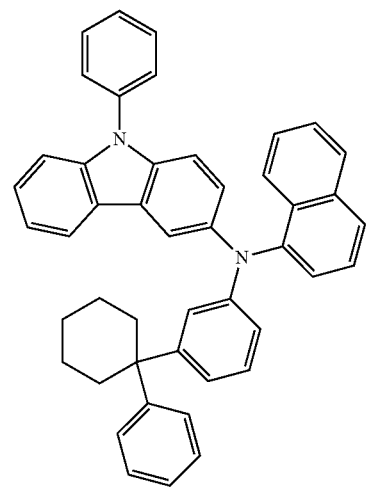
103
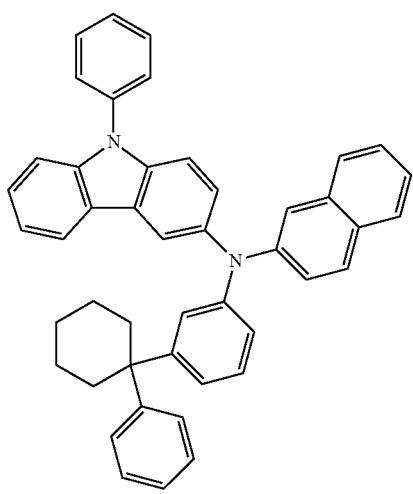
104
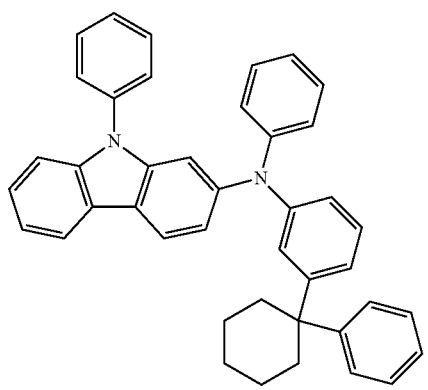
124
-continued
105
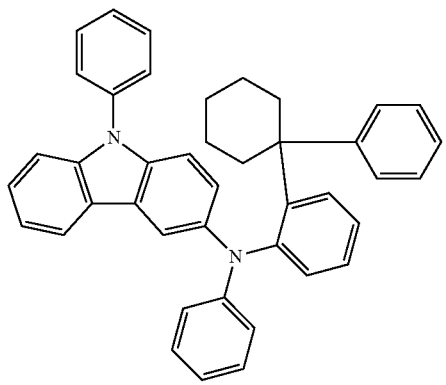
106
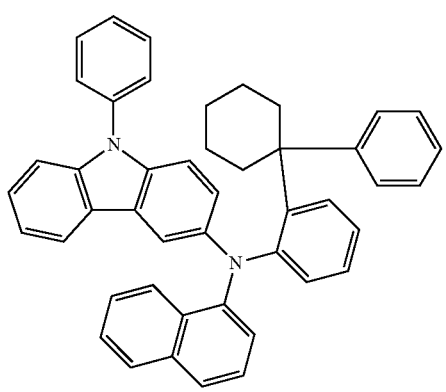
107
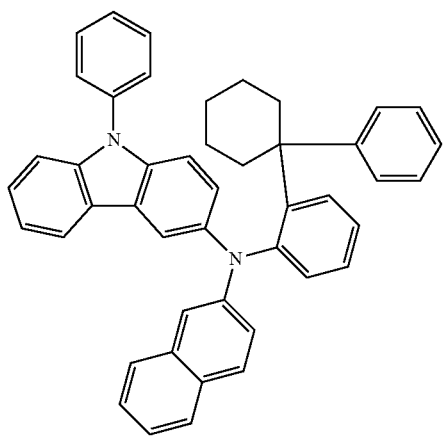
108
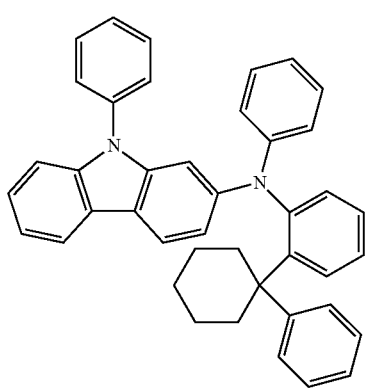

109
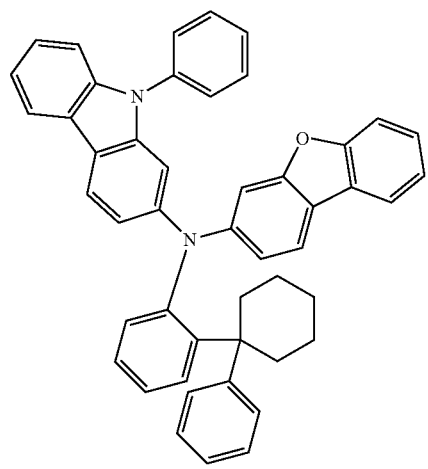
110
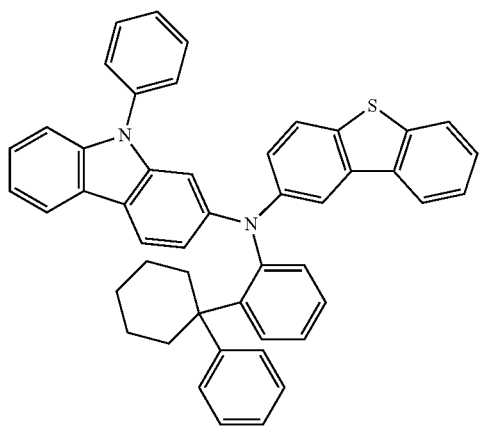
111
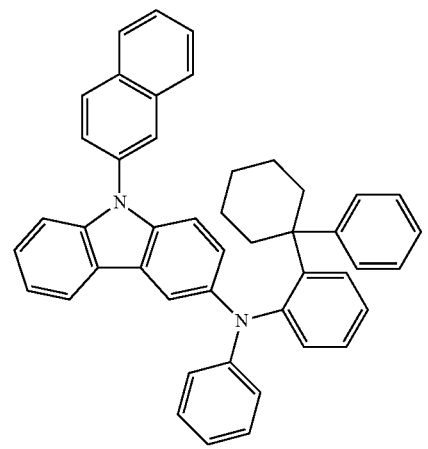
112
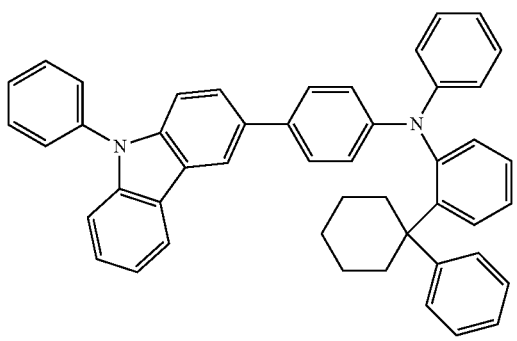
113
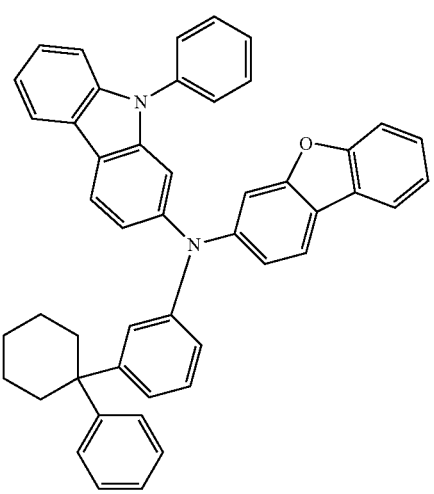
114
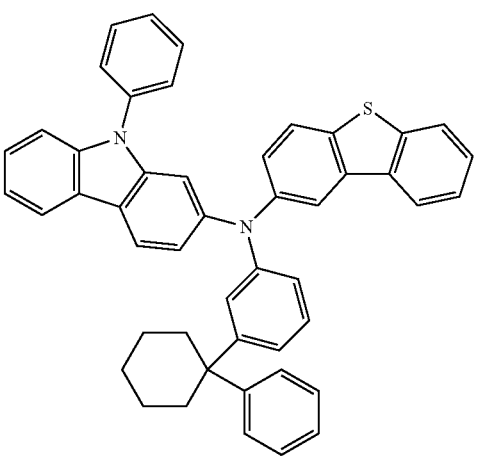

115
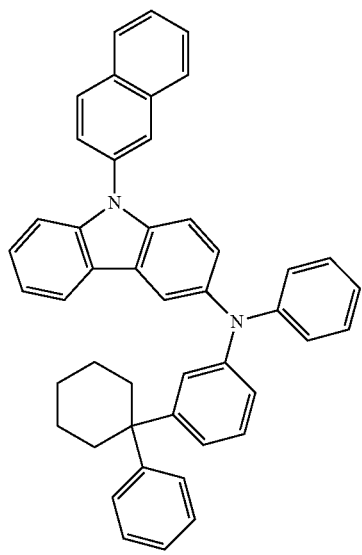
118
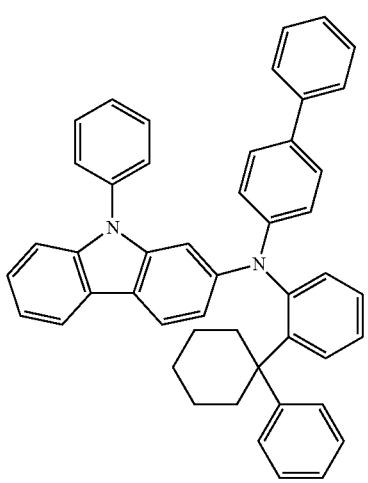
116
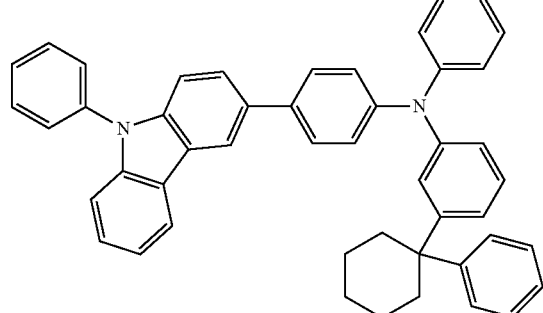
119
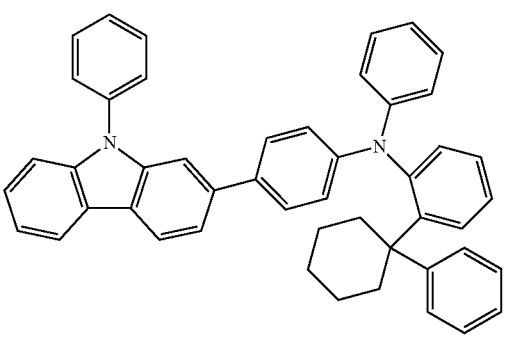
117
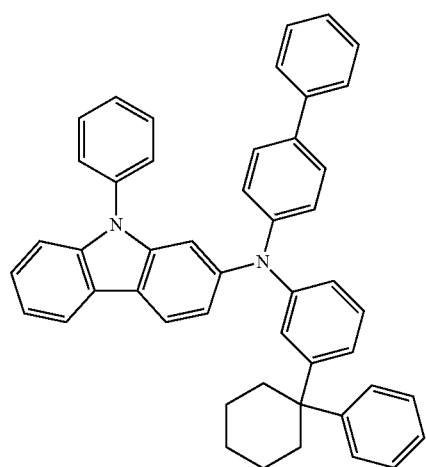
120
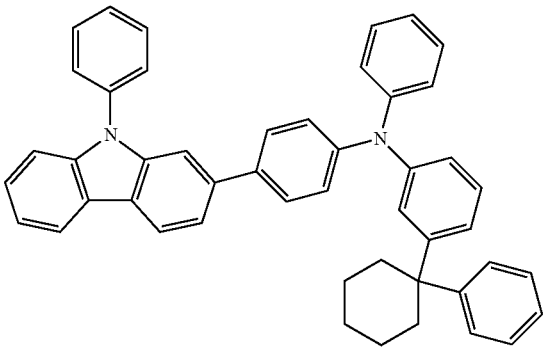

129
-continued

121
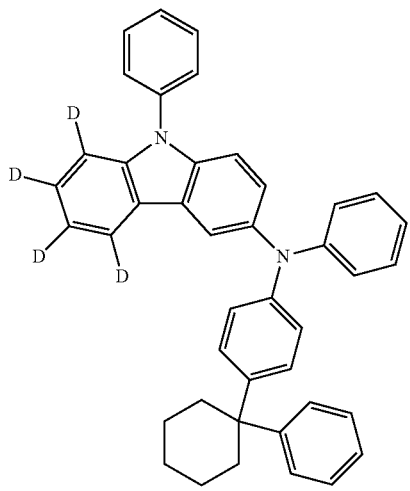

122
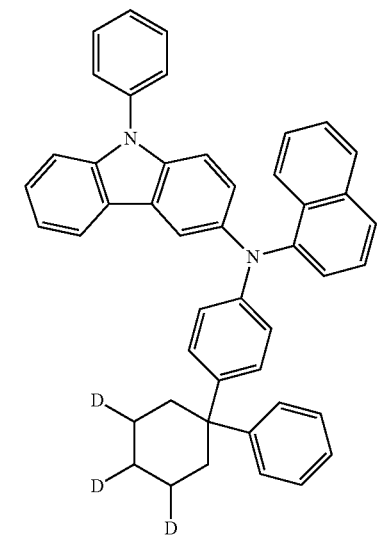

123
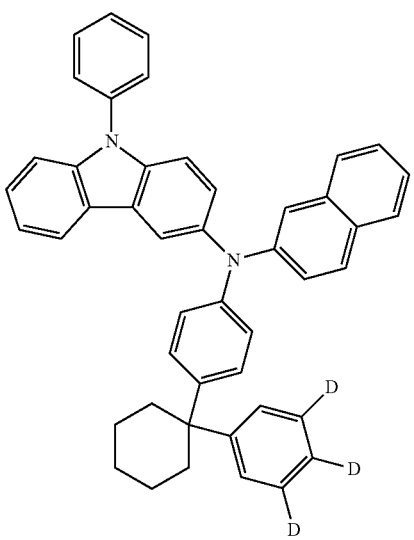

130
-continued

124
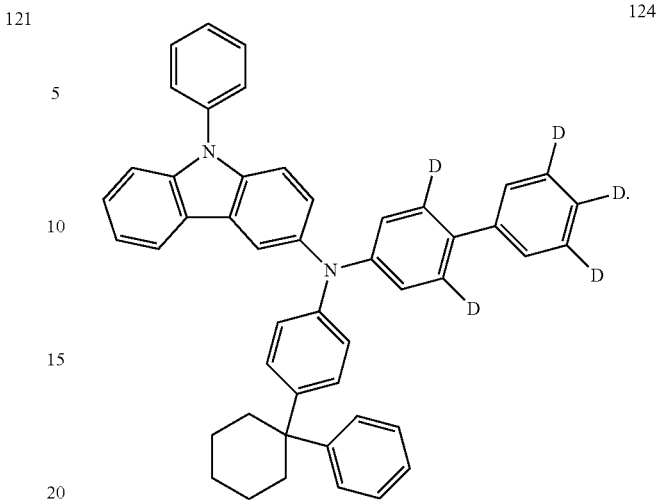

14. An amine compound represented by Formula 1:

[Formula 1]

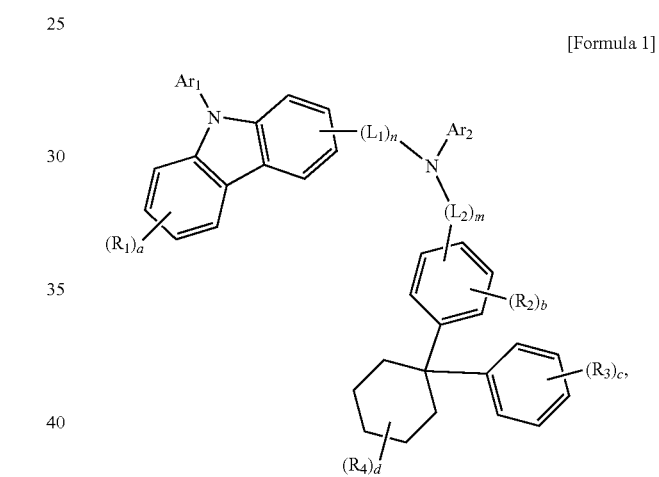

wherein, in Formula 1,

L₁ and L₂ are each independently a direct linkage, a substituted or unsubstituted arylene group having 6 to 30 ring-forming carbon atoms, or a substituted or unsubstituted heteroarylene group having 2 to 30 ring-forming carbon atoms, m and n are each independently an integer of 0 to 2, Ar₁ and Ar₂ are each independently a substituted or unsubstituted aryl group having 6 to 30 ring-forming carbon atoms, or a substituted or unsubstituted heteroaryl group having 2 to 30 ring-forming carbon atoms, R₁ to R₄ are each independently a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a and b are each independently an integer of 0 to 4, and c and d are each independently an integer of 0 to 5.

15. The amine compound of claim 14, wherein the amine compound represented by Formula 1 is represented by Formula 2:

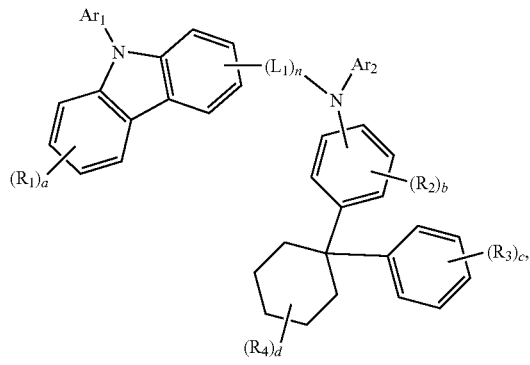

[Formula 2]

and wherein, in Formula 2, $Ar_1$, $Ar_2$, $L_1$, $R_1$ to $R_4$, n, and a to d are each independently the same as defined in Formula 1.

16. The amine compound of claim 15, wherein the amine compound represented by Formula 2 is represented by Formula 3:

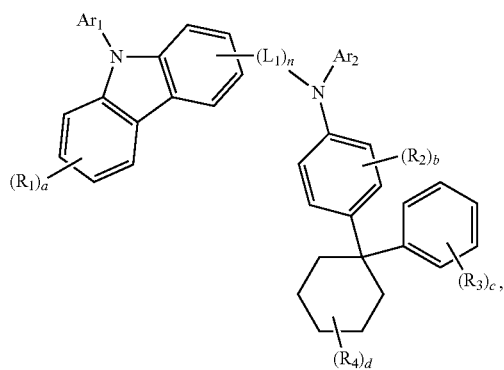

[Formula 3]

and wherein, in Formula 3, $Ar_1$, $Ar_2$, $L_1$, $R_1$ to $R_4$, n, and a to d are each independently the same as defined in Formula 2.

17. The amine compound of claim 16, wherein the amine compound represented by Formula 3 is represented by Formula 4-1 or Formula 4-2:

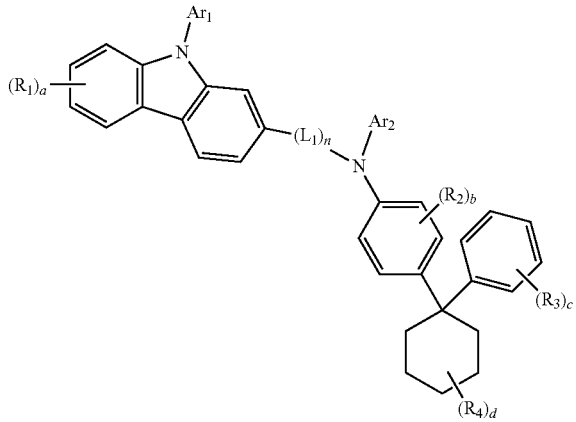

[Formula 4-1]

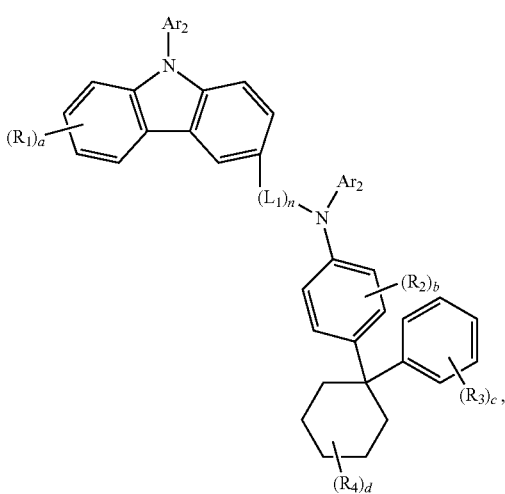

[Formula 4-2]

and wherein, in Formula 4-1 and Formula 4-2, $Ar_1$, $Ar_2$, $L_1$, $R_1$ to $R_4$, n, and a to d are each independently the same as defined in Formula 3.

18. The amine compound of claim 16, wherein the amine compound represented by Formula 3 is represented by Formula 4-3 or Formula 4-4:

[Formula 4-3]

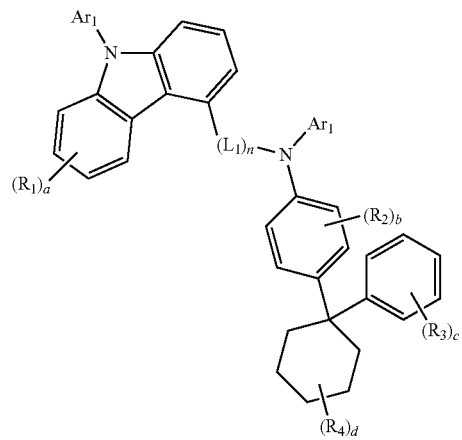

[Formula 4-4]

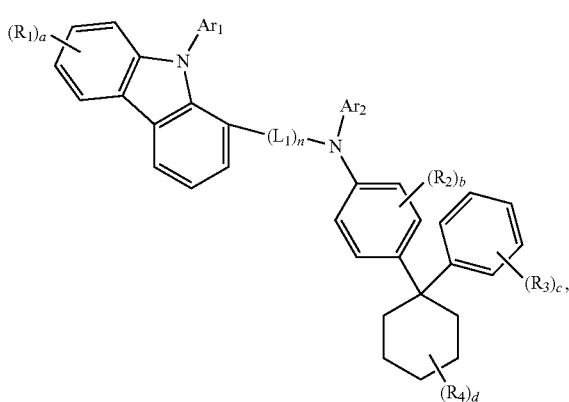

and wherein, in Formula 4-3 and Formula 4-4, $Ar_1$, $Ar_2$, $L_1$, $R_1$ to $R_4$, n, and a to d are each independently the same as defined in Formula 3.

19. The amine compound of claim 14, wherein $Ar_2$ is a substituted or unsubstituted aryl group having 6 to 16 ring-forming carbon atoms.

20. The amine compound of claim 14, wherein the amine compound represented by Formula 1 is any one selected from the compounds represented by Compound Group 1:

[Compound Group 1]

1

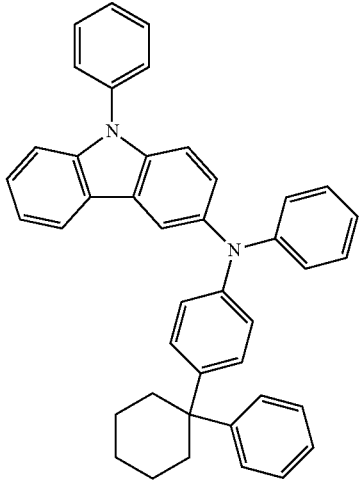

2

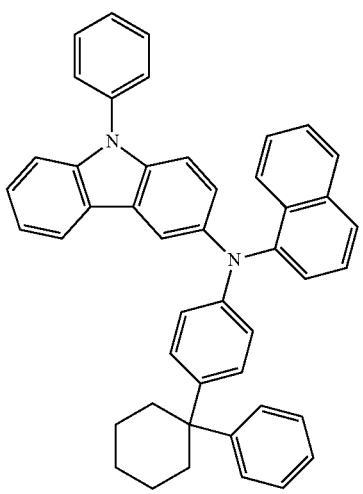

3

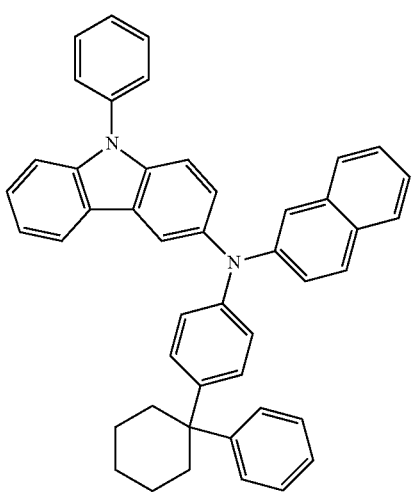

4
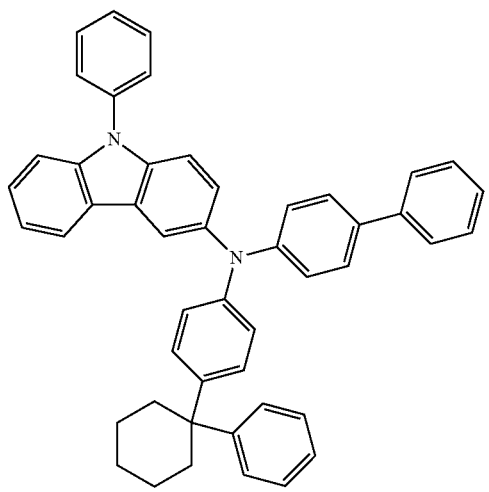
5
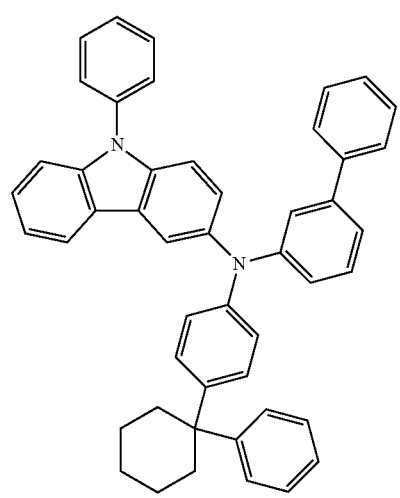
6
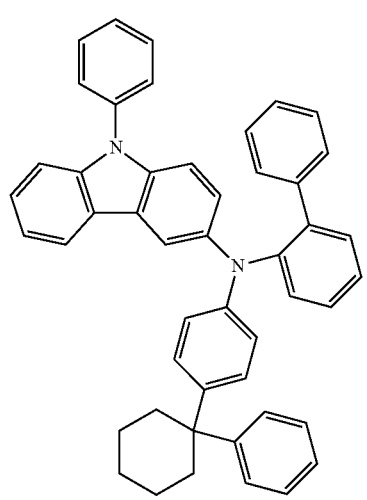
7
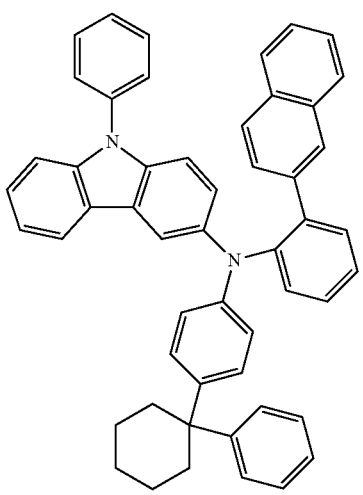
8
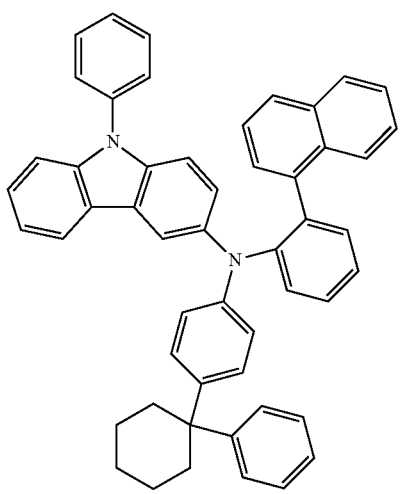
9
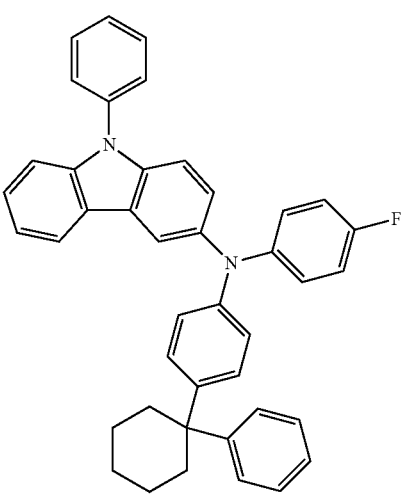

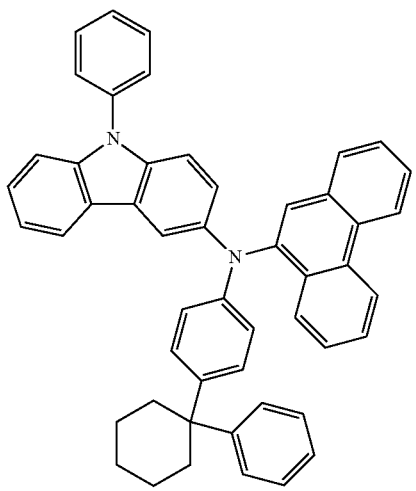
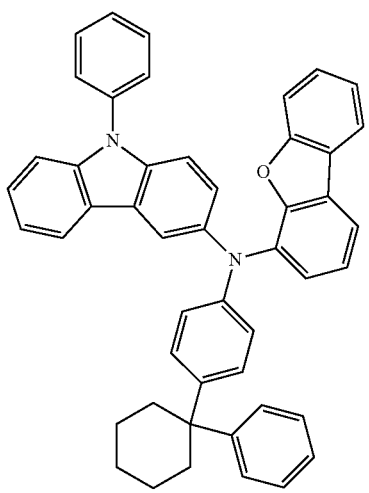
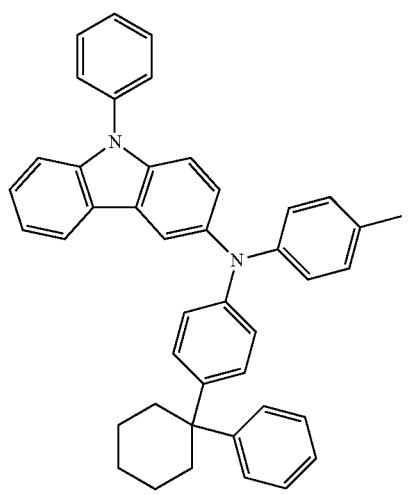
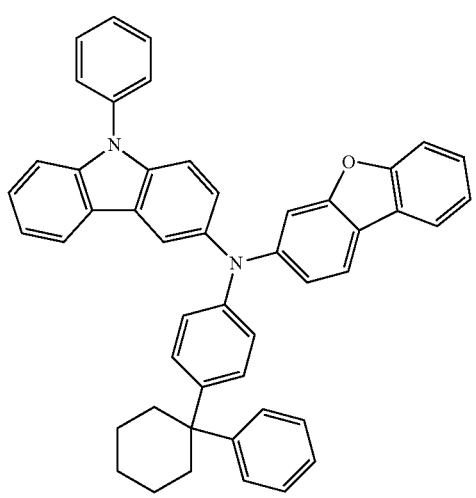
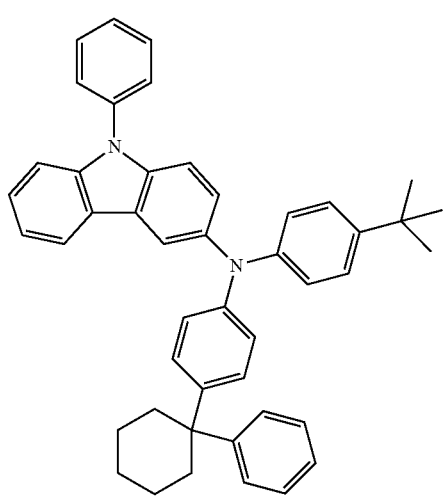
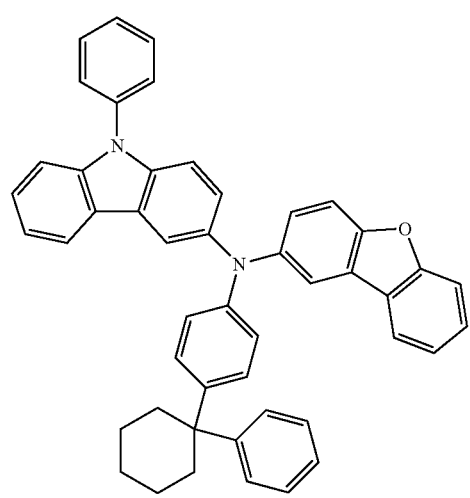

16
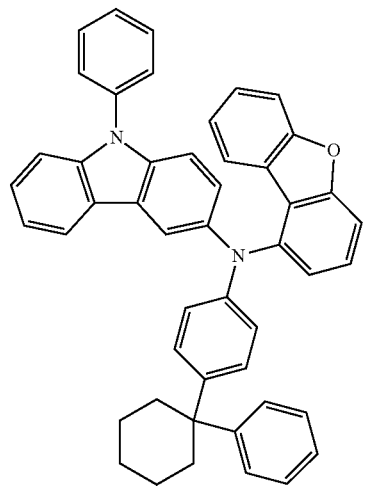
17
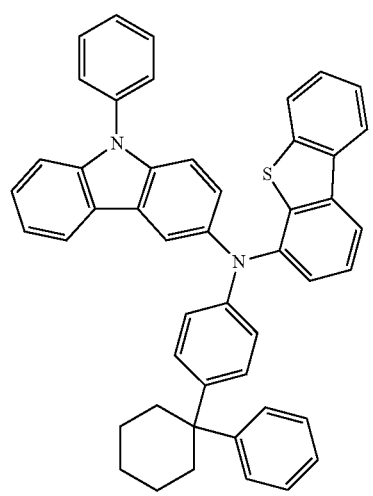
18
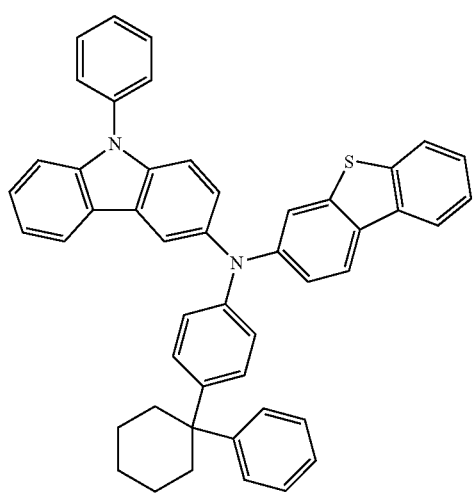
19
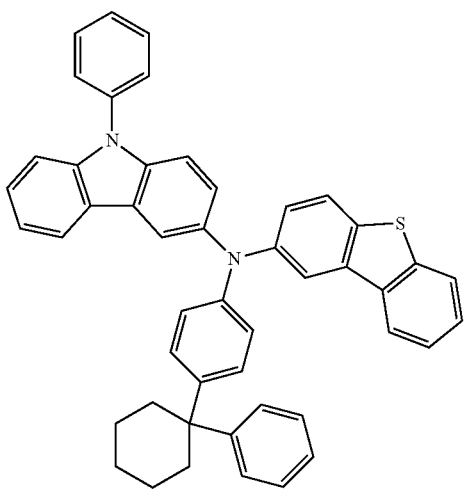
20
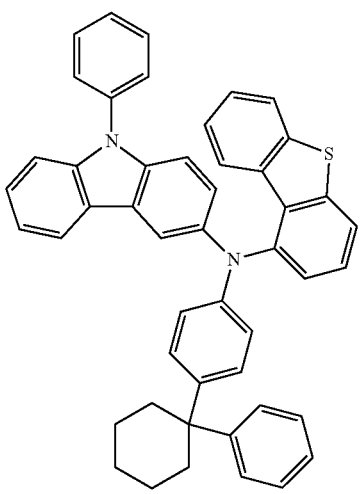
21
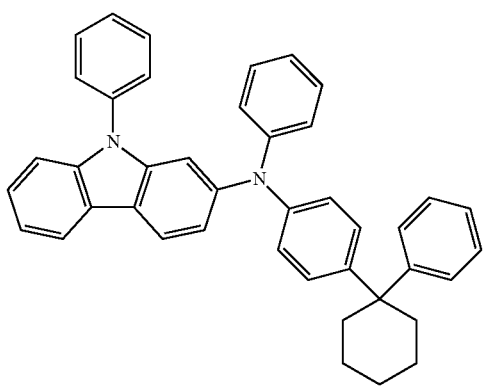

141
-continued
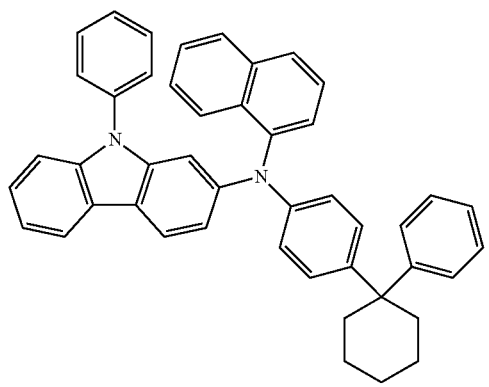
22
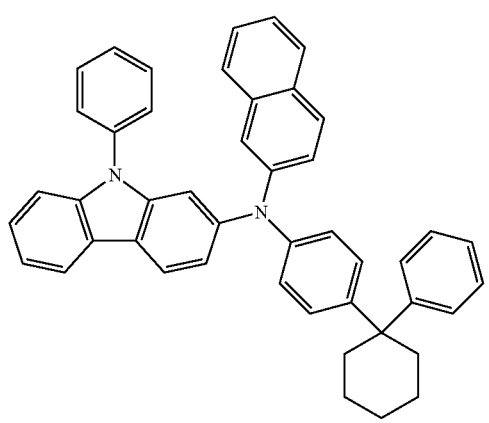
23
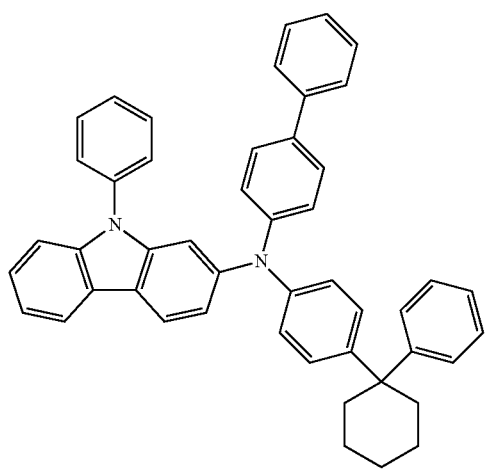
24
142
-continued
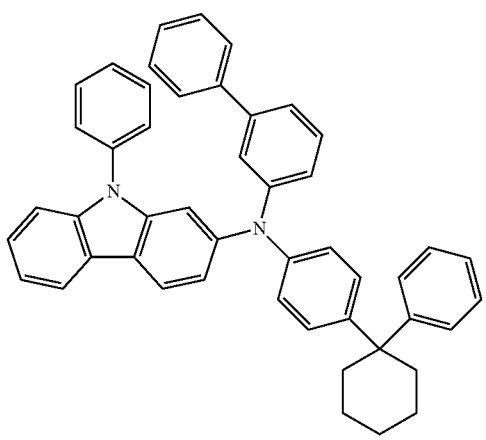
25
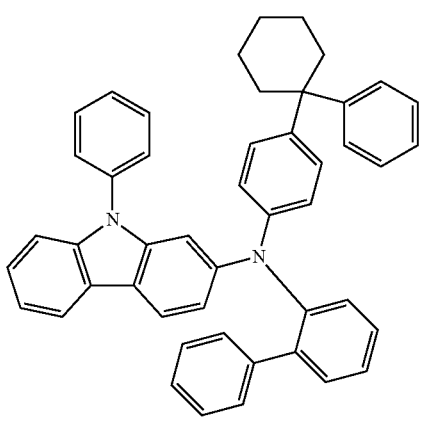
26
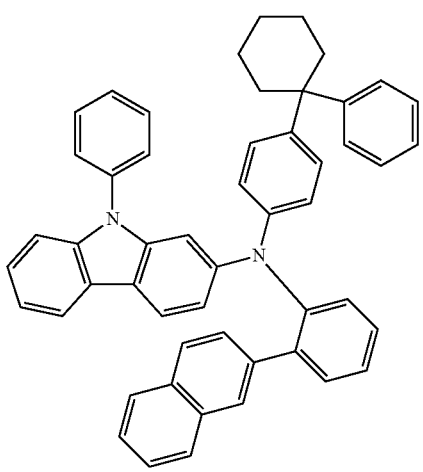
27

28
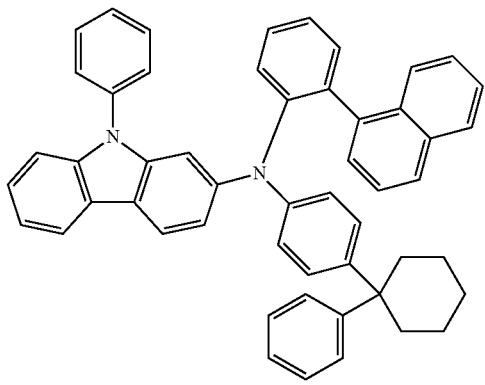
29
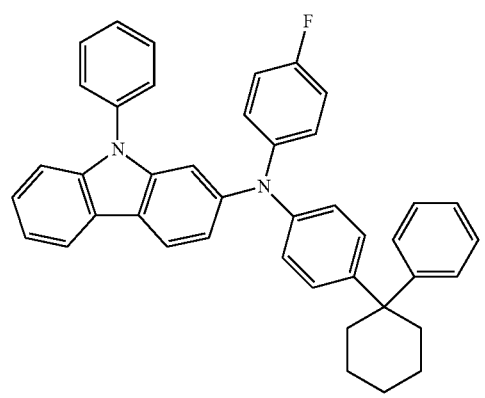
30
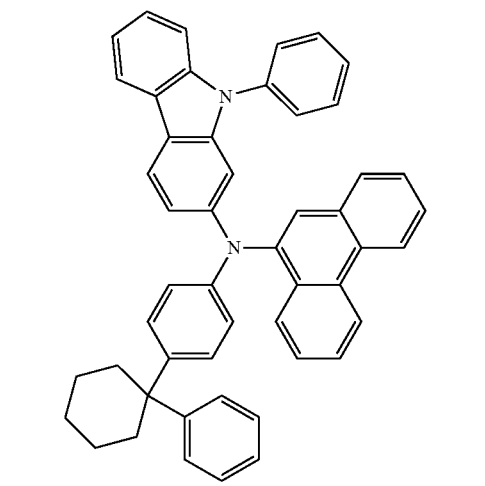
31
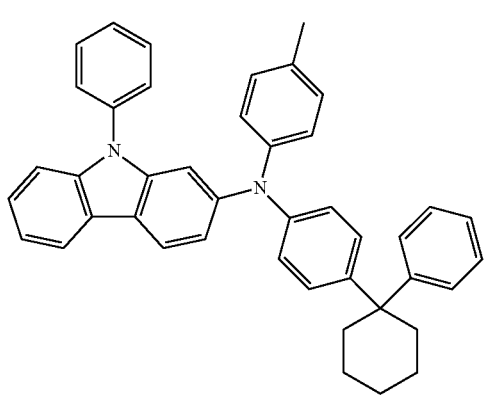
32
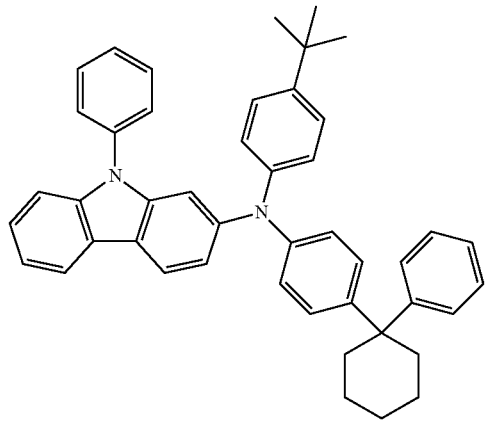
33
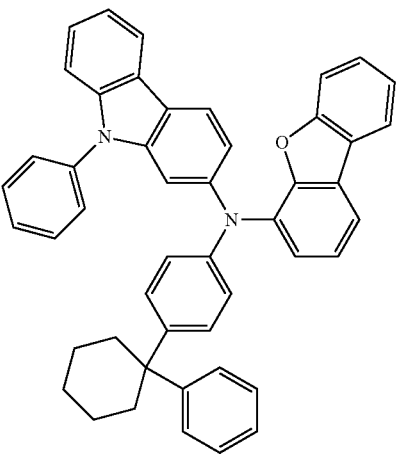
34
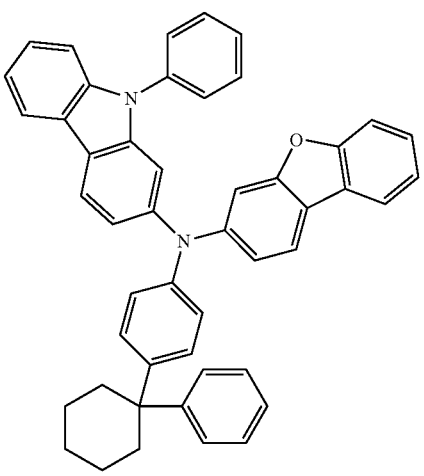

35
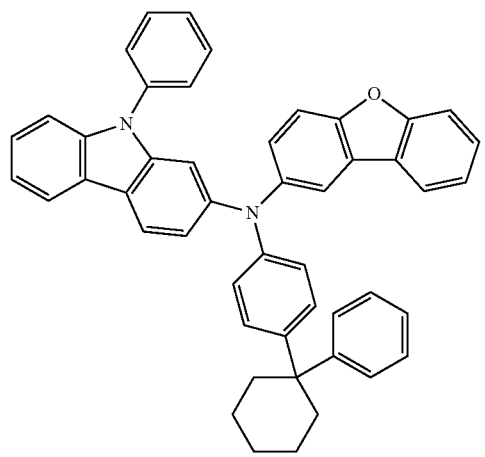
36
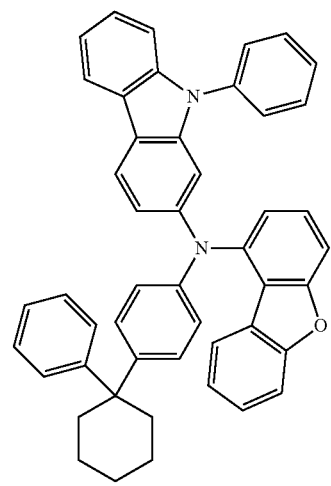
37
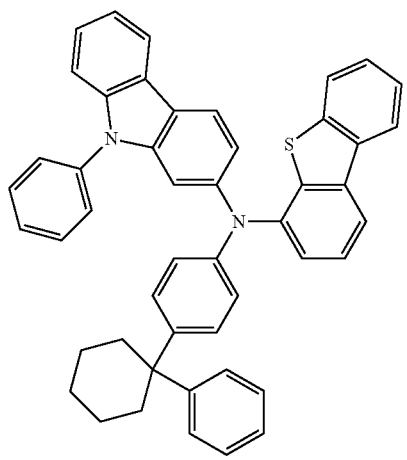
38
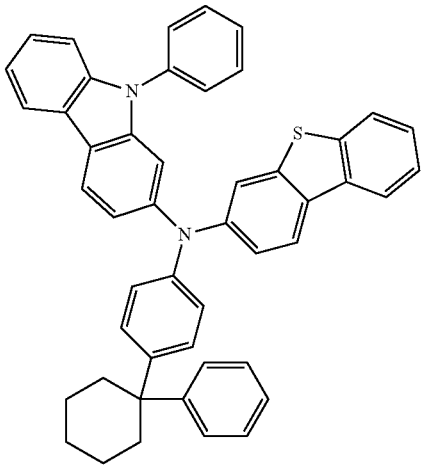
39
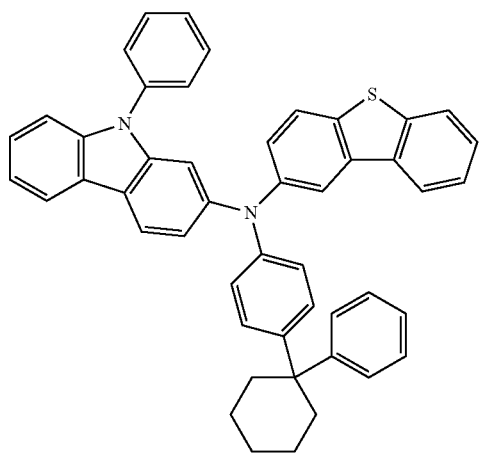
40
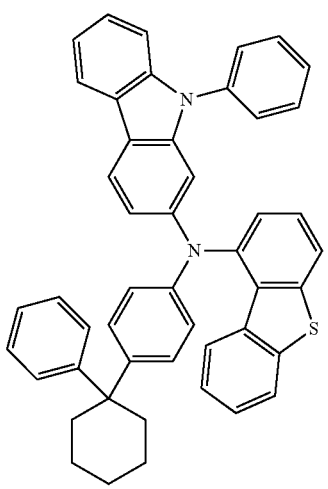

41
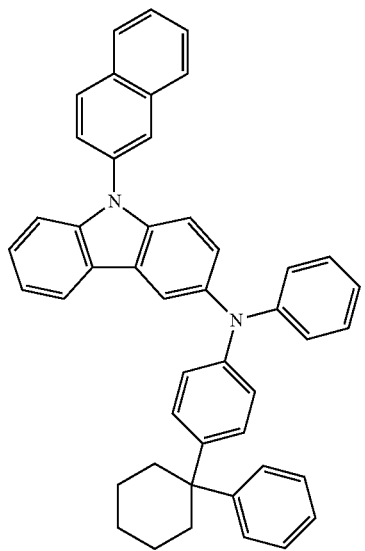
42
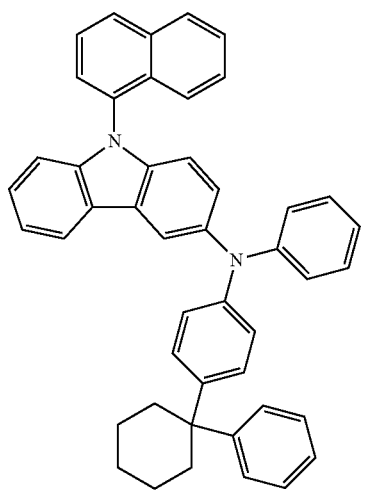
43
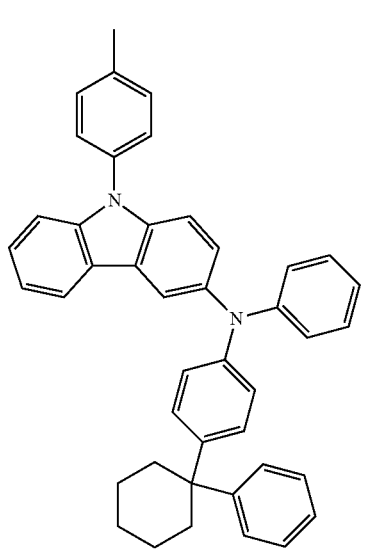
44
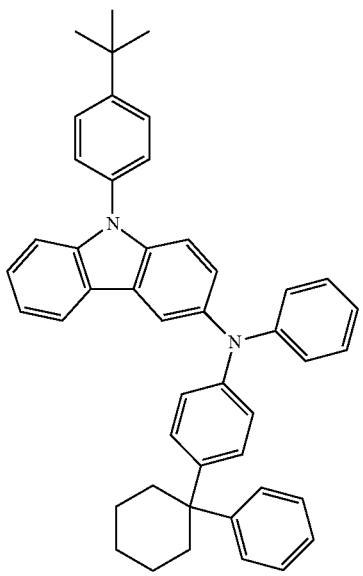
45
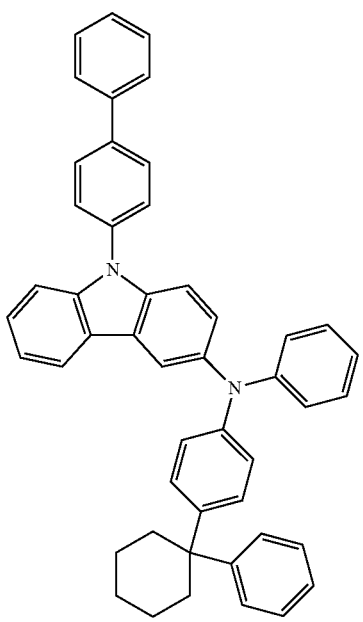

46
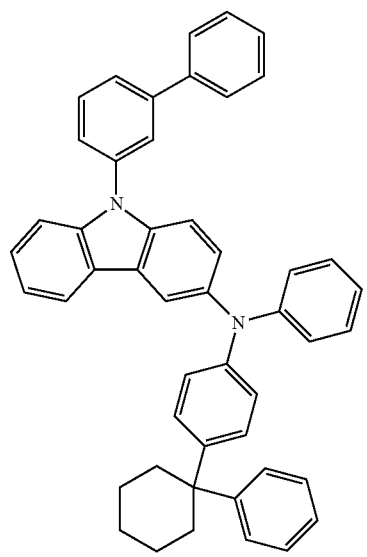
47
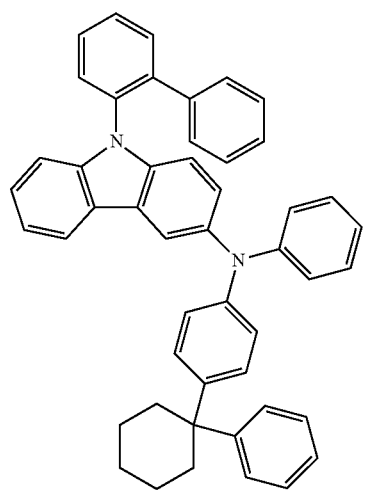
48
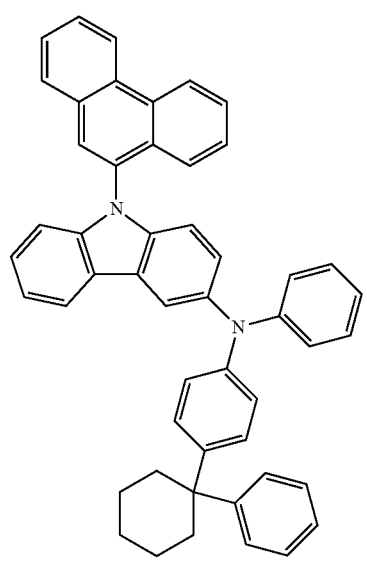
49
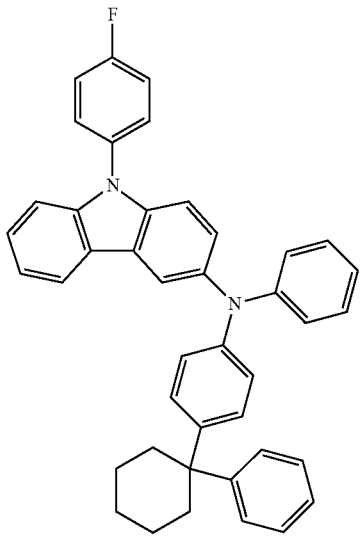
50
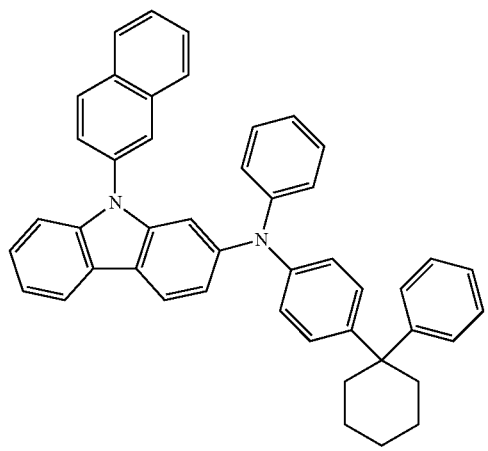
51
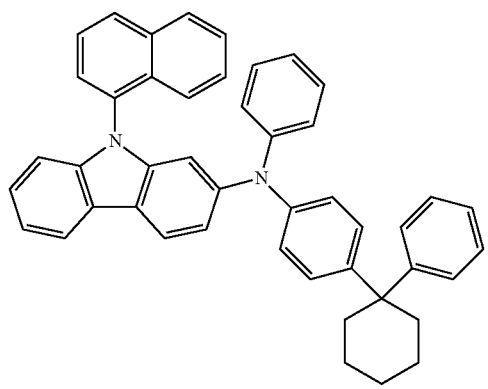

52
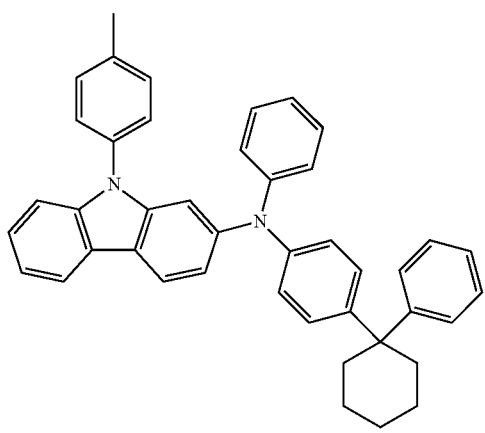
53
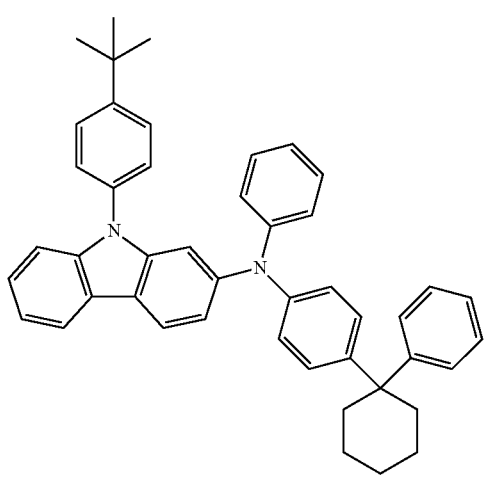
54
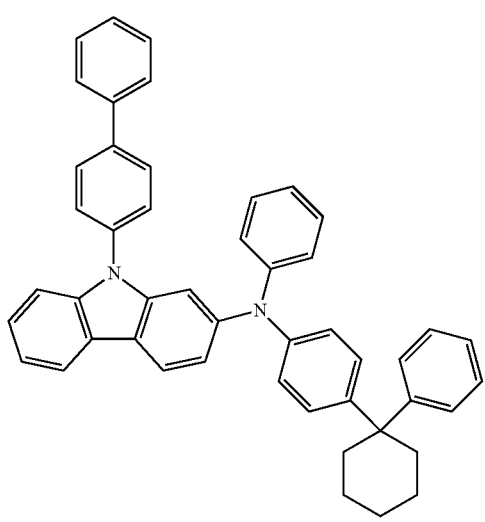
55
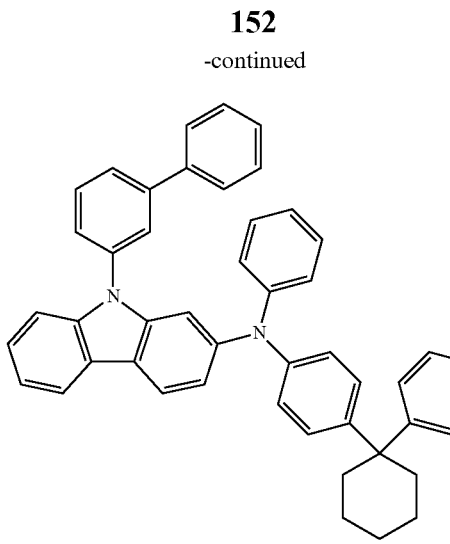
56
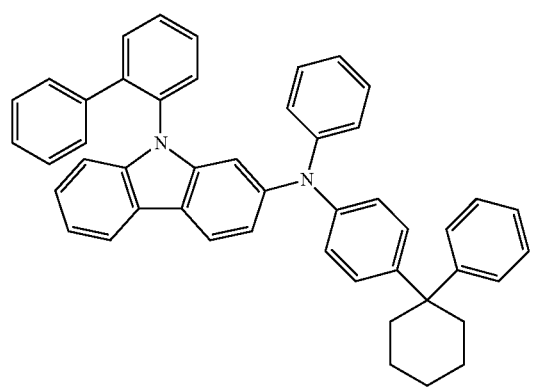
57
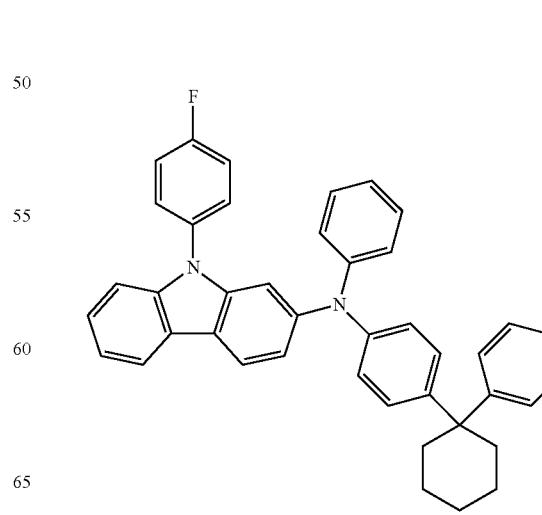

58
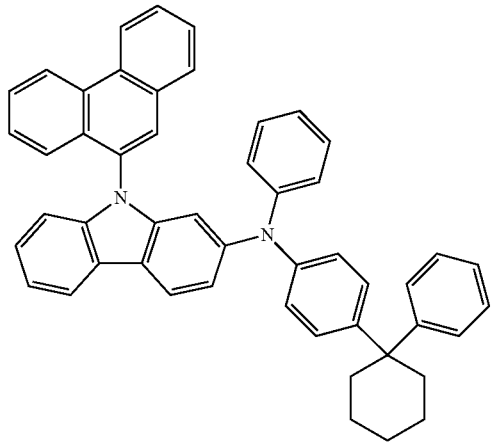
59
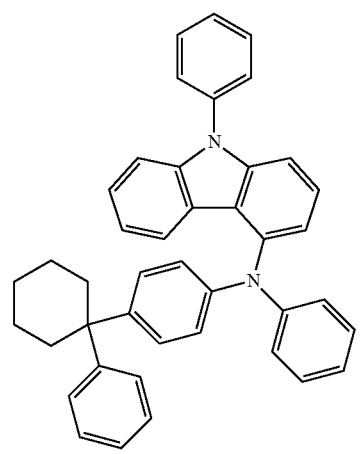
60
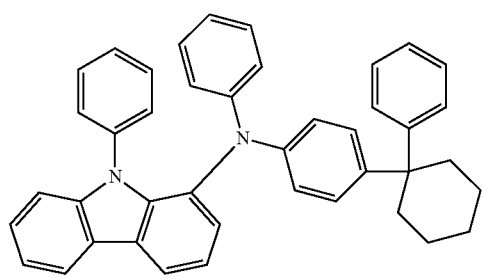
61
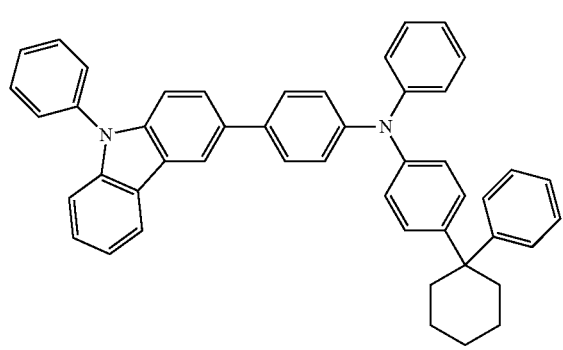
62
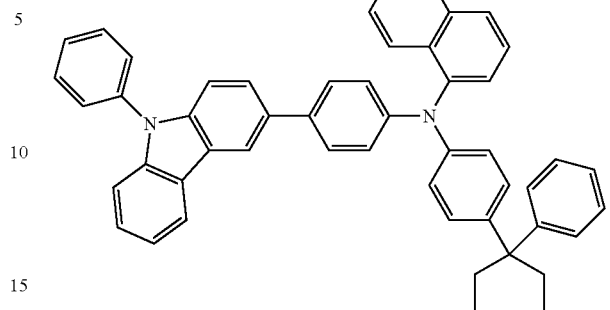
63
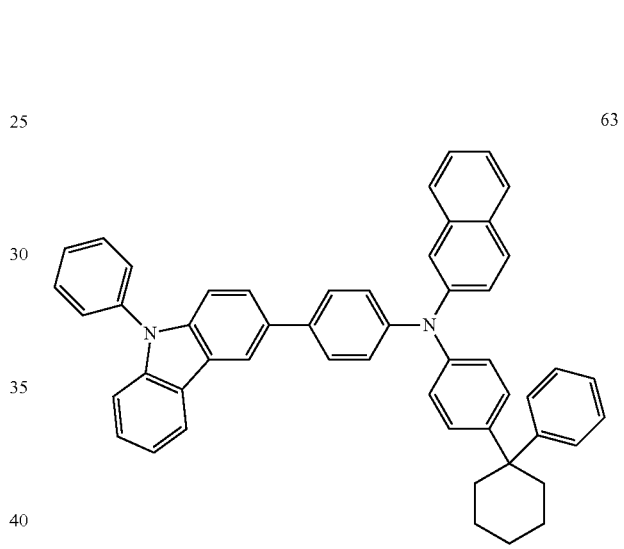
64
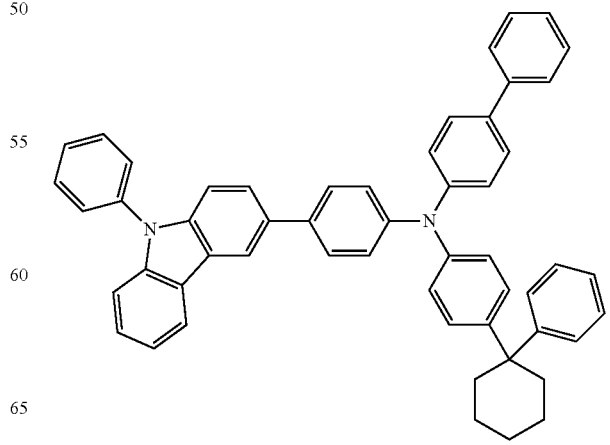

65
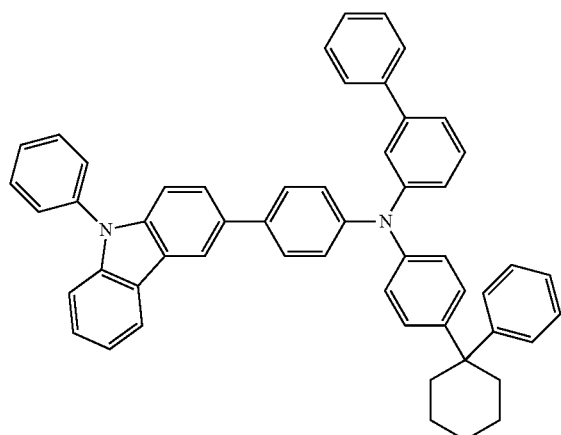
66
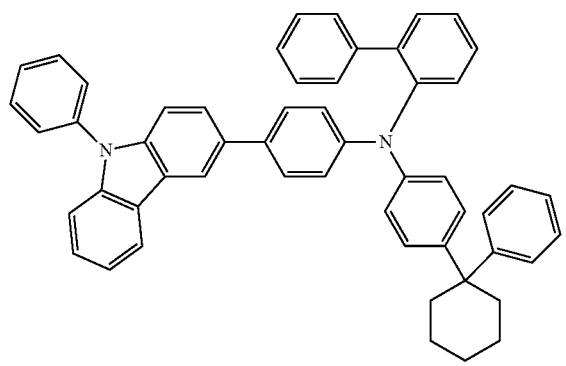
67
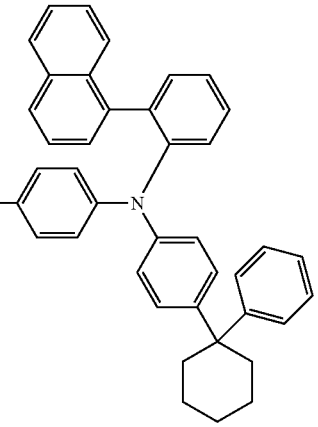
68
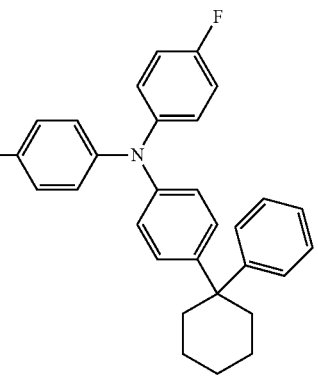
69
70
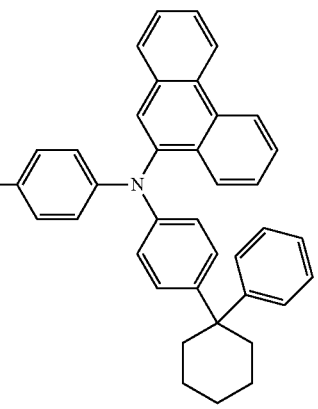
71
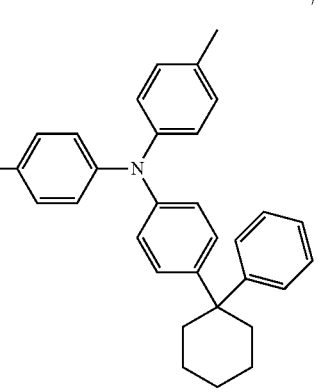

157
-continued
72
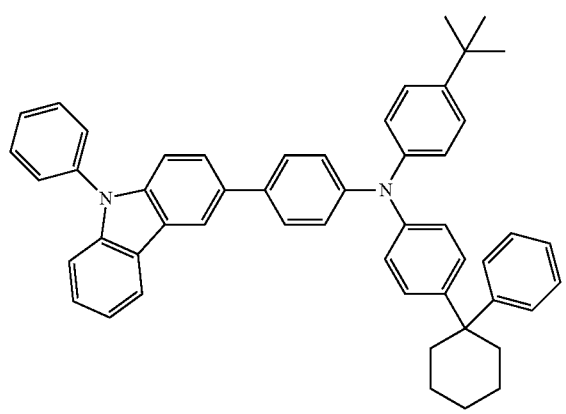
73
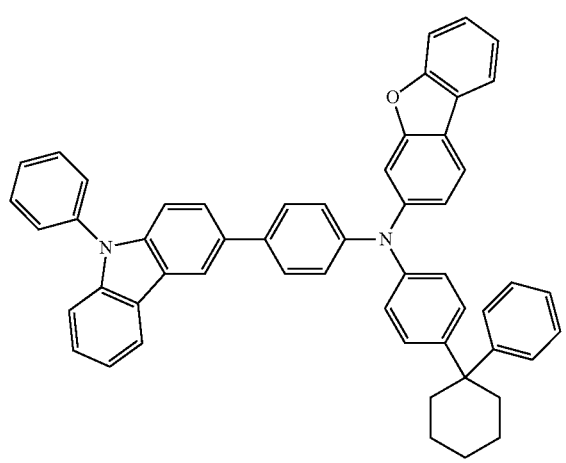
74
158
-continued
75
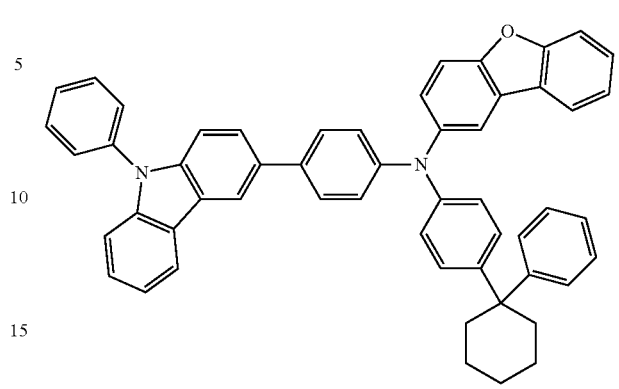
76
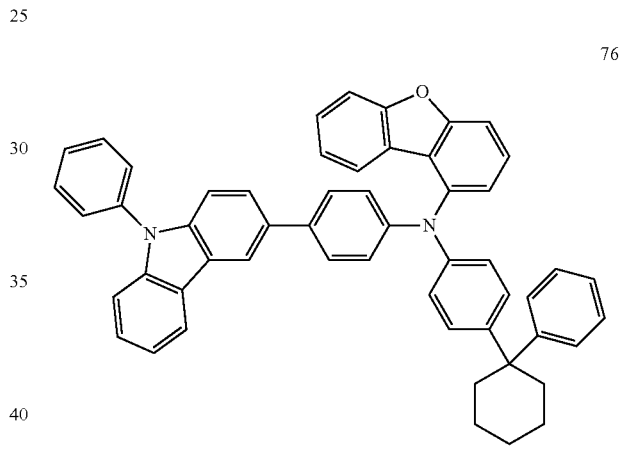
77
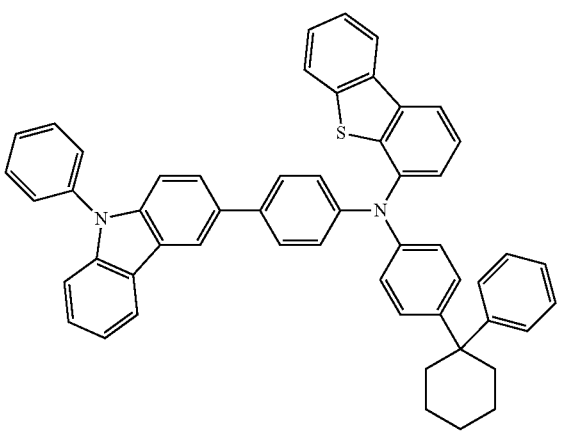

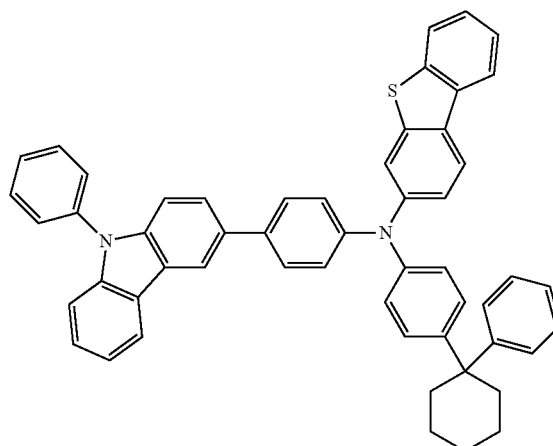
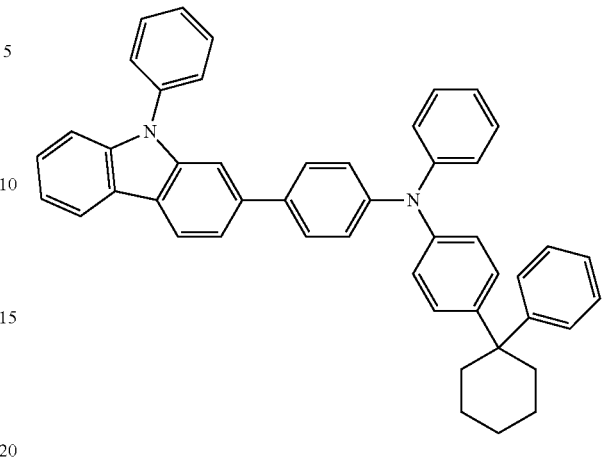
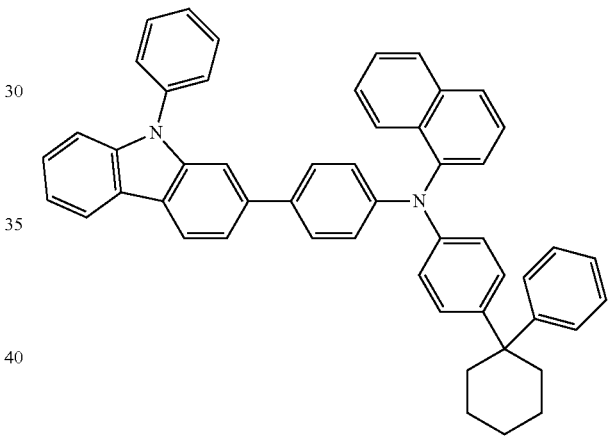
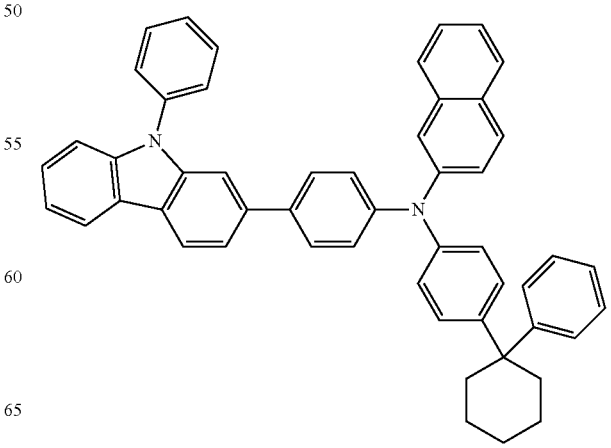

84
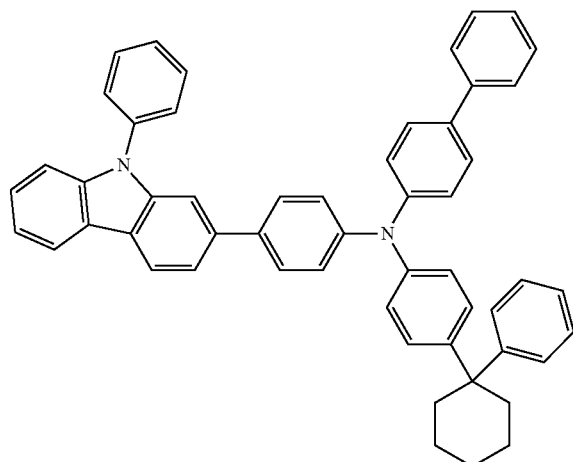
87
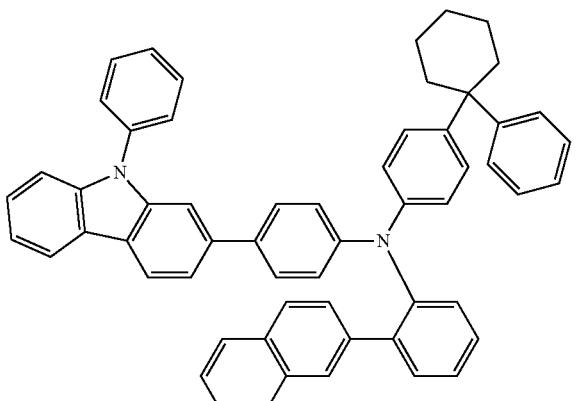
85
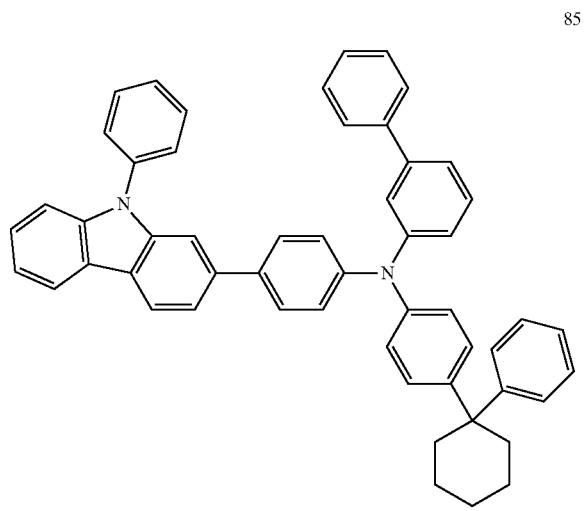
88
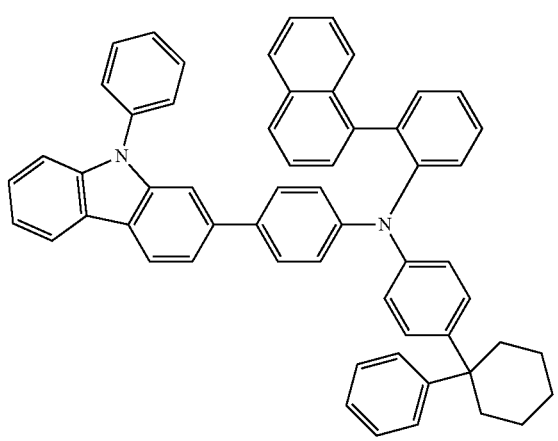
86
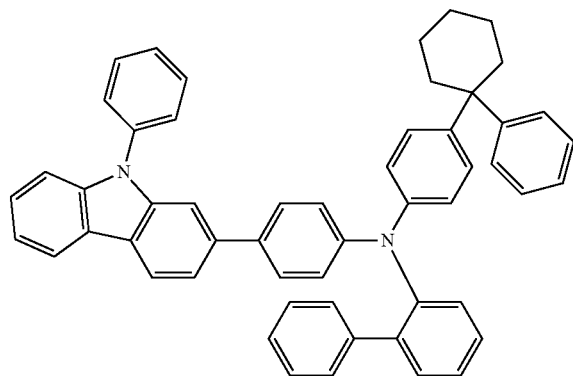
89
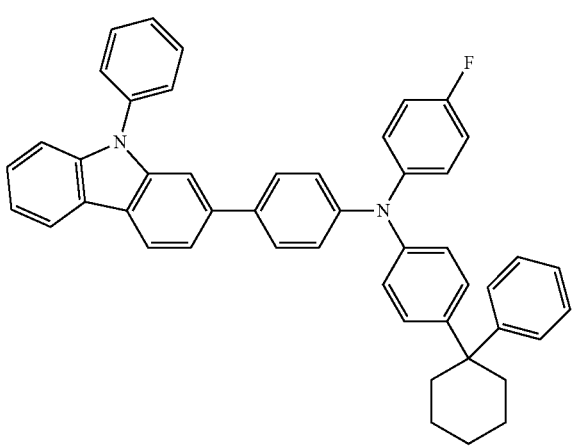

90
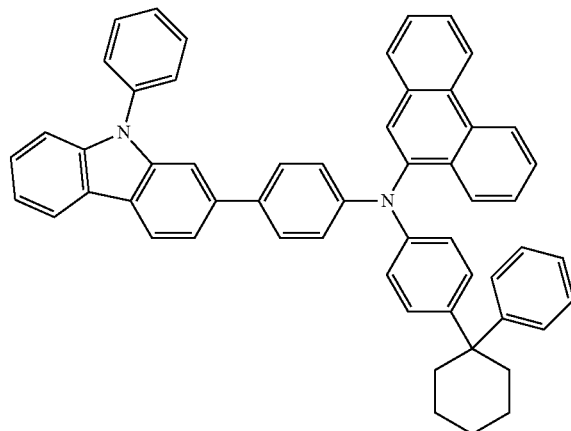
93
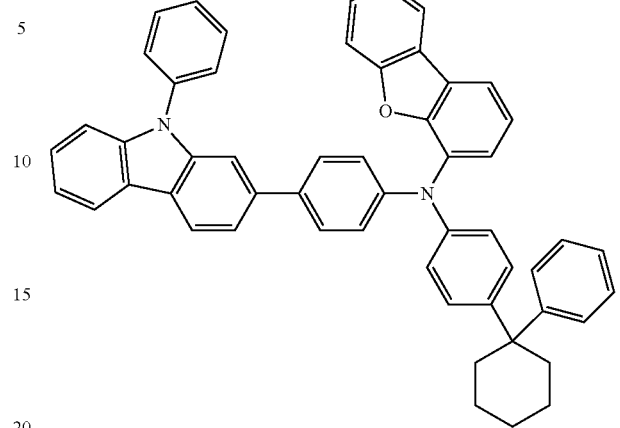
91
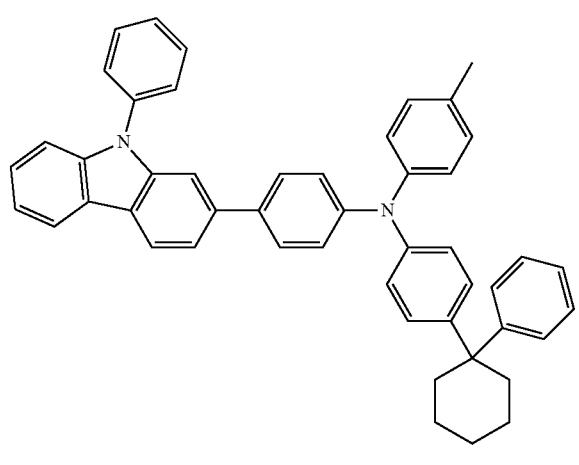
94
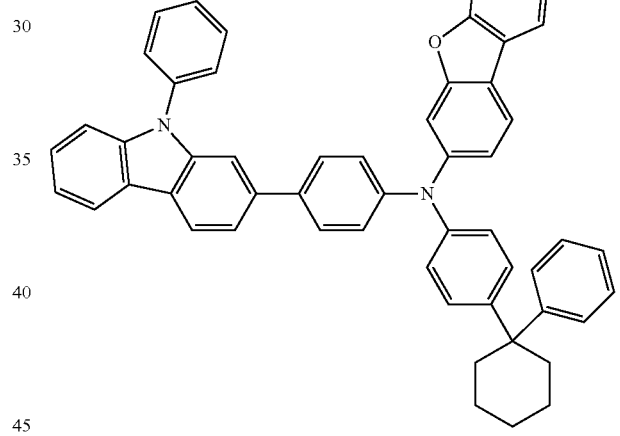
92
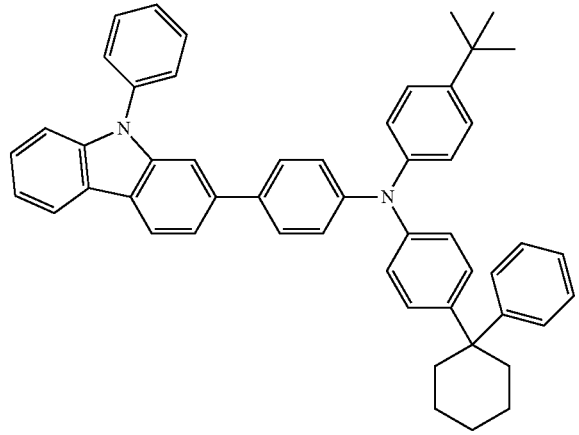
95
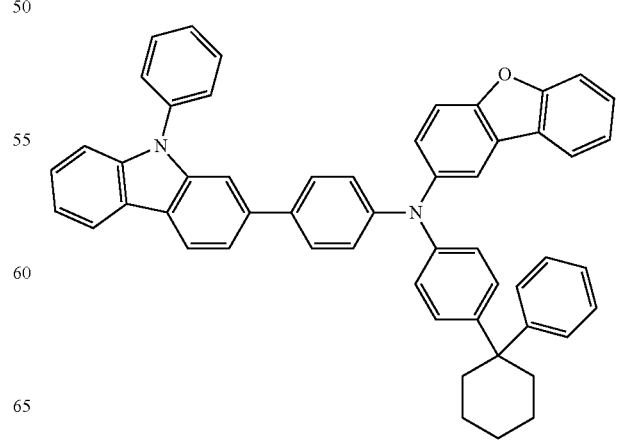

-continued
96
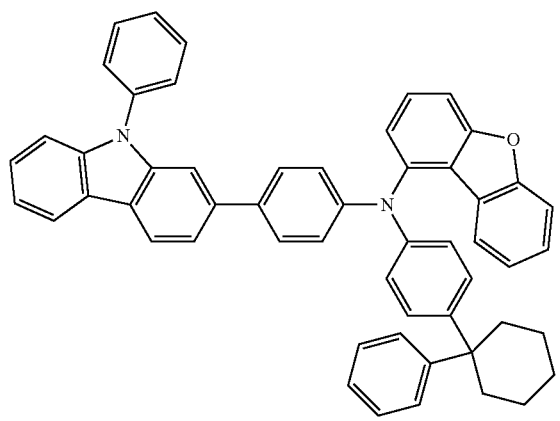
97
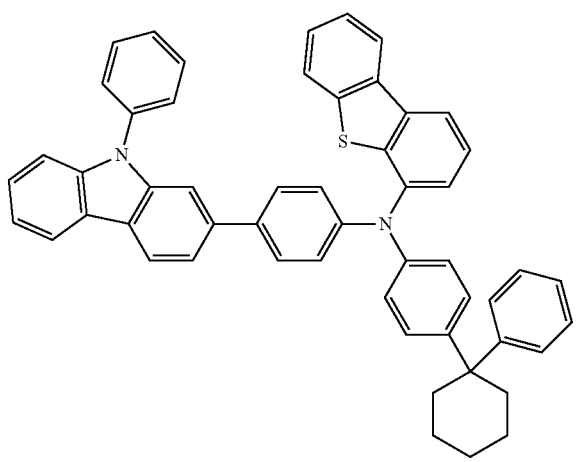
98
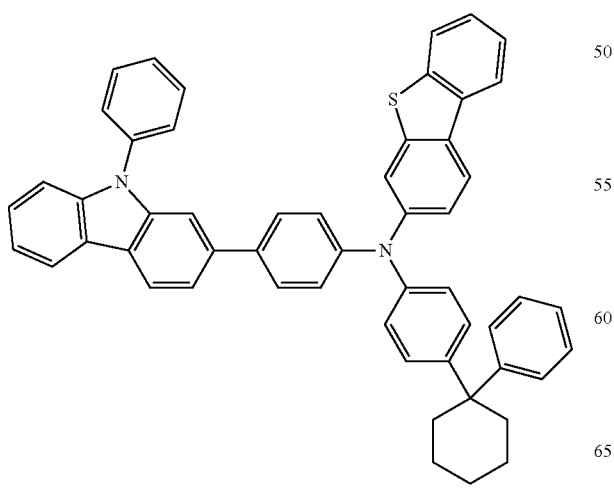
-continued
99
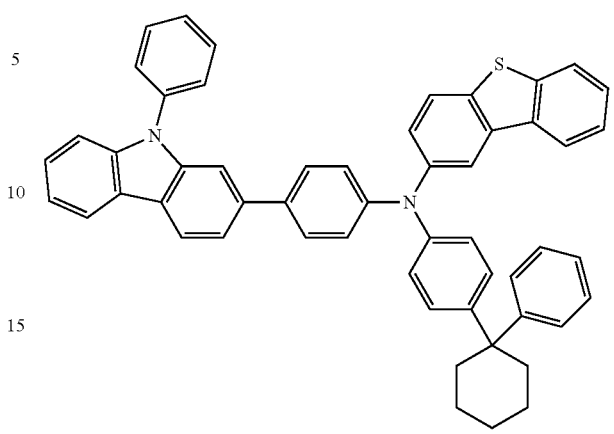
100
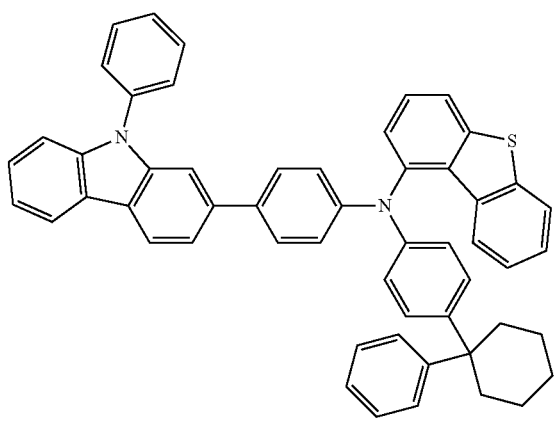
101
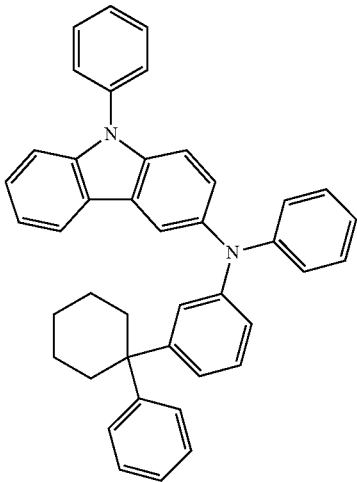

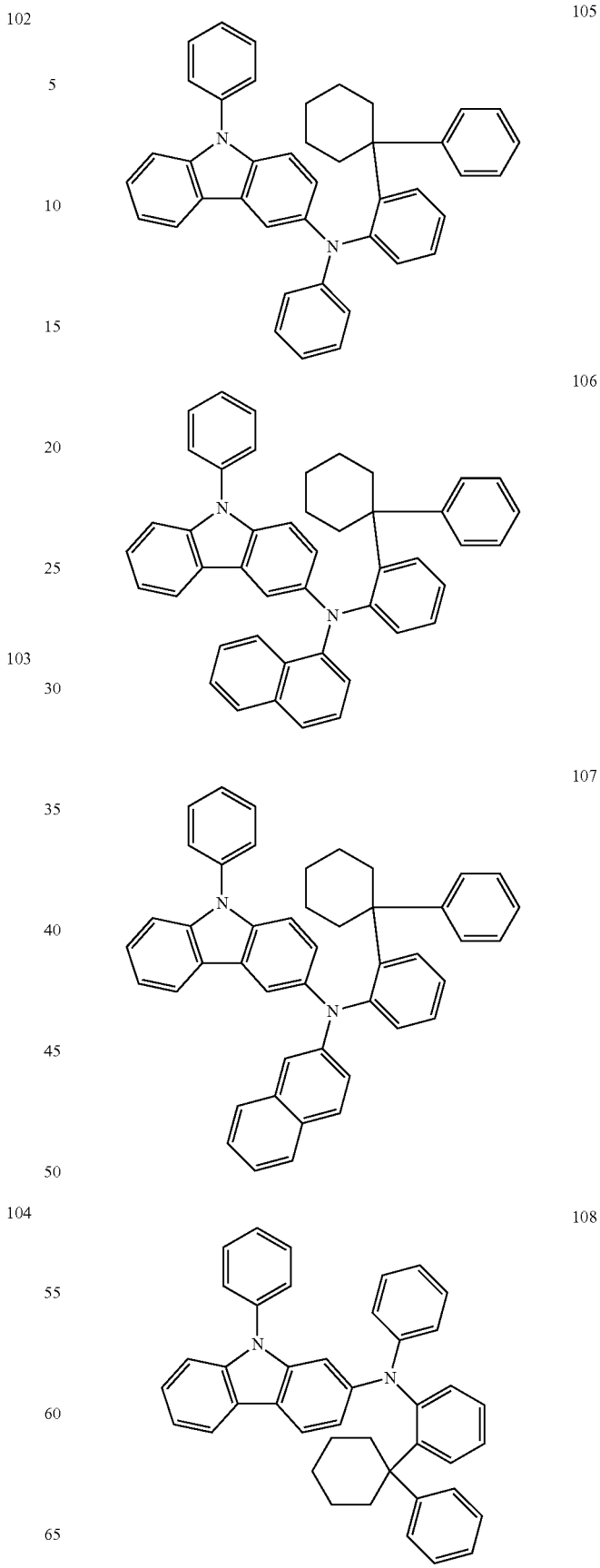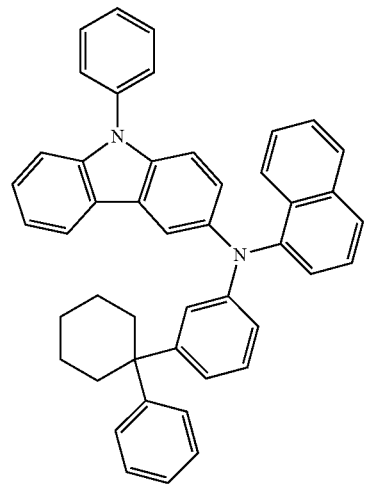

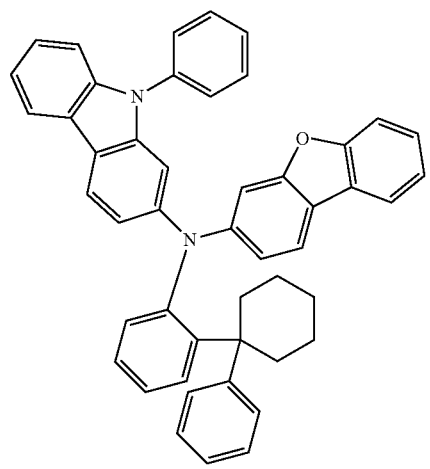
109
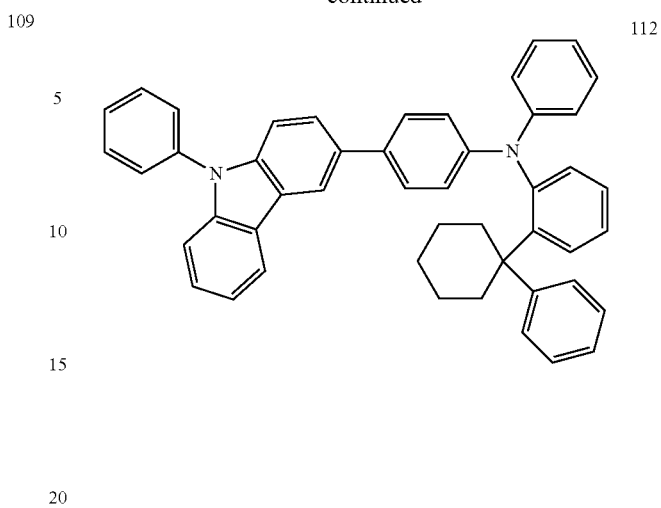
112
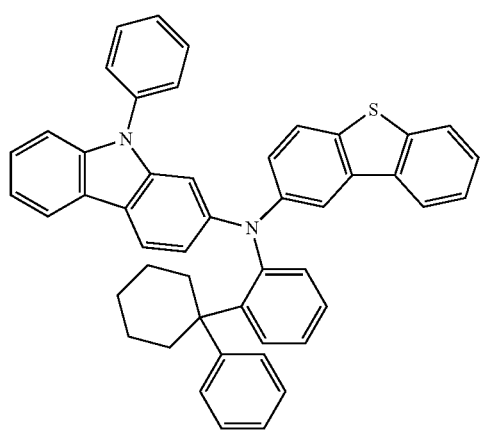
110
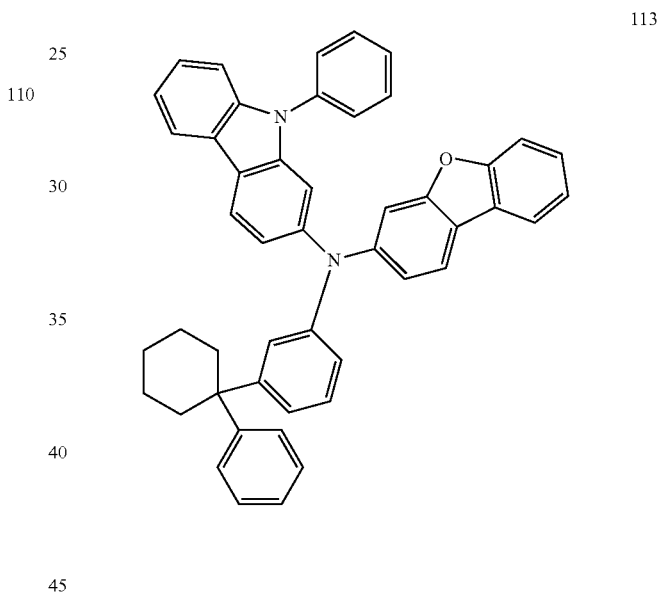
113
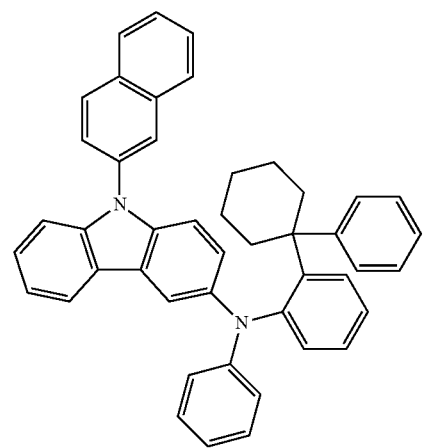
111
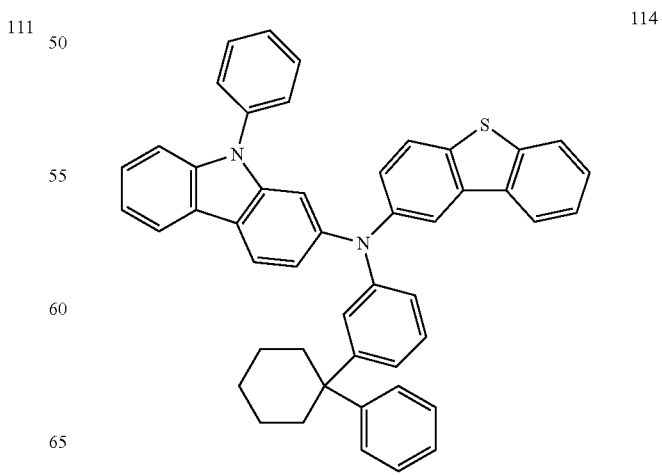
114

171
-continued
115
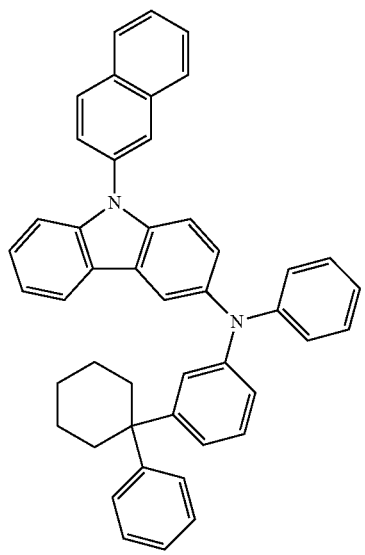
116
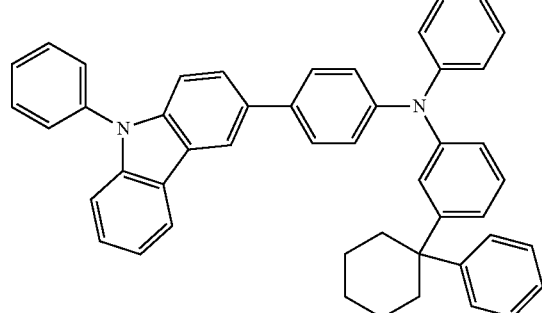
117
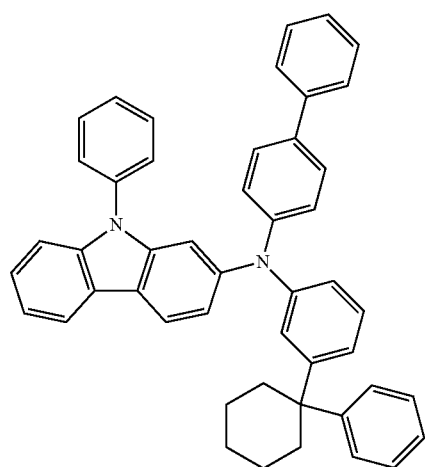
172
-continued
118
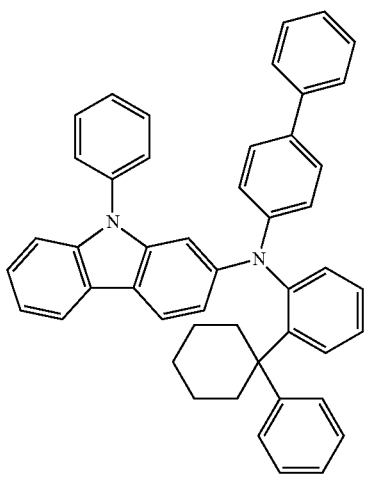
119
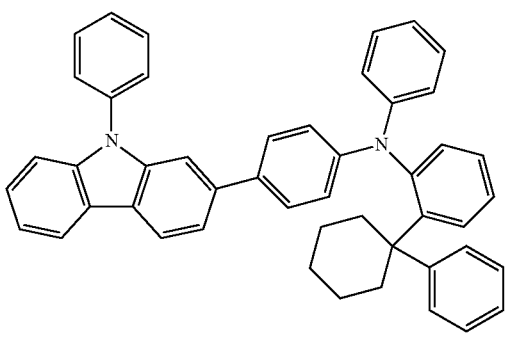
120
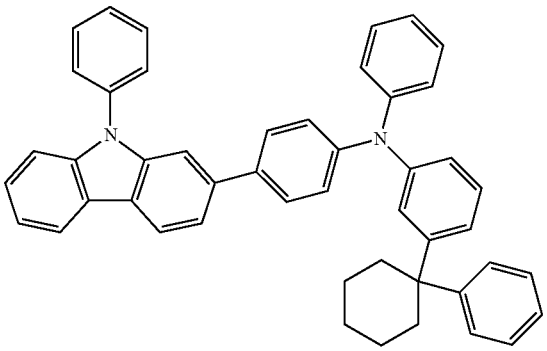

-continued
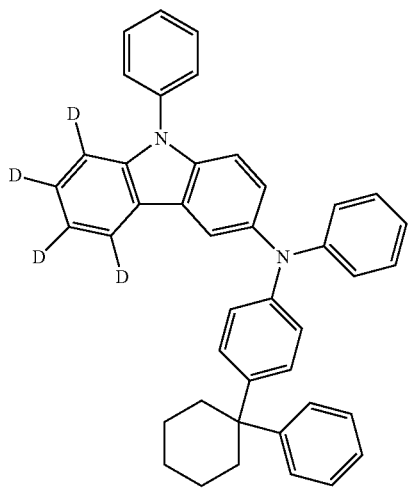
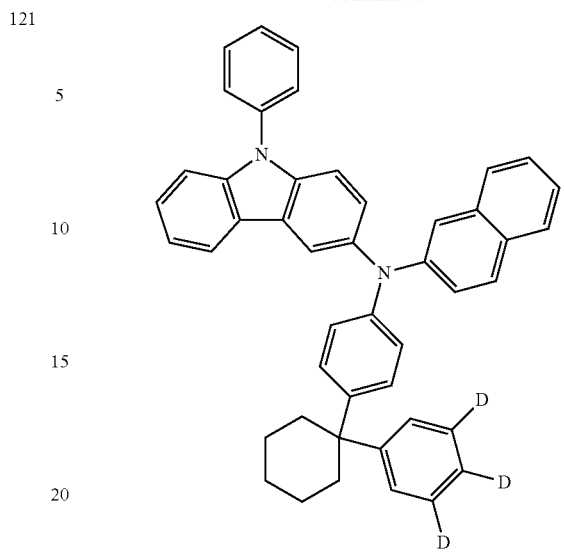
* * * * *

UNITED STATES PATENT AND TRADEMARK OFFICE
CERTIFICATE OF CORRECTION

| | | |
|---|---|---|
| PATENT NO. | : 12,035,552 B2 | Page 1 of 3 |
| APPLICATION NO. | : 17/210322 | |
| DATED | : July 9, 2024 | |
| INVENTOR(S) | : Eunjae Jeong et al. | |

It is certified that error appears in the above-identified patent and that said Letters Patent is hereby corrected as shown below:

In the Claims

In Column 89, Lines 30-45, in Claim 6, Formula 4-4, delete

" and 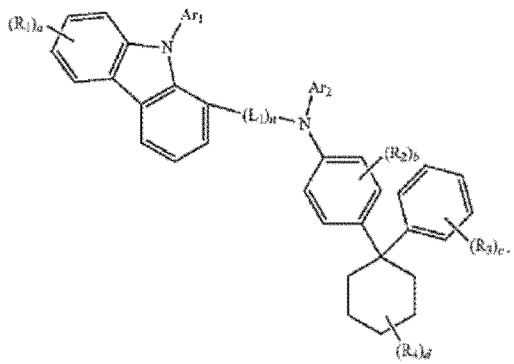 " and insert

-- 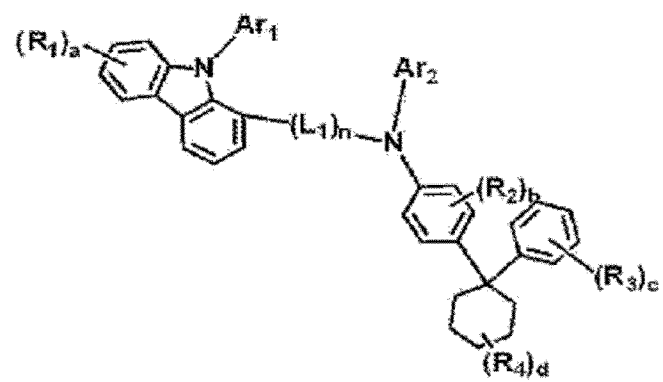 , and --.

Signed and Sealed this
Fifth Day of August, 2025

Coke Morgan Stewart
*Acting Director of the United States Patent and Trademark Office*

CERTIFICATE OF CORRECTION (continued)

In Column 132, Lines 40-58, in Claim 17, Formula 4-2, delete "

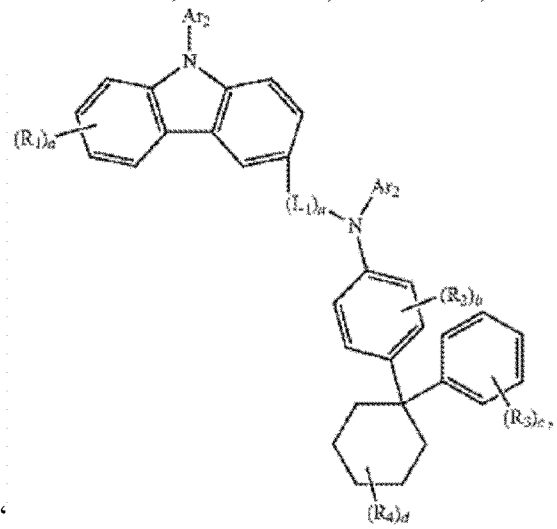

" and insert

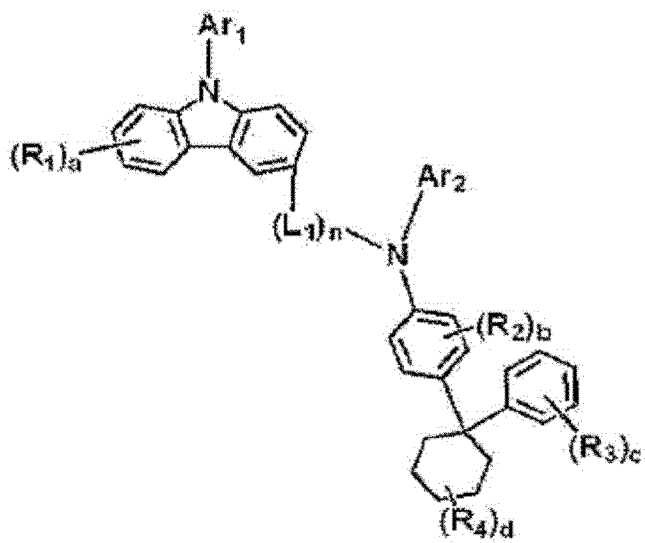

--.

In Column 133, Lines 10-27, in Claim 18, Formula 4-3, delete "

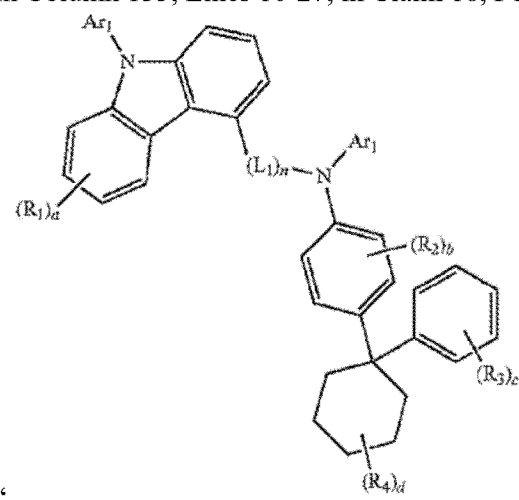

" and insert

CERTIFICATE OF CORRECTION (continued)
U.S. Pat. No. 12,035,552 B2

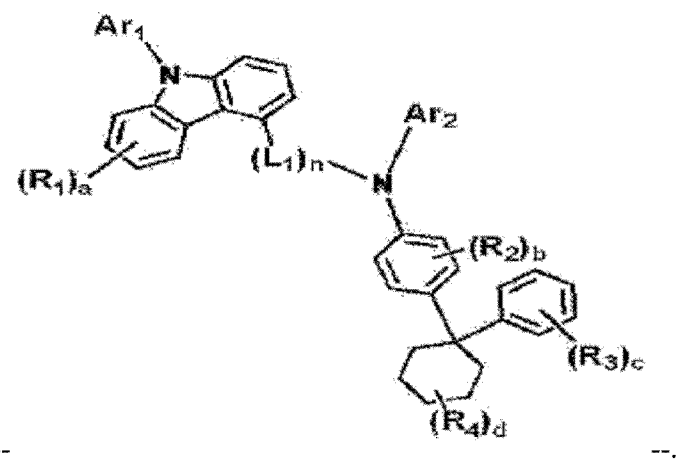

-- --.